(12) United States Patent
Onuki et al.

(10) Patent No.: US 7,573,658 B2
(45) Date of Patent: Aug. 11, 2009

(54) OPTICAL ELEMENT HOLDING APPARATUS AND EXPOSURE APPARATUS

(75) Inventors: Ichiro Onuki, Kawasaki (JP); Kenichi Kobayashi, Utsunomiya (JP); Kenji Yoshida, Utsunomiya (JP); Jun Ota, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 11/925,271

(22) Filed: Oct. 26, 2007

(65) Prior Publication Data
US 2008/0123203 A1 May 29, 2008

(30) Foreign Application Priority Data
Oct. 27, 2006 (JP) .............................. 2006-291938

(51) Int. Cl.
*G02B 7/02* (2006.01)
(52) U.S. Cl. ....................... 359/822; 359/823
(58) Field of Classification Search ............... 359/822, 359/823
See application file for complete search history.

(56) References Cited

U.S. PATENT DOCUMENTS

| 6,312,859 | B1 | 11/2001 | Taniguchi |
| 6,710,848 | B2 | 3/2004 | Taniguchi |
| 2002/0163741 | A1* | 11/2002 | Shibazaki .................. 359/819 |
| 2005/0046792 | A1* | 3/2005 | Ito et al. ..................... 351/177 |

FOREIGN PATENT DOCUMENTS

JP    2003-337272    11/2003

* cited by examiner

*Primary Examiner*—Jordan M. Schwartz
*Assistant Examiner*—James C Jones
(74) *Attorney, Agent, or Firm*—Rossi, Kimms & McDowell LLP

(57) ABSTRACT

A holding apparatus for holding an optical element includes a driving part configured to move the optical element, and a measuring part configured to measure a coordinate of the optical element, wherein number of coordinates measured by the measuring part among a degree of freedom of the optical element is greater than a driving degree of freedom of the driving part.

3 Claims, 41 Drawing Sheets

OPTICAL ELEMENT HOLDING APPARATUS AND EXPOSURE APPARATUS

BACKGROUND OF THE INVENTION

The present invention relates to a holding apparatus that holds an optical element, and an exposure apparatus.

For a position measuring part in an optical element holding unit that includes a driving part that drives an optical element, and a position measuring part that measures a position of the optical element, the conventional technology uses two types of position adjustment apparatuses (see, for example, Japanese Patent Laid-Open No. ("JP") 2003-337272).

JP 2003-337272 teaches to correct an image distortion by driving an optical element in a projection optical system in triaxial directions, such as a Z-axis direction as an optical axis direction, a direction around an X axis, and a direction around a Y axis in a XYZ orthogonal coordinate system. This reference also teaches to detect a position of the optical element in the triaxial direction through an encoder so as to control the position of the optical element.

However, the optical element holding apparatus disclosed in JP 2003-337272 is disadvantageous: An imaging position shifts with any displacements in the XY directions because the displacement is undetectable. The displacement may occur while the optical element is moved along the Z-axis direction.

One solution for this problem is disclosed in JP 10-12515 (paragraph no. 0027). More specifically, a lateral shift amount of an imaging position, which occurs when the optical element is driven or tilted in the Z-axis direction, is previously obtained through an alignment measurement and tabled, and the stage driving is corrected with the table.

However, the above optical element holding unit disclosed in JP 10-12515 uses the previously calculated table, and thus poses a problem in that an imaging position cannot be precisely corrected if the reproducibility of a displacement of the X-axis or Y-axis direction is low.

BRIEF SUMMARY OF THE INVENTION

The present invention is directed to a measurement of a coordinate of an optical element that does not correspond to a driving degree of freedom of the optical element among a degree of freedom of the optical element.

A holding apparatus according to one aspect of the present invention for holding an optical element includes a driving part configured to move the optical element, and a measuring part configured to measure a coordinate of the optical element, wherein number of coordinates measured by the measuring part among the degree of freedom of the optical element is greater than a driving degree of freedom of the driving part.

An exposure apparatus that includes the above holding unit constitutes another aspect of the present invention.

A further object and other characteristics of the present invention will be made clear by the preferred embodiments described below referring to accompanying drawings.

BRIEF DESCRIPTION OF THE DRAWINGS

FIG. 19A shows reference point scanning (with no positional offset) of the absolute-type perpendicular-displacement detecting sensor. FIG. 19B shows reference point scanning (with no positional offset) of the incremental-type perpendicular-displacement detecting sensor. FIG. 19C shows reference point scanning (with a positional offset) of the absolute-type perpendicular-displacement detecting sensor. FIG. 19D shows reference point scanning (with a positional offset) of the incremental-type perpendicular-displacement detecting sensor.

DESCRIPTION OF THE EMBODIMENTS

Figure 1:
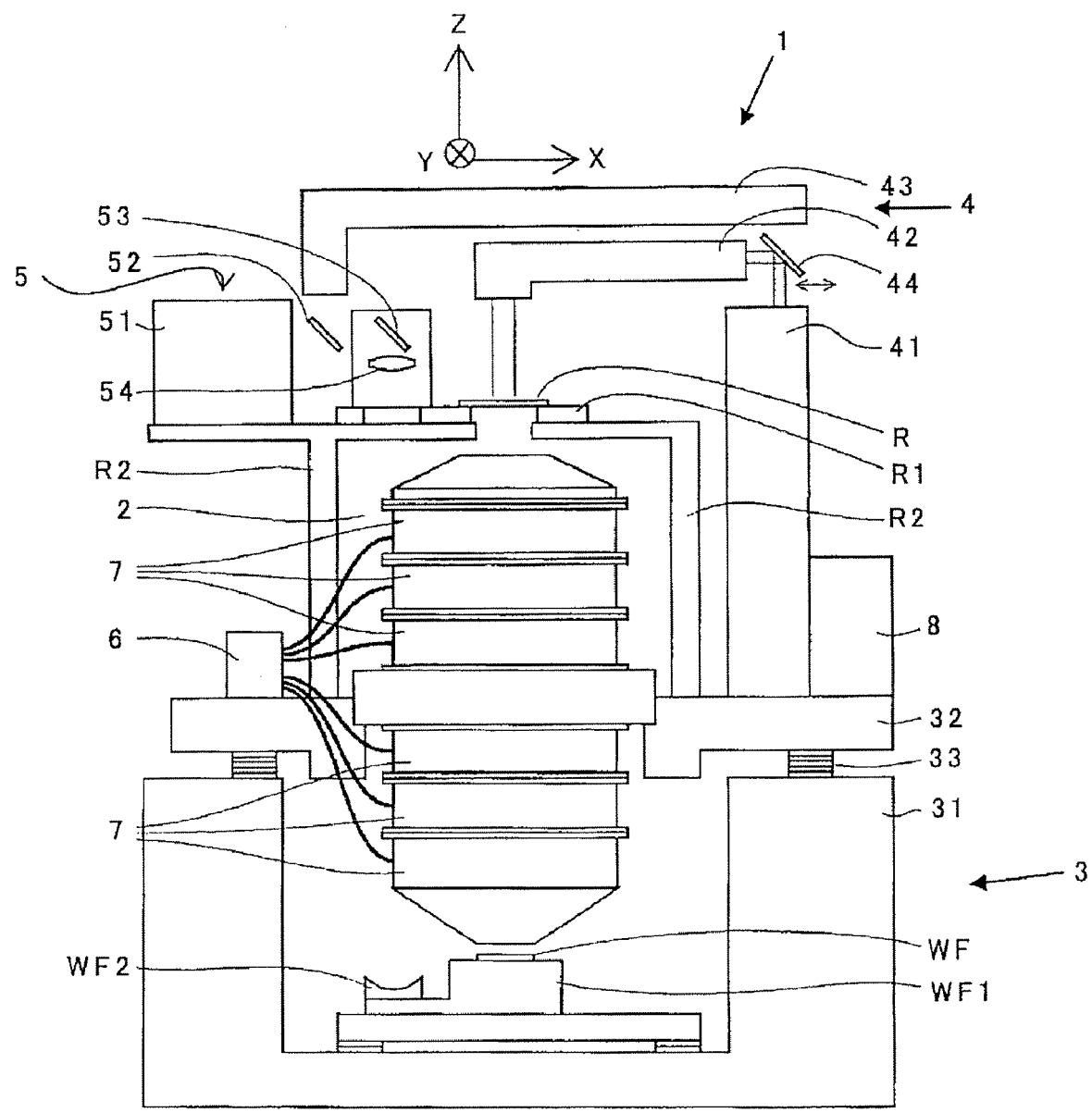
FIG. 1 is an explanatory view showing an exposure apparatus that includes an optical element holding unit according to a first embodiment of the present invention.

Referring now to the accompanying drawings, a description will be given of one aspect of the present invention. In each figure, the same reference numeral designates the same element, and a duplicate description thereof will be omitted.

First Embodiment

FIG. 1 shows an exposure apparatus that includes an optical element holding unit according to a first embodiment of the present invention. This exposure apparatus 1 is a scanning exposure apparatus that drives and scans a reticle R under a slit illumination, and synchronously drives and scans a wafer WF in an exposure action.

In this exposure apparatus, a XYZ orthogonal coordinate system is defined on an upper side in the figure, where the Z axis is an optical axis direction of the projection optical system 2 extending in the vertical direction of the apparatus, the X axis is a scan direction of the reticle R and the wafer WF, and the Y axis is the direction orthogonal to the X axis in the apparatus plane.

An exposure apparatus table 3 includes a bottomed, cylindrical body 31, a barrel mount 32 that houses and fixes part of the projection optical system 2 in the body 31. A damper 33 is provided between the body 31 and the barrel mount 32 to prevent transmissions of vibrations of the exposure apparatus installation plane to the projection optical system 2.

A wafer stage WF1 is provided on a bottom of the body 31 for focusing or so as to adjust a position of the wafer WF in the optical axis direction. The wafer stage WF1 moves the wafer WF in the X-axis direction in synchronization with scanning of the reticle stage R1. The wafer stage WF1 can adjust its position in the Y-axis direction so as to improve the overlay accuracy of the reticle image. The wafer stage WF1 is provided with a spherical mirror WF2 used to measure the optical aberration of the projection optical system 2. A photosensitive agent is applied to the wafer WF.

A reticle stage R1 mounted with the reticle R as an original for a semiconductor circuit pattern is placed on a reticle pedestal R2 that covers a top side of the projection optical system 2. The reticle pedestal R2 is used to fix the reticle stage R1 onto the barrel mount 32.

An illumination unit 4 stands on the barrel mount 32, and includes a laser light source unit 41, an exposure illuminator 42 used to illuminate the reticle R, an aberration calculation illuminator 43 used for the aberration measurement process, and an optical path switching mirror 44. A body controller 8 sits on the barrel mount 32 adjacent to the laser light source unit 41, and controls operations of the entire exposure apparatus.

An aberration measurement unit 5 sits on the reticle pedestal R2, and measures the optical aberration of the projection optical system 2. The aberration measurement unit 5 includes an interferometer 51, a half-mirror 52, a mirror 53, and a collimeter lens 54. The mirror 53 and the collimeter lens 54 are placed on the reticle stage R1, and configured to move back and forth above a luminous flux incident part of the projection optical system 2.

A lens controller 6 is provided on the barrel mount 32, and controls various optical elements in the projection optical system 2 in accordance with predetermined control flows. This control provides a fine adjustment to the optical system, such as an optimization of an optical aberration of a lens. The fine adjustment of the optical system is performed, for example, in the assembly of the projection optical system 2 and before shipping to a recipient of the exposure apparatus 1.

The projection optical system 2 includes plural lens units 7 each serving as an optical element holding unit. The lens unit 7 includes a driving part that drives the lens, and a position measuring part that measures a position of the lens.

Figure 2:
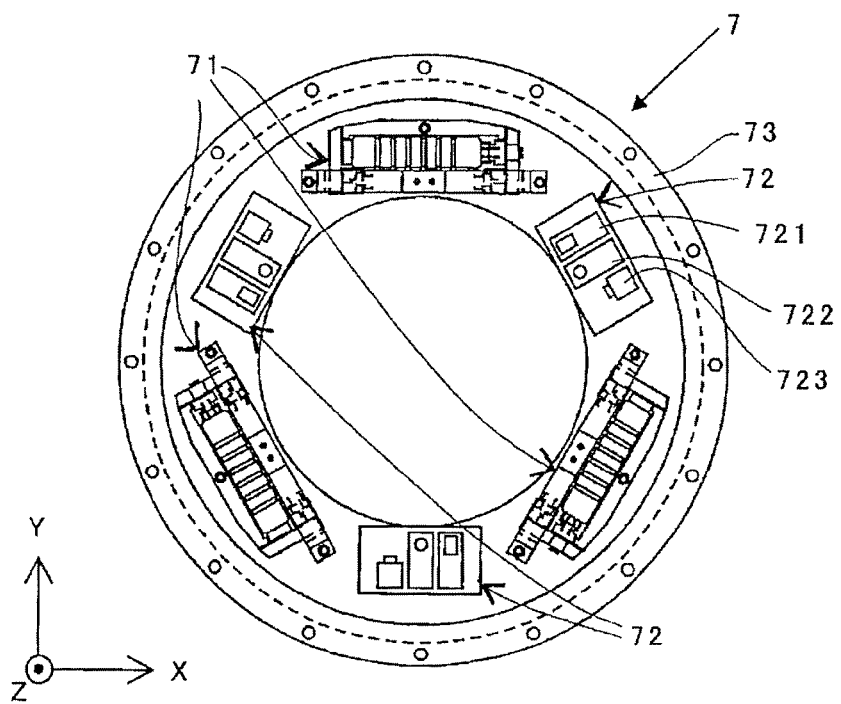
FIG. 2 is an explanatory view showing a detailed structure of a lens unit shown in FIG. 1.

FIG. 2 is a plane view of a structure of the lens unit 7. Three driving parts used to drive the lens are arranged as driving mechanisms 71 at 120° intervals on an annular fixture barrel 73 around the center axis. The position measuring parts used to measure a position of the lens are provided as lens-position detectors 72 among the driving mechanisms 71 along a circumferential direction. The lens-position detector 72 detects a displacement in the optical-axis or Z-axis direction of the lens frame 74, and a radial displacement orthogonal to the optical axis.

The lens-position detector 72 includes an absolute-type perpendicular-displacement detecting sensor 721 as a second measurement part, an incremental-type perpendicular-displacement detecting sensor 722 as a first measurement part, and an incremental-type lateral-displacement detecting sensor 723 as a third measurement part.

The absolute-type perpendicular-displacement detecting sensor 721 is an apparatus that measures an absolute position of a distance from a base position (such as a lower limit position) of a lens as an optical element, and projects a detection laser beam to an optical-axis or Z-axis direction of the lens. The incremental-type perpendicular-displacement detecting sensor 722 is an apparatus that measures a relative position as a lens's positional change for each measurement in an inclination direction to the optical axis (direction) of the lens, and projects a detection laser beam to the lens's optical axis direction (Z direction) similar to the absolute-type perpendicular-displacement detecting sensor 721. The incremental-type lateral-displacement detecting sensor 723 is an apparatus that measures the lens's relative position in a direction orthogonal to the optical axis direction, and projects the detection laser beam in the lens's radial direction.

The coordinate system of the lens unit 7 is the same as the XYZ orthogonal coordinate system of the exposure apparatus 1 described with reference to FIG. 1, where the Z axis is the same direction as the lens's optical axis, and the XY plane defines the lens's radial direction.

Figure 3:
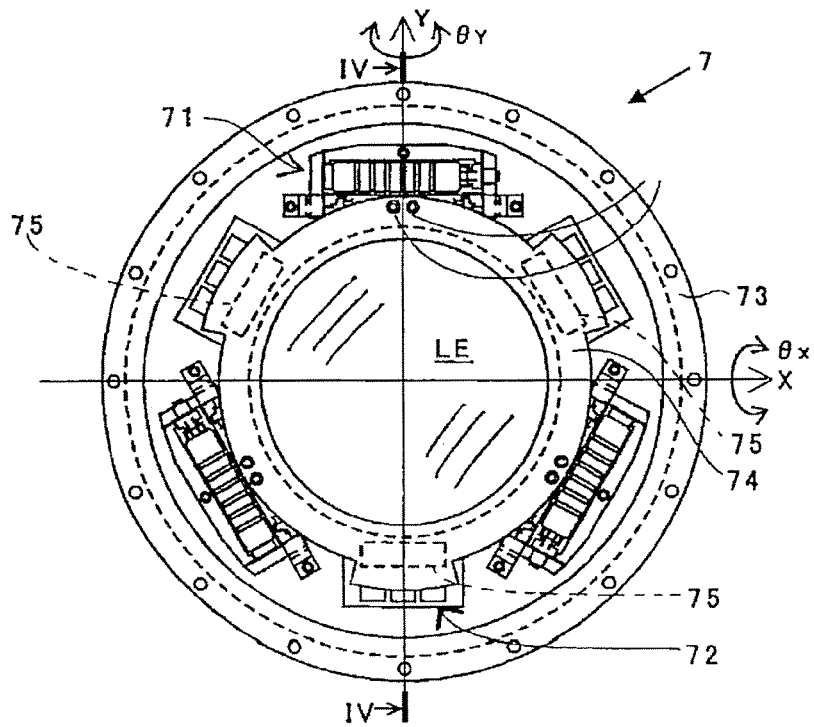
FIG. 3 is an explanatory view showing a structure of the lens unit shown in FIG. 2 to which a lens and a lens frame are attached.
Figure 4:
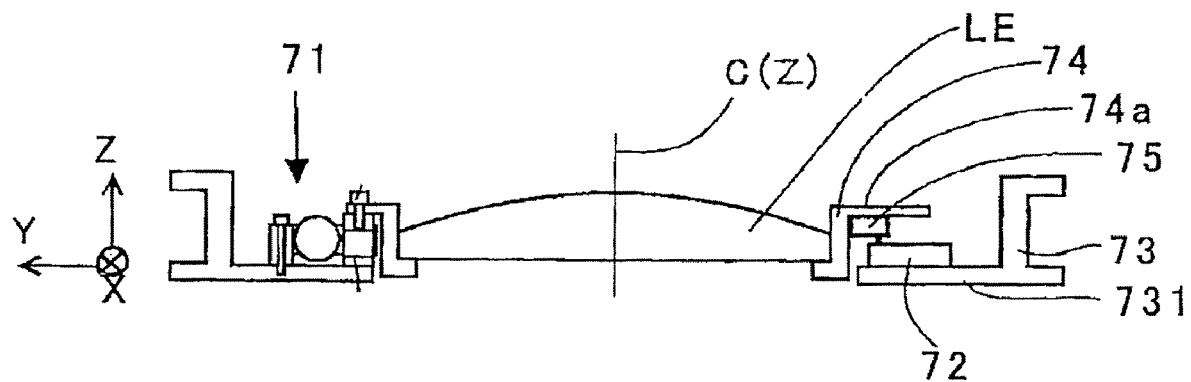
FIG. 4 is a sectional view taken along line IV-IV shown in FIG. 3.

FIG. 3 shows the lens unit 7 shown in FIG. 2 to which the lens frame 74 is attached. FIG. 4 is a section taken along a line IV-IV shown in FIG. 3. As shown in these figures, the fixture barrel 73 of the lens unit 7 has a sectional shape that has an inverse-L-shaped projection on the top surface of the plate. The lens LE is held on the lens frame 74, and the lens frame 74 is fixed onto the driving mechanism 71 via a screw and a bolt.

More specifically, the lens frame 74 that houses the lens LE has a flange part 74a on its top surface, and the flange part 74a is fastened with displacement output parts of the three sets of the driving mechanisms 71. A target mirror 75 used to detect a lens frame displacement is attached to this flange part 74a.

When the target mirror 75 is attached, the detection laser beam projected from the absolute-type perpendicular-displacement detecting sensor 721 or the incremental-type perpendicular-displacement detecting sensor 722 is reflected on the target mirror 75. A displacement amount of the target mirror 75 can be detected from the information of the reflected light.

This configuration can provide translational driving of the lens LE in the optical-axis C or Z-axis direction when the three sets of driving mechanisms 71 are driven by an equal amount. With a predetermined difference among driving amounts by the three sets of driving mechanisms 71, the lens LE can be tilted in the θx and θy directions shown in FIG. 3.

Closed loop control over the translational amount and tilt amount of the lens LE in the Z-axis direction is available with feedbacks of predetermined coordinate conversions to output signals from the absolute-type perpendicular-displacement detecting sensor 721 and the incremental-type perpendicular-displacement detecting sensor 722.

A reticle image's shift amount associated with parallel decentering of the lens LE in the X-axis and Y-axis directions is available based on an output signal of the incremental-type lateral-displacement detecting sensor 723. An alignment error of the reticle image associated with decentering of the lens LE can disappear when the influence of the calculation result is added to a driving amount of the wafer stage WF shown in FIG. 2.

Figure 5:
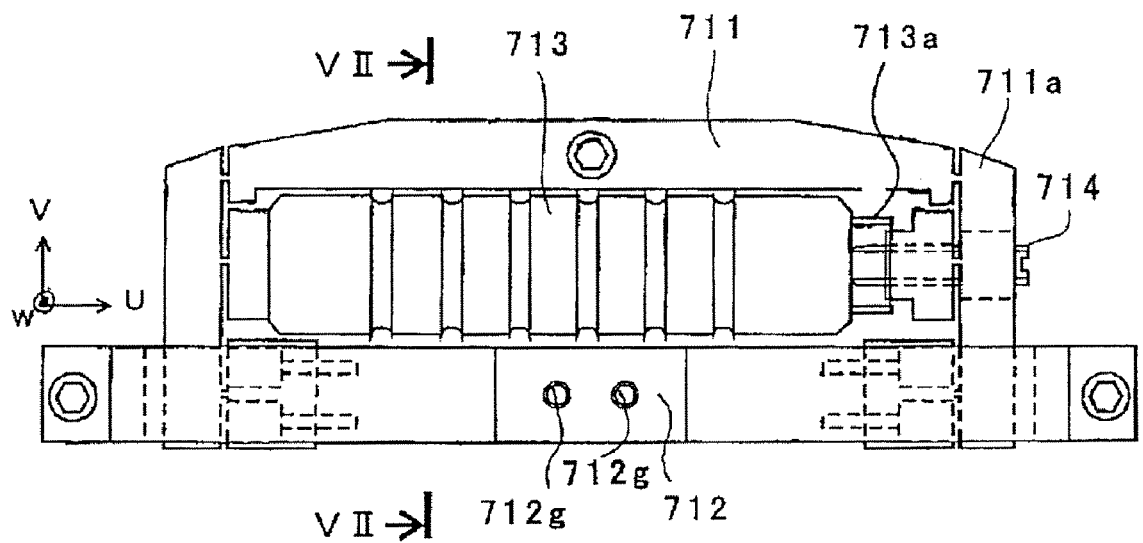
FIG. 5 is a plane view showing a detailed structure of a driving mechanism shown in FIG. 2.
Figure 6:
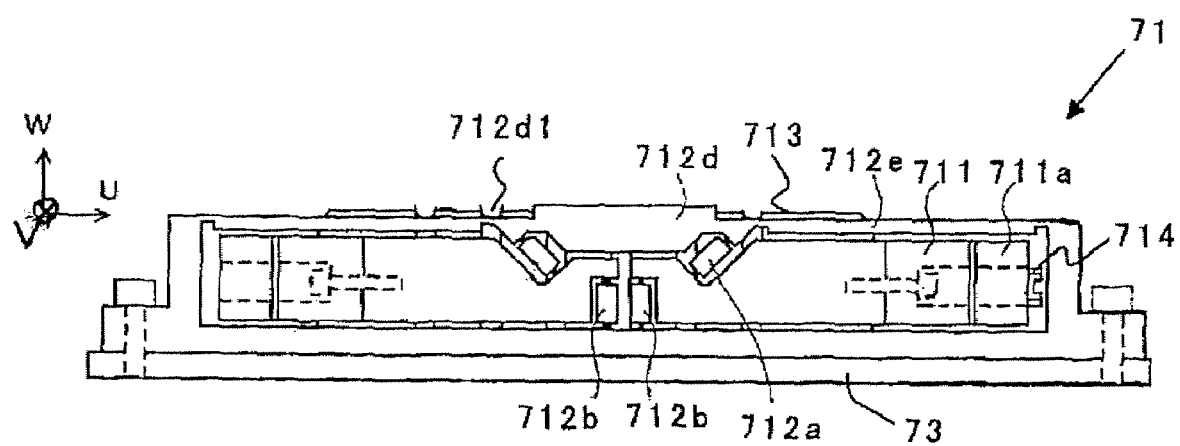
FIG. 6 is a side view showing a detailed structure of the driving mechanism shown in FIG. 2.
Figure 7:
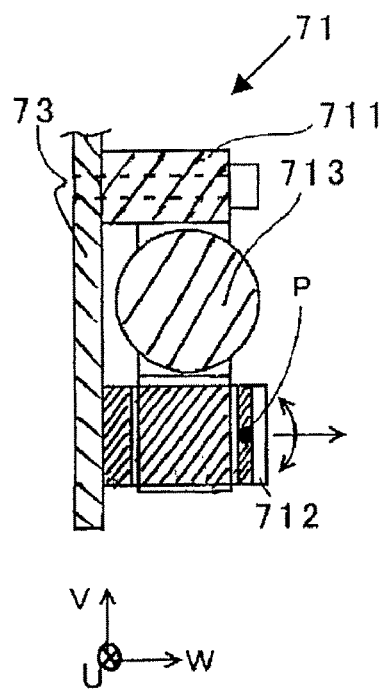
FIG. 7 is a sectional view taken along a line VII-VII shown in FIG. 5.
Figure 8:
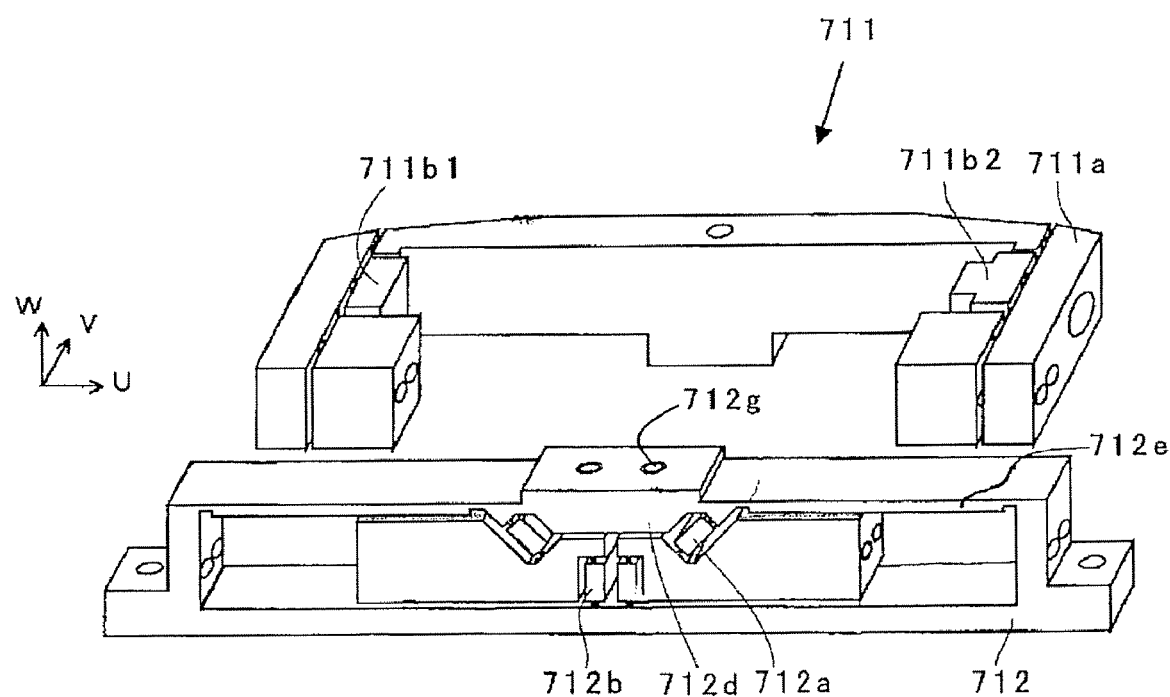
FIG. 8 is a perspective view showing a displacement picker and a direction converter.

FIGS. 5-8 show detailed structures of the driving mechanisms 71. FIG. 5 is a plane view of the driving mechanism 71. FIG. 6 is a side view of the driving mechanism 71. FIG. 7 is a sectional view taken along a line VII-VII shown in FIG. 5. FIG. 8 is a perspective view of the displacement picker and the direction converter, which will be described later. FIG. 8 omits various screws.

A local coordinate system UVW of the driving mechanism 71 is defined as follows: The U axis is an axis along a radial direction of the lens LE, the V axis is an axis along the radial direction of the lens LE and perpendicular to the U axis. The W axis is an axis parallel to the optical axis C of the lens LE.

As shown in these figures, the driving mechanism 71 includes a displacement picker 711, a direction converter 712, a lamination-type piezoelectric actuator 713, and fastening members, such as a screw, which connect these components, and is attached to the top of the fixture barrel 73 (shown in FIG. 6).

The piezoelectric actuator 713 has a rod member that is comprised of alternately laminated disc-shaped piezoelectric elements and electrodes and housed in a sealed cylindrical container. One end of the rod member projects from the container. An overall extension in the U-axis direction increases approximately in proportion to the applied voltage. The piezoelectric actuator 713 is connected to the displacement picker 711 using a piezoelectric adjusting screw 714.

A displacement of the piezoelectric actuator 713 in the U-axis direction is transmitted to the direction converter 712 via the displacement picker 711, and moves up and down the lens frame 74 in the W-axis direction. A size error of the piezoelectric actuator 713 can be corrected by adjusting the screwing depth of the piezoelectric adjusting screw 714 in the displacement picker 711.

The displacement picker 711 is manufactured by wire discharging to a plate metal block as a basic material having a predetermined thickness, and by forming screw holes at predetermined points through a piercing machine.

The direction converter 712 is manufactured, similar to the displacement picker 711, by wire discharging to a plate metal block as a basic material having a predetermined thickness so as to form a direction converting link 712a and a support link 712b, and by forming screw holes at predetermined points through a piercing machine.

A description will now be given of an assembly procedure of the driving mechanism 71. Initially, in the perspective view of FIG. 8, both side arms of the displacement picker 711 are inserted into left and right vacant spaces of the direction converter 712, and fastened through screws. Next, as shown in FIG. 5, the piezoelectric actuator 713 is attached in the space enclosed by the displacement picker 711 so as to push the piezoelectric receiving link 713a as an output end of the piezoelectric actuator 713 in the left direction using the piezoelectric adjusting screw 714. The displacement picker 711 is compressed against the piezoelectric link 713a. Now, the attachment of the piezoelectric actuator 713 is finished. Finally, an assembly is completed when the driving mechanism 71 is installed in the annular fixture barrel 73 (shown in FIG. 6).

Figure 9:
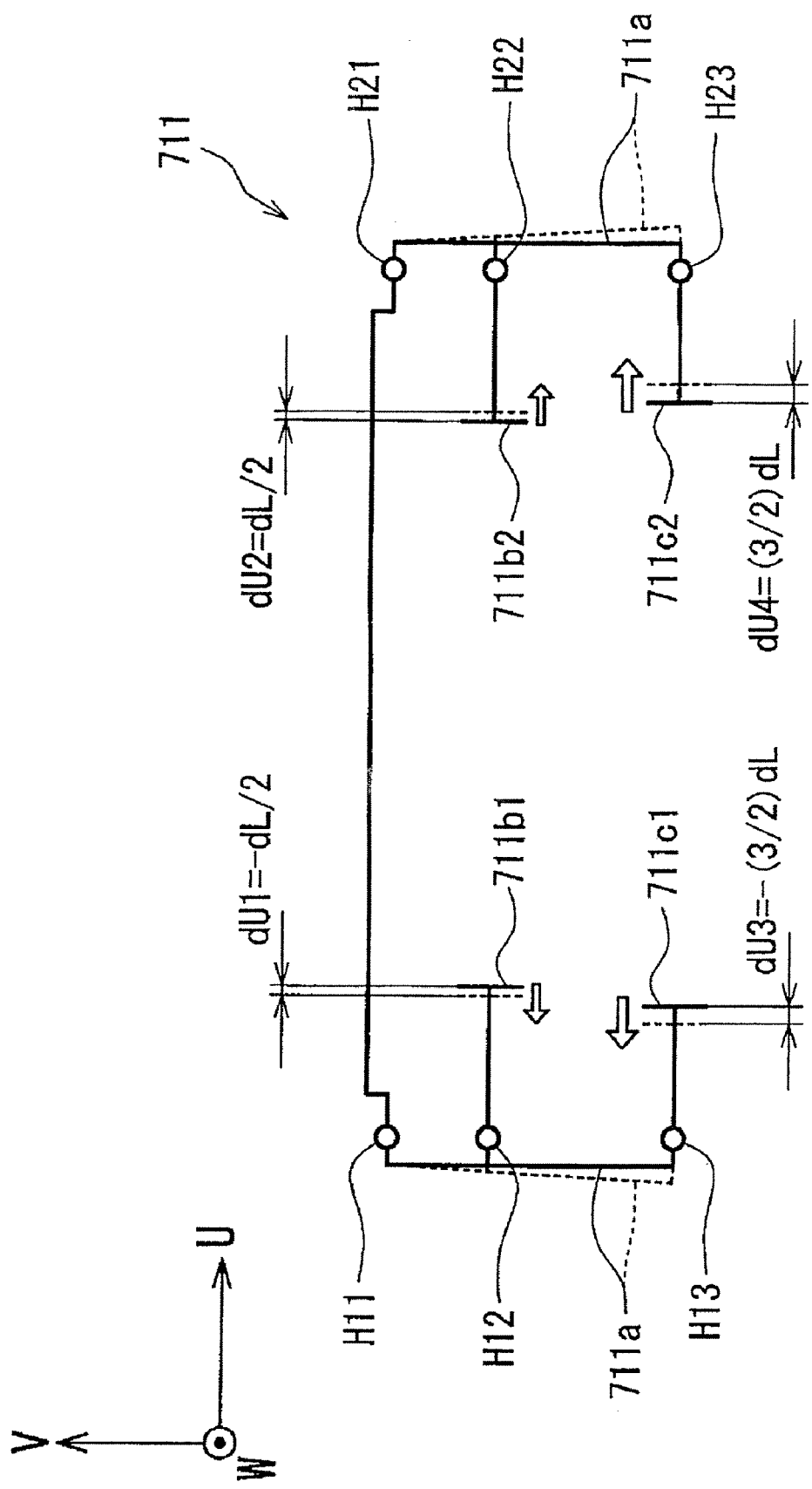
FIG. 9 is an explanatory view showing a linkage of the displacement picker.
Figure 10:
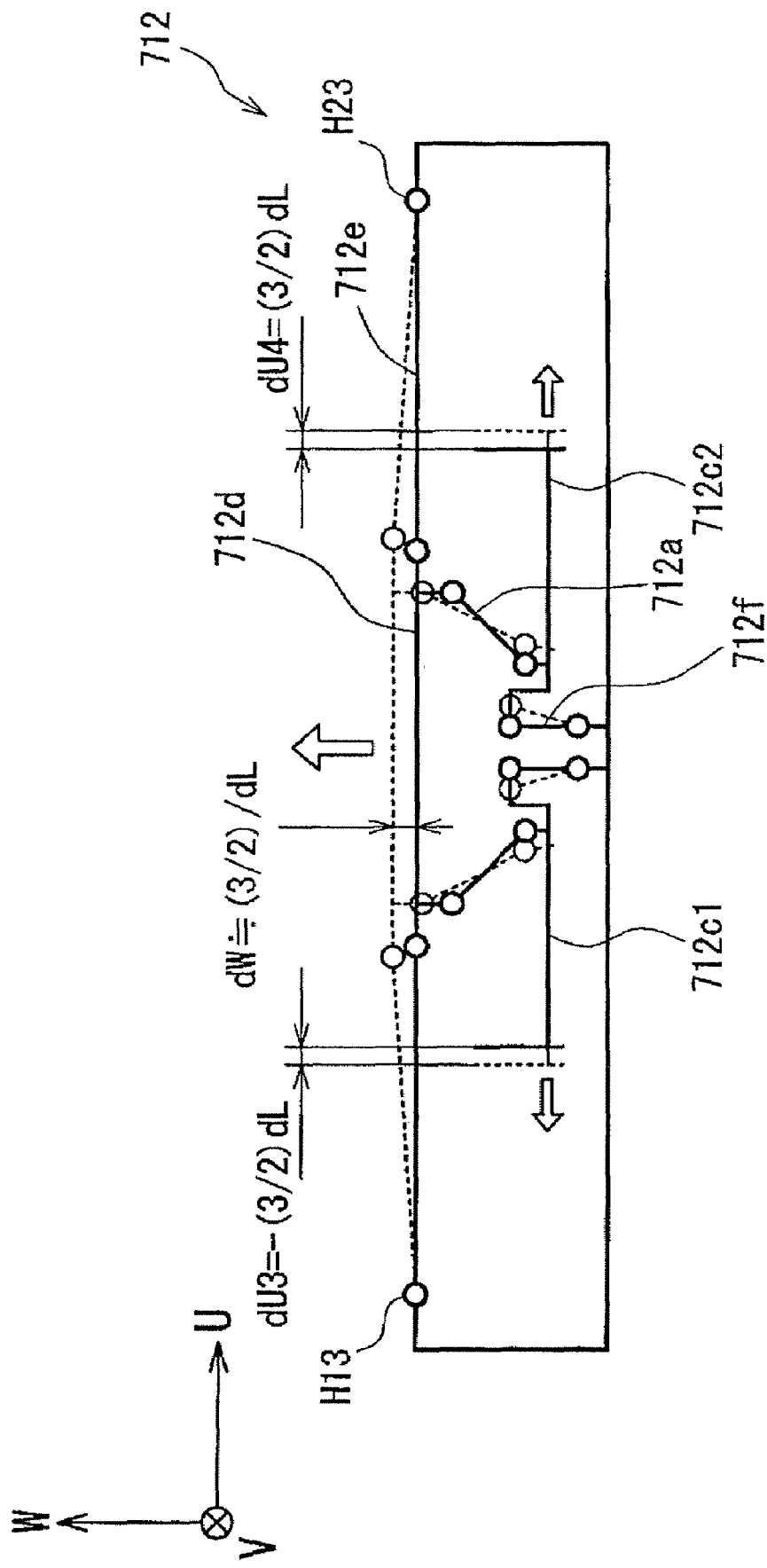
FIG. 10 is an explanatory view showing a linkage of the direction converter.

FIGS. 9 and 10 show linkages of the displacement picker 711 and the direction converter 712. FIG. 9 illustrates the displacement picker 711, and FIG. 10 illustrates the direction converter 712. Referring now to FIGS. 5 to 10, a description will be given of an operational principal of the driving mechanism 71.

When predetermined voltage is applied to two electrode terminals of the piezoelectric actuator 713, the span L of the piezoelectric actuator 713 extends by dL in the U-axis direction. Then, as shown in FIG. 9, one piezoelectric receiving link 711b displaces by dU1=−dL/2 and the other piezoelectric receiving link 711b2 displaces by dU2=dL/2. Then, a displacement picker link 711a that is configured to rotate around the elastic hinges H11 and H21 rotates around the W axis. Thereby, a connection link 711c1 displaces by dU3=−(3/2) dL, and a connection link 711c2 displaces by dU4=(3/2)dL.

The displacements of the above connection links 711c1 and 711c2 in the U-axis direction also cause the displacements of horizontal links 712c1 and 712c2 in the direction converter 712 as shown in FIG. 10. Then, a direction conversion link 712 that is arranged to form 45° to the U axis minutely rotates, and ascends a lens frame driving link 712d in the W-axis direction by dW.

As discussed, while the lens frame driving link 712d displaces by a fine amount in the W-axis direction in association with the elongation of the piezoelectric actuator 713, the lens frame driving link 712d displaces only in the W-axis direction, does not displace in the U-axis or V-axis direction, because the support link 712e is connected to both left and right sides of the lens frame driving link 712d.

The support link 712e restricts a displacement of the lens frame driving link 712d in the U-axis direction, and a support link 712f restricts a displacement of the lens frame driving link 712d in the V-axis direction. This support link 712f is located at the direction converter center end of the horizontal links 712c1 and 712c2. The displacements of the horizontal links 712c1 and 712c2 in the U-axis direction are not restricted, and their displacements in the V-axis direction are restricted. Therefore, motions of the horizontal links 712c1 and 712c2 with no V-axis direction components are transmitted to the lens frame driving link 712d via the direction conversion link 712a.

This structure displaces, only in the W-axis direction, an area near a screw hole 712g (shown in FIG. 5) above the lens frame driving link 712d, and restricts displacements in the U-axis and V-axis directions. Therefore, the lens frame 74 can be precisely displaced in the W-axis direction. In addition, proper selections of the intervals among elastic hinges H11, H12, H13, H21, H22, and H23 would properly set a displacement enlargement ratio of the piezoelectric actuator 713.

On the other hand, as shown in FIG. 10, the lens frame driving link 712d is supported by the support link 712e at both sides, but is partially thin (see FIG. 6), and thin part 712d1 is elastically deformable in the twisting direction around the U-axis. The direction converter link 712a that restricts the lower side of the lens frame driving link 712d has slight elastic deformation degree of freedom in the V-axis direction.

The lens frame driving link 712d, as shown in FIG. 7, can be slightly twisted around the U axis around the point P at the center of the section of the support link 712e. The lens frame driving link 712d can provide a translation motion in the W-axis direction and a twisting motion around the U axis. This twisting motion causes the lens frame 74 to tilt.

Figure 11:
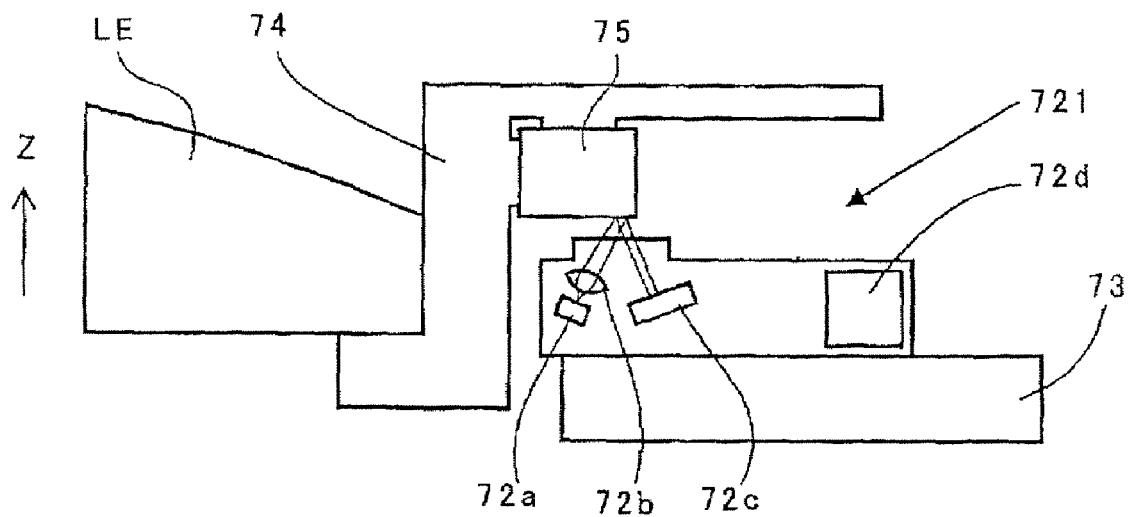
FIG. 11 is an explanatory view showing an absolute-type perpendicular-displacement detecting sensor.
Figure 12:
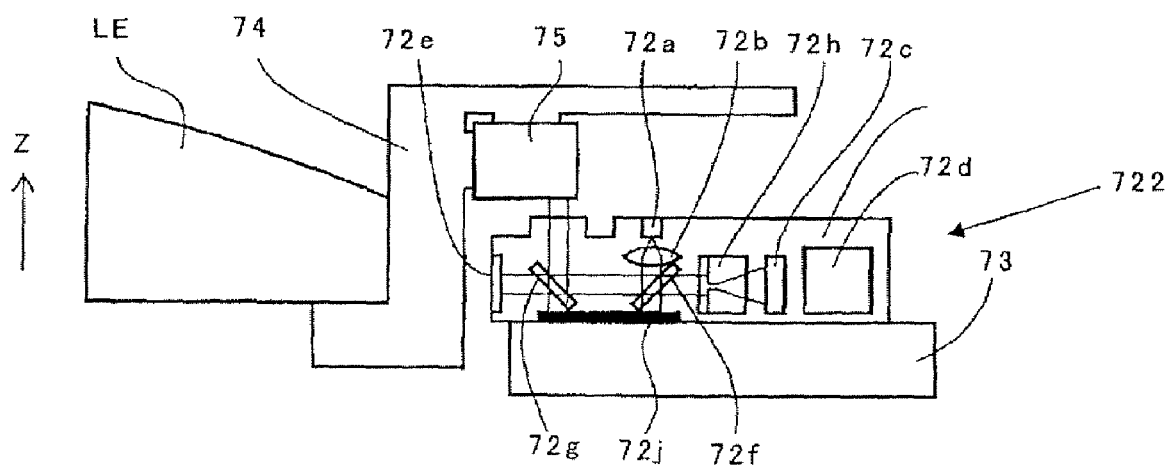
FIG. 12 is an explanatory view showing an incremental-type perpendicular-displacement detecting sensor.
Figure 13:
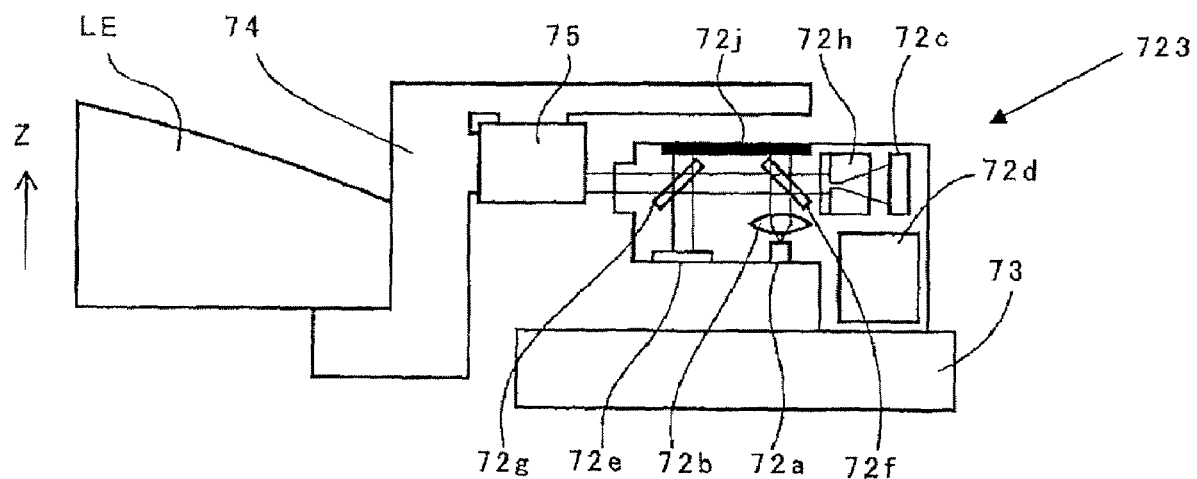
FIG. 13 is an explanatory view showing an incremental-type lateral-displacement detecting sensor.

FIGS. 11 to 13 show detailed structures of various sensors attached to the lens-position detector 72 shown in FIG. 2. FIG. 11 shows an absolute-type perpendicular-displacement detecting sensor 721. For example, it is preferable to use a triangulation laser measuring unit for the absolute-type perpendicular-displacement detecting sensor 721. The triangulation laser measuring unit observes a return position of the laser beam projected to the target mirror 75 as a target, and detects a position of the target mirror 75. One applicable illustration is disclosed in JP 10-267648. A description will now be given of a schematic structure and a position detection principal of the absolute-type perpendicular-displacement detecting sensor 721.

The absolute-type perpendicular-displacement detecting sensor 721 includes a laser light source 72a that irradiates a measurement semiconductor laser beam, a collimator lens 72b, and a quadrisection light-receiving member 72c that can detect a center-of-gravity position of the incident luminous flux. The quadrisection light-receiving member 72c is an optical position sensor (position sensitive detector: PSD), but may use a charged coupled device image sensor for the light receiving element. The sensor control circuit 72d drives the laser light source 72a, processes signals output from the quadrisection light-receiving member 72c, and executes various operations.

In the above configuration, the laser beam emitted from the laser light source 72a is incident as an approximately collimated luminous flux via the collimator lens 72b upon the target mirror 75, reflected on the target mirror 75, and then incident upon the light receiving surface of the quadrisection light-receiving member 72c. The quadrisection light-receiving member 72c outputs a signal according to a center-of-gravity position of the light-receiving spot, which changes as the target mirror 75 moves with the lens frame 74 in the Z-axis direction. Thus, the lens LE's displacement in the Z-axis direction can be detected when the sensor control circuit 72d calculates the center-of-gravity position.

Since the triangulation laser measuring unit can detect an absolute distance to a target to be detected, the Z coordinate of the lens LE to the reference point on the Z axis can be detected with the precision of submicron order, even when the power to the absolute-type perpendicular-displacement detecting sensor 721 is once cut and re-supplied.

FIG. 12 shows an incremental-type perpendicular-displacement detecting sensor 722. The incremental-type perpendicular-displacement detecting sensor 722 can preferably use an interference-type laser measuring unit. The interference-type laser measuring unit is an apparatus that allows the reflected light on the target mirror 75 as the target and the reflected light on the total-reflection mirror 72e in the incremental-type perpendicular-displacement detecting sensor 722 to blend and interfere with each other, counts the number of waves in the interference signal, and measures the moving amount of the target. One example of the interference-type laser measuring unit is a position detecting unit disclosed in JP 11-94514. A description will now be given of a schematic structure and a position detection principle of the incremental-type perpendicular-displacement detecting sensor 722.

This incremental-type perpendicular-displacement detecting sensor 722 includes a laser light source 72a that emits a measurement semiconductor laser beam, a collimator lens 72b, a quadrisection light-receiving member 72c, and a sensor control circuit 72d, a total reflection mirror 72e, a non-polarization beam splitter 72f, a polarization beam splitter 72g, an interference optical element 72h, and a light absorber 72j.

In the above configuration, the laser beam emitted from the laser light source 72a is shaped to a modestly condensed luminous flux (that is indicated as a collimated luminous flux in FIG. 12) via the collimator lens 72b, and incident upon the non-polarization beam splitter 72f. 50% of the incident luminous flux transmits the non-polarization beam splitter 72f and reaches the light absorber 72j so as to be absorbed. Remaining 50% of the incident light is reflected on the non-polarization beam splitter 72f, travels to the left, and enters the polarization beam splitter 72g.

The s-polarized luminous flux reflected on the surface of the polarization beam splitter 72f is incident upon the target mirror 75, and reflected on the target mirror 75, again reflected on the surface of the polarization beam slitter 72g, and returns to the non-polarization beam splitter 72f through the original optical path. On the other hand, the p-polarized luminous flux that has transmitted through the polarization beam splitter 72g is incident upon and reflected on the total reflection mirror 72e, retransmits the polarization beam splitter 72g, and returns along the original optical path.

This structure allows the polarization beam splitter 72g to synthesize the s-polarized reflected light from the target mirror 75 that is a moving target and the p-polarized reflected light from the total reflection mirror. 50% of the synthesized light transmits the non-polarization beam splitter 72f, and enters the interference-use optical element 72h. The interference-use optical element 72h includes, in order from the left incident plane side, a quarter waveplate, an aperture, a phase diffraction grating having a houndstooth check structure, and a quadrisection polarization plate with polarization azimuths shifted by 45°.

The synthesized light includes mutually orthogonal, linearly polarized beams, which are converted into circularly polarized beams that turn inversely by the quarter waveplate in the interference-use optical element 72h. Next, only the central luminous flux having a large light quantity passes via the aperture, and is amplitude-divided into four luminous fluxes by the phase diffraction grating having a houndstooth check before passing the quadrisection polarization plate. The quadrisection luminous fluxes generated by this course have been converted into interference beams having bright and dark shifted by 90° when converted into phase. The four luminous fluxes are incident upon the light receiving parts of the quadrisection light-receiving member 72c and the four output signals are processed as follows:

Initially, a difference between two signals having a phase difference of 180° is extracted to eliminate the DC component, and the resultant signal will be referred to as an A-phase signal. Similarly, a B-phase signal is generated by extracting a difference between the remaining two signals having a phase difference of 180° to eliminate the DC component. The A-phase signal and the B-phase signal have a phase difference of 90°, and provide a circular Lissajou's waveform when shown on an oscilloscope (see FIG. 18).

When an optical path change of the measuring light that reciprocates between the incremental-type perpendicular-displacement detecting sensor 722 and the target mirror 75 accords with the light source wavelength, the interference signal changes by one period. In other words, when the target moves by a distance of half a light source wavelength, the interference signal changes by one period. Where the measurement laser beam has a light source wavelength $\lambda=800$ nm, the interference signal changes by one period and the Lissajou's waveform goes round along the circular locus whenever the target mirror 75 moves by 400 nm. Therefore, when a known method measures the number of waves of the interference signal, the moving amount of the target can be detected at unit of 400 nm. When an electric phase divider is used to divide (frequency-divide) the interference signal, the moving amount of the target can be detected with sub-nanometer precision.

FIG. 13 shows the incremental-type lateral-displacement detecting sensor 723. The above incremental-type perpendicular-displacement detecting sensor 722 detects a perpendicular moving amount of the target mirror 75. On the other hand, the incremental-type lateral-displacement detecting sensor 723 detects a lateral moving amount of the target mirror 75, or a moving amount in the radial direction of the lens LE. Therefore, it is different in an arrangement of the internal optical element from the incremental-type perpendicular-displacement detecting sensor 722. However, the detecting principles of both sensors are the same, and thus a description thereof will be omitted.

Figure 14:
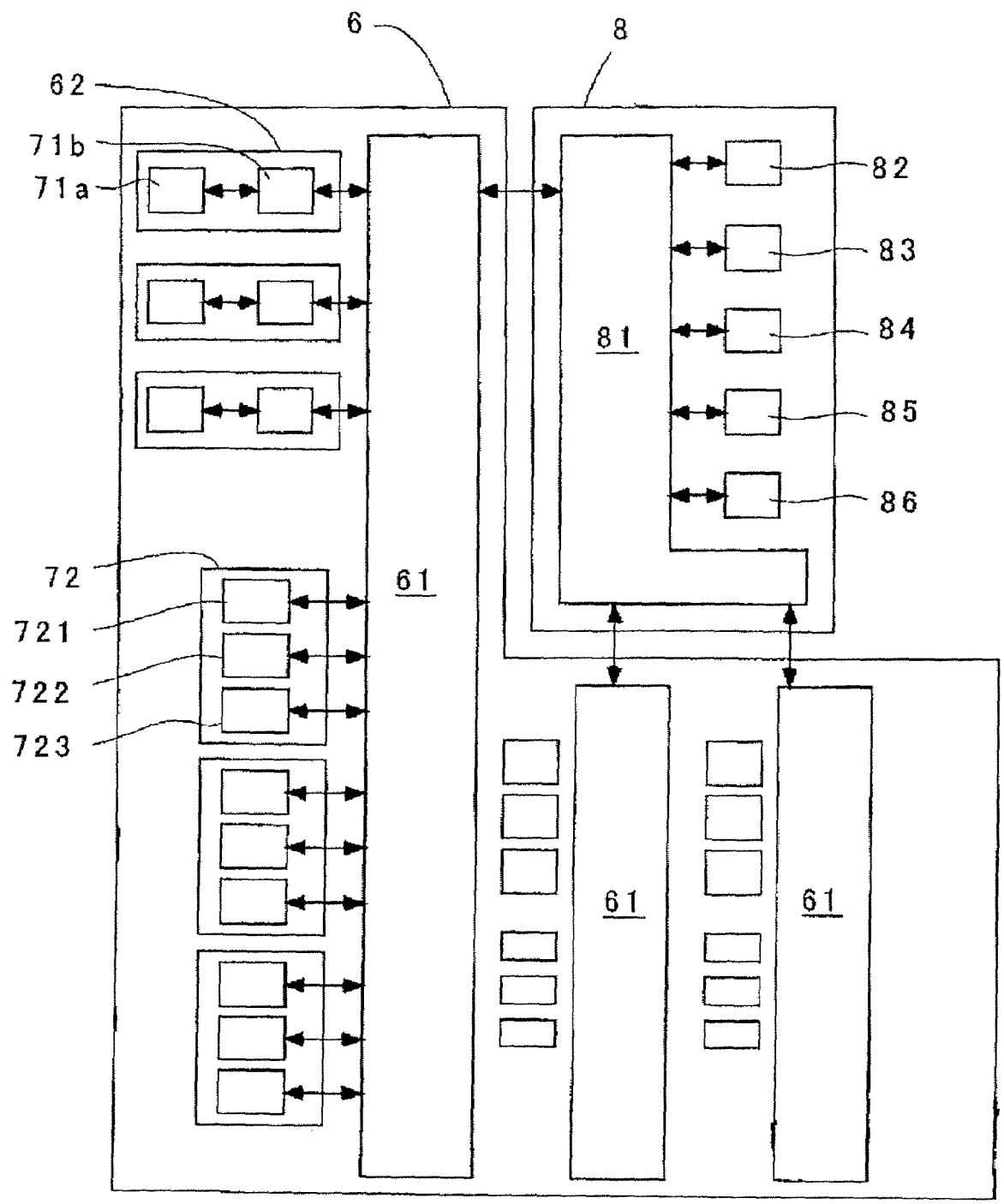
FIG. 14 is an explanatory view showing a control circuit used to control an exposure action and a lens driving action in an exposure apparatus.

FIG. 14 is a control circuit that controls the exposure action and the lens driving action of the semiconductor exposure apparatus shown in FIG. 1. As illustrated, the control circuit includes a body controller 8 that controls the entire exposure apparatus, and a lens controller 6 that controls a lens position. The body controller 8 includes a body CPU 81, to which a mount controller 82, an illumination controller 83, a reticle stage controller 84, a wafer stage controller 85, and an interferometer controller 86 are connected.

The mount controller 82 controls a vibration preventive action of the barrel mount 32. The illumination controller 83 controls the illumination mode and the light quantity of the illumination unit 4. The reticle stage controller 84 controls driving of the reticle stage R1. The wafer stage controller 85 controls driving of the wafer stage WF1. The interferometer controller 86 controls a measurement by the interferometer 51.

The lens controller 6 has three lens CPUs 61, and the lens CPU 61 is provided for each lens unit 7 shown in FIG. 1. In other words, the lens controller 6 has the same number of lens CPUs 61 as the number of lens units 7 provided to the projection optical system 2. Each lens unit 61 is connected to three driving mechanism controllers 62, and each driving mechanism controller 62 controls the driving mechanism 71 shown in FIG. 5. The driving mechanism controller 62 has a piezoelectric driving part 71a and a piezoelectric element 71b, and drives the piezoelectric actuator 713 shown in FIG. 5.

The lens CPU 61 is connected to three lens-position detectors 72. The lens-position detector 72 is provided with the absolute-type perpendicular-displacement detecting sensor 721, the incremental-type perpendicular-displacement sensor 722, and the incremental-type lateral-displacement detecting sensor 723.

In the above configuration, the lens CPU 61 communicates with the body CPU 81, and controls driving of the driving mechanism 71 based on a predetermined program so as to drive the lens toward a target position, and to minimize various aberrations of the projection optical system 2.

Figure 15:
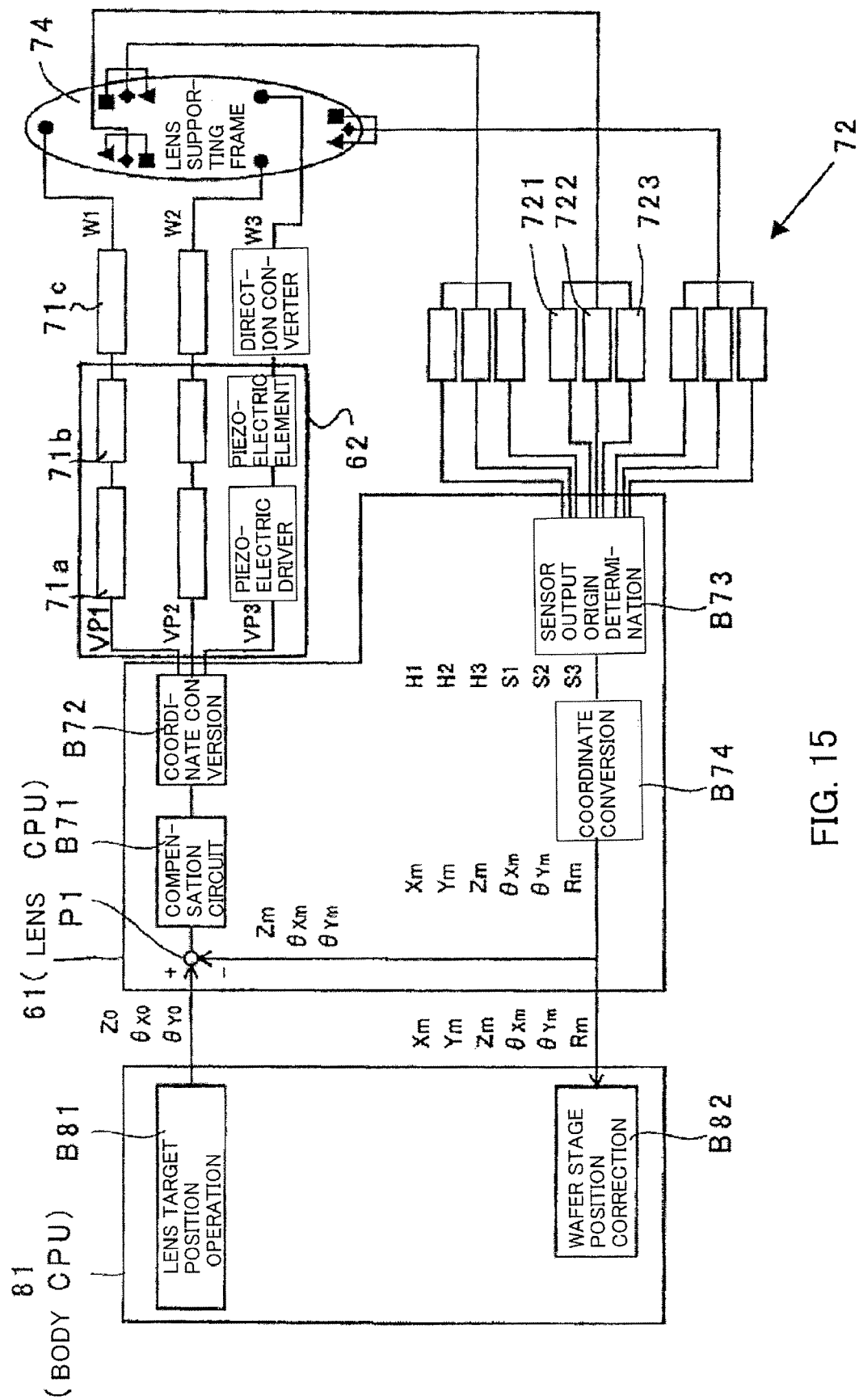
FIG. 15 is an explanatory view showing a control block in a lens unit.

FIG. 15 shows a control block of the lens unit 7. The lens target position operation block B81 in the body CPU 81 calculates a Z-axis direction driving target value Z0 of a lens reference point L0 and tilt driving target values θx0 and θy0, and sends the result to the lens CPU 61. The target value is input to an addition point P1 in the lens CPU 61.

At this addition point P1, feedback signal values Zm, θXm and θYm, which will be described later, are subtracted from the target values Z0, θX0 and θY0, and the residue signals are input into the compensation circuit block B71. The compensation circuit block B71 uses a PI compensator so as to improve the control stability. A signal that has passed the compensation block B71 is input to a coordinate conversion block B72.

The coordinate conversion block B72 converts the residue signal into a piezoelectric driving voltage command value corresponding to the Z-axis direction driving target value Z0 of the driving mechanism 71. Assume that the driving target values of the lens LE are Z0, θx0 and θy0. Then, driving displacements W1, W2 and W3 of the driving mechanism 71 (see FIG. 16) can be calculated by multiplying the predetermined conversion matrix as given by Equation 1 below:

$$\begin{pmatrix} W1 \\ W2 \\ W3 \end{pmatrix} = \begin{pmatrix} C11 & C12 & C13 \\ C21 & C22 & C23 \\ C31 & C32 & C33 \end{pmatrix} \begin{pmatrix} Z0 \\ \theta X0 \\ \theta Y0 \end{pmatrix} \quad \text{EQUATION 1}$$

Therefore, the coordinate conversion block B72 may provide a conversion given by Equation 2 below so as to output a voltage value:

$$\begin{pmatrix} VP1 \\ VP2 \\ VP3 \end{pmatrix} = CV \begin{pmatrix} C11 & C12 & C13 \\ C21 & C22 & C23 \\ C31 & C32 & C33 \end{pmatrix} \begin{pmatrix} \delta Z0 \\ \delta \theta X0 \\ \delta \theta Y0 \end{pmatrix} \quad \text{EQUATION 2}$$

δZ0, δθX0, and δθY0 are control residues, VP1, VP2, and VP3 are control command voltage signals to the piezoelectric driving part 71a, and CV is a conversion coefficient to convert a displacement amount into control voltage.

When the control command voltage signal VP1, VP2, VP3 calculated by Equation 2 are input to the piezoelectric driving part 71a, the piezoelectric element 71b expands by a predetermined amount. The driving displacements W1, W2, and W3 are given to the lens frame 74 via the direction converter 71c that includes the displacement picker 711 and the direction converter 712 of the driving mechanism 71 so as to move the lens frame 74 and the lens to desired positions.

Then, three sets of lens-position detectors 72 measure a displacement amount of the target mirror 75 (see FIG. 11 to 13) fixed onto the lens frame 74, and input totally nine types of measurement signals to a sensor output origin determination block B73. The nine types of measurement signals include a blend of an absolute position signal as a non-incremental displacement signal and an incremental displacement signal, and can be decomposed, as shown in FIG. 16, perpendicular displacements H1, H2, and H3 as absolute displacement components in the optical-axis C direction, and horizontal displacements S1, S2, and S3 as absolute displacement components in the lens radial direction component.

Figure 16:
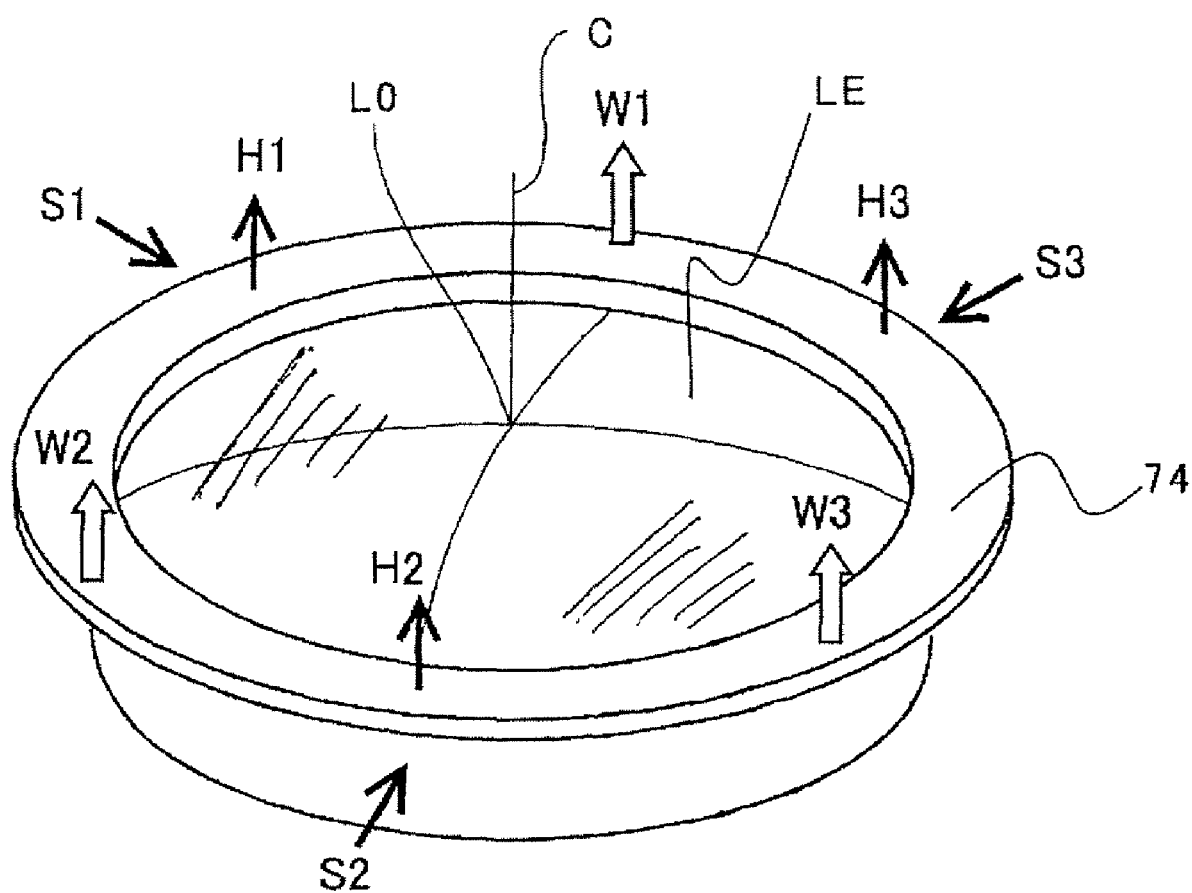
FIG. 16 is an explanatory view showing a coordinate definition and moving amount at each location on a lens frame, when the driving mechanism and the lens-position detector are located near the lens.

Referring now to FIG. 16, a description will be given of a coordinate definition and a moving amount at each location on the lens frame 74. As illustrated, the flange part 74a of the lens frame 74 that holds the lens LE is fastened to the displacement output part of the three sets of the driving mechanisms 71 (shown in FIG. 2) arranged at 120° intervals. Assume that W1, W2, and W3 are perpendicular driving displacements of the three driving mechanisms 71. Then, the three locations of the flange part 74a move by W1, W2, and W3 along the optical-axis C direction.

The lens-position detectors 72 (shown in FIG. 2) are arranged in the flange part 74a among the driving mechanisms 71. Assume that H1, H2, and H3 are perpendicular displacements of the three sets of lens-position detectors 72, and S1, S2, and S3 are their horizontal displacements. Then, as illustrated, displacements H1, H2, H3, S1, S2, and S3 at three locations of the flange part 74a are detected.

Figure 17:
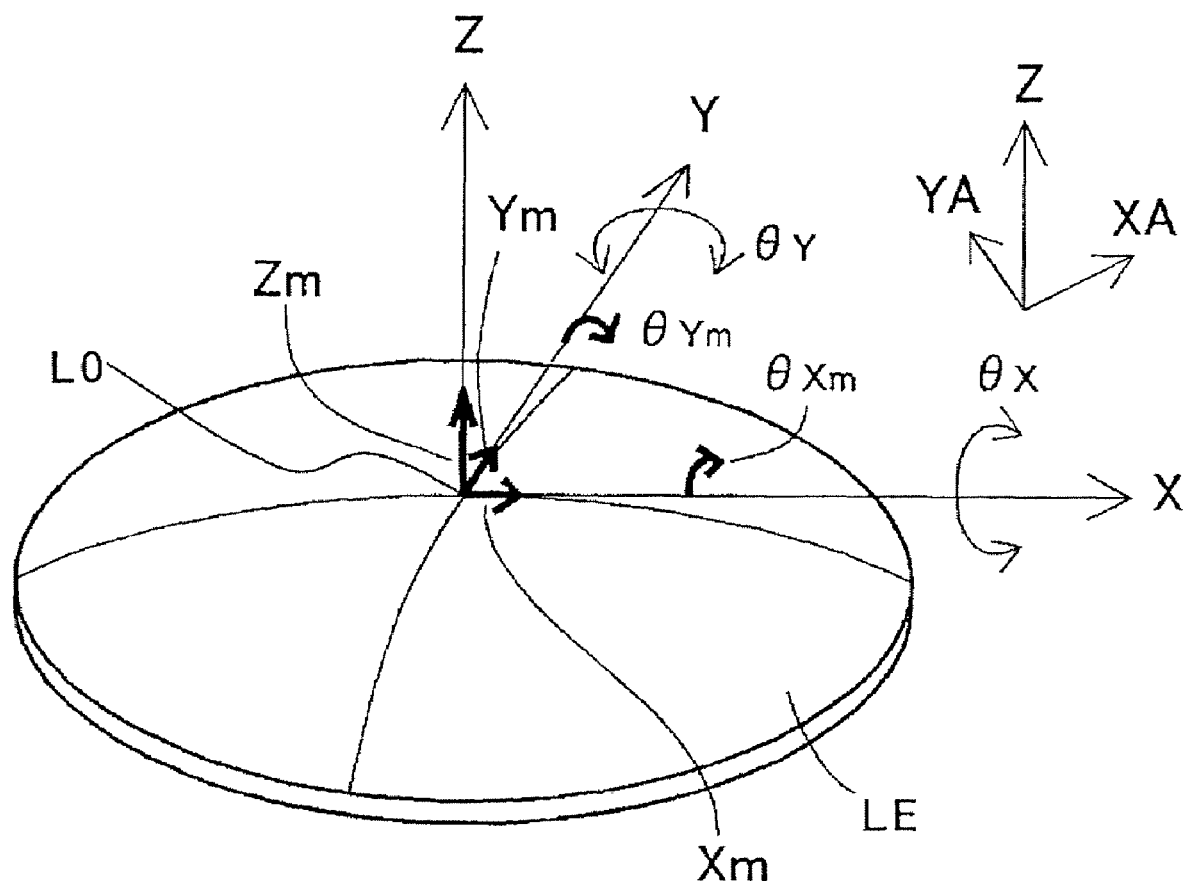
FIG. 17 is an explanatory view showing a lens coordinate definition of a lens in controlling a lens position.

FIG. 17 defines a lens coordinate or the XYZ orthogonal coordinate in controlling a position of the lens LE, in which a coordinate origin is a center on the incident plane (or a vertex of the lens first plane) when the lens LE is placed at the design reference position. The Z axis is the optical axis C. The X axis is a radial axis. The Y axis is a radial axis orthogonal to the X axis. The center of the incident plane of the lens LE is defined as a lens reference point L0 or a lens position representative point in the lens position control.

When three sets of driving mechanisms 71 are driven with the same driving displacement (W1=W2=W3), the lens reference point L0 provides a translation in the Z-axis direction and the displacement amount is expressed as Zm. When the driving mechanisms 71 are driven so that the displacement amounts of the three sets of driving mechanisms 71 can differ, the lens LE tilts and displaces around the X axis or Y axis in accordance with the relative change of the driving amount of the three sets of driving mechanisms 71. The driving directions are the Z-axis direction, the θx direction, and the θy direction, and the number of driving direction parameters is 3, such as the Z-axis direction, the θX direction, and the θy direction. The tilt displacement amounts are the θx direction and the θY direction.

In general, a tilt center of the lens LE to be tilted does not accord with the lens reference point L0, and the translational displacement (lateral shift) in the Y-axis direction occurs with a tilt around the Y axis, and the translational displacement (lateral shift) in the X-axis direction occurs with a tilt around the X axis. These lateral shift displacements will be referred to as Ym and Xm.

Next, turning back to FIG. 15, the coordinate conversion block B74 converts six types of displacement information calculated in the above steps into the positional coordinate of the lens LE. The pre-conversion measurement values H1, H2, H3, S1, S2, and S3 of the lens LE, and the coordinate values (post-conversion measurement values) Xm, Ym, Zm, θXm, θYm, and Rm of the lens reference point L0 can be mutually converted to each other using a predetermined conversion matrix. The number of position detection parameters is six, such as Xm, Ym, Zm, θXm, θYm, and Rm, and correlated by Equation 3 below:

$$\begin{pmatrix} Xm \\ Ym \\ Zm \\ \theta Xm \\ \theta Ym \\ Rm \end{pmatrix} = \begin{pmatrix} K11 & K12 & K13 & K14 & K15 & K16 \\ K21 & K22 & K23 & K24 & K25 & K26 \\ K31 & K32 & K33 & K34 & K35 & K36 \\ K41 & K42 & K43 & K44 & K45 & K46 \\ K51 & K52 & K53 & K54 & K55 & K56 \\ K61 & K62 & K63 & K64 & K65 & K66 \end{pmatrix} \begin{pmatrix} H1 \\ H2 \\ H3 \\ S1 \\ S2 \\ S3 \end{pmatrix} \quad \text{EQUATION 3}$$

Totally five post-conversion measurement values Xm to θYm have been discussed. Rm is a value relating to a diameter size of the lens frame 74. In this embodiment, some of the coefficients in the conversion matrix become substantially zero as expressed by Equation 4 below:

$$\begin{pmatrix} Xm \\ Ym \\ Zm \\ \theta Xm \\ \theta Ym \\ Rm \end{pmatrix} = \begin{pmatrix} 0 & 0 & 0 & K14 & K15 & K16 \\ 0 & 0 & 0 & K24 & K25 & K26 \\ K31 & K32 & K33 & 0 & 0 & 0 \\ K41 & K42 & K43 & 0 & 0 & 0 \\ K51 & K52 & K53 & 0 & 0 & 0 \\ 0 & 0 & 0 & K64 & K65 & K66 \end{pmatrix} \begin{pmatrix} H1 \\ H2 \\ H3 \\ S1 \\ S2 \\ S3 \end{pmatrix} \quad \text{EQUATION 4}$$

That is, the lens's Z-axis direction translational displacement Zm, and tilt displacements θXm and θYm are calculated by the perpendicular displacements H1, H2, and H3 as the absolute displacements in the measured Z-axis direction, and do not depend upon the horizontal displacements S1, S2, and S3 as the absolute displacement in the lens radial direction. In addition, displacements Xm and Ym of the lens LE in the direction orthogonal to the Z axis and the lens frame 74's diameter size Rm are calculated by the horizontal displacements S1, S2, and S3 as the absolute displacements in the lens radial direction, and do not depend upon the perpendicular displacements H1, H2, and H3 as the absolute displacements in the measured Z-axis direction. In other words, a displacement component in a direction having a control degree of freedom is detected by a sensor having detection sensitivity in the Z-axis direction, and a displacement component in the direction having no control degree of freedom is detected by a sensor having detection sensitivity in a direction orthogonal to the Z-axis direction. The degree of freedom is the number of independent determinations (or independently determinable coordinate combinations in some cases) in the coordinate of the object (all mass points in the system). The control or driving degree of freedom is the number of coordinates or coordinate combinations to be controlled or driven among independently determinable coordinate combinations.

The pre-conversion perpendicular displacements H1, H2, and H3 and various post-conversion displacements Zm, θXm and θYm are displacements obtainable by actively driving the optical element. On the other hand, the pre-conversion horizontal displacements S1, S2, and S3 and various post-conversion displacements Xm, Ym and Rm are secondary displacements that cannot be actively controlled.

Among the six post-conversion measurement values obtained in the above steps, the information necessary for the position control over the lens LE is three types, such as Zm, θXm and θYm. Therefore, control residues that are differences from the target values Z0, θX0 and θY0 can be input into the compensation circuit block B71 by inversely inputting these values into the addition point P1. When the piezoelectric actuator 713 is driven again so as to cancel the control residues, the lens LE can be precisely positioned.

On the other hand, six types of measured displacement information Xm, Ym, Zm, θXm, θYm and Rm are sent to the wafer stage position correction block B82 in the body CPU 81. Among the displacement information, Xm and Ym are used to reduce the overlay error of the reticle image, for example. This is because the overlay error of the reticle image occurs when the lens LE tilts and generates lateral shift displacements Xm and Ym.

The lateral shift displacements Xm and Ym change the aberration of the projection optical system as well as moving the reticle image formed on the wafer WF. When a scan displacement amount of the wafer stage WF1 is corrected based on Xm and Ym, the reticle image's positioning accuracy improves and the overlay error reduces on the wafer WF.

For example, Rm is used to detect a breakdown and variations with time of a size of the lens unit 7. A diameter of the lens frame 74 is originally invariable, and thus a failure in the lens unit 7 is determinable by determining whether the measurement value Rm changes greatly. In addition, if it is determined whether or not Rm changes by a fine amount, a size variation with time can be detected. A change of Rm by a fine amount would give an inference of the thermal expansions of the lens LE and the lens frame 74, a long-term change due to the metal life expiration, etc.

A description will now be given of an adjustment method of each sensor in the lens-position detector 72 in the lens unit 7. The adjustment covers waveform shaping of a periodic signal output from the incremental-type displacement detecting sensor or so-called Lissajou adjustments, and an adjustment to determine a measurement reference point of the incremental-type displacement detecting sensor based on an output value of the absolute-type displacement detecting sensor.

Figure 18:
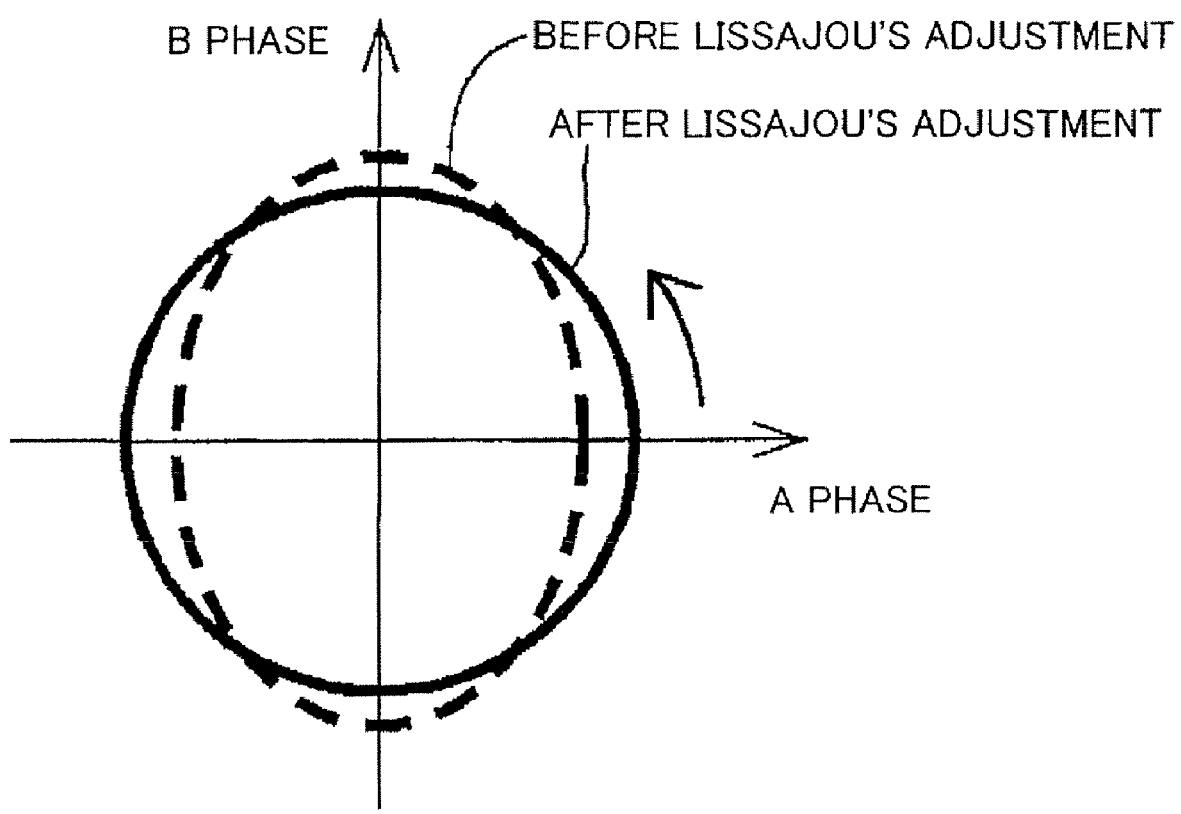
FIG. 18 is an explanatory view of a Lissajou's waveform.

Initially, a principle of the Lissajou adjustment will be discussed. The Lissajou adjustment is a pretreatment in operating a displacement signal from plural sine waves having different phases, and an adjustment used for waveform shaping of each sine wave. As shown in FIG. 18, the abscissa axis denotes the A-phase output of the interference signal calculated by the sensor control circuit 72d, and the ordinate axis denotes the B-phase output of the interference signal. Since the A-phase signal and the B-phase signal are sine waves that have the same output amplitude and a phase difference by 90°, the loci of both phases ideally form a circle when expressed on the two-dimensional plane. However, when each optical element in the sensor has a manufacturing error and quadrisection light-receiving portions have sensitivity differences, both AB phases may have different amplitudes, and the phase difference shifts from 90°, resulting, for example, in an elliptic locus as shown by a broken line. An electric frequency division of this elliptic locus does not provide a precise displacement signal due to the frequency division errors. In order to avoid this problem, a Lissajou adjustment unit (not shown) in the sensor control circuit 72d is used for the Lissajou adjustment or waveform shaping so that the Lissajou waveform becomes a circle (like a solid line in the figure).

A description will now be given of reference point scanning and the reference point determination method of the perpendicular displacement detecting sensor. In FIGS. 19A to 19D, the abscissa axis denotes a position of the lens LE in the Z-axis direction, and the ordinate axis denotes a displacement measurement value of the target mirror 75 in the Z-axis direction or the sensor output value. FIG. 19 shows that a (lower limit) position of the lens LE in the Z-axis direction accords with a design base position Hbtm1 when the driving mechanism 71 is powered off.

In this state, the voltage is applied to each of the piezoelectric actuators 713 in the three sets of driving mechanisms 71 to drive the lens LE in the Z-axis plus direction, an output value Habs of the absolute-type perpendicular-displacement detecting sensor 721 varies like a broken line. The sensor 721 is previously mechanically or electrically adjusted so that the lens LE can accord with a design ideal position or the optical origin or so that the sensor 721 can output a signal corresponding to an origin when the lens LE reaches the center in the movable range.

Thus, the sensor 721 can detect an absolute position of the target, but the linearity of the detection output is inferior to the incremental-type perpendicular-displacement detecting sensor 722 that is an optical interferometer. In other words, the output waveform (dotted line) of the absolute-type perpendicular-displacement detecting sensor 721 passes the origin 0 like Habs but is less linear than FIG. 19.

On the other hand, the incremental-type perpendicular-displacement detecting sensor 722 is superior to the absolute-type perpendicular-displacement detecting sensor 721 in detection resolution and linearity of the detection output. However, the sensor 722 can output a changing amount after it is powered, but cannot detect an absolute position of the target. Therefore, an output value Hinc becomes as shown by a solid line in FIG. 19B.

An output value Hinc0 of the incremental-type perpendicular-displacement detecting sensor 722 when the lens LE passes the origin is made accorded with an output value Habs0 of the absolute-type perpendicular-displacement detecting sensor 721, a reference point position of the detecting sensor 722 is determined. This action defines the origin of the incremental-type perpendicular-displacement detecting sensor 722 as the reference point Habs0 of the absolute-type perpendicular-displacement detecting sensor 721, enabling the absolute position of the target to be substantially detected.

Figure 19A:
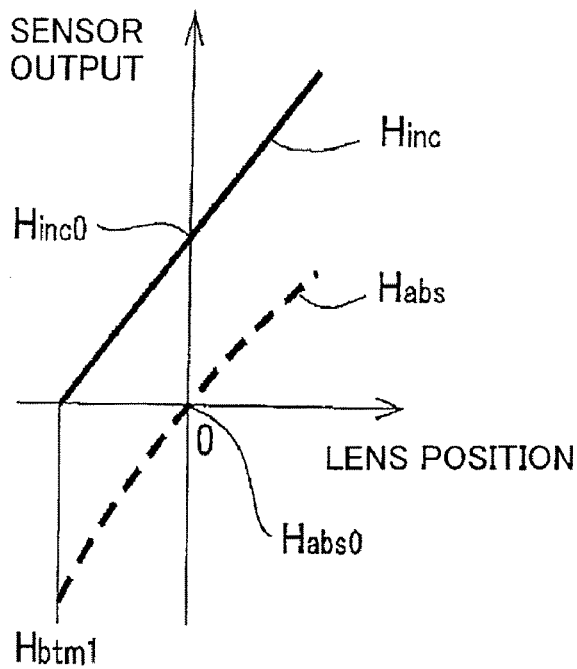
FIGS. 19A-D are explanatory views of reference point scanning and a reference point determination method of the perpendicular-displacement detecting sensor.
Figure 19B:
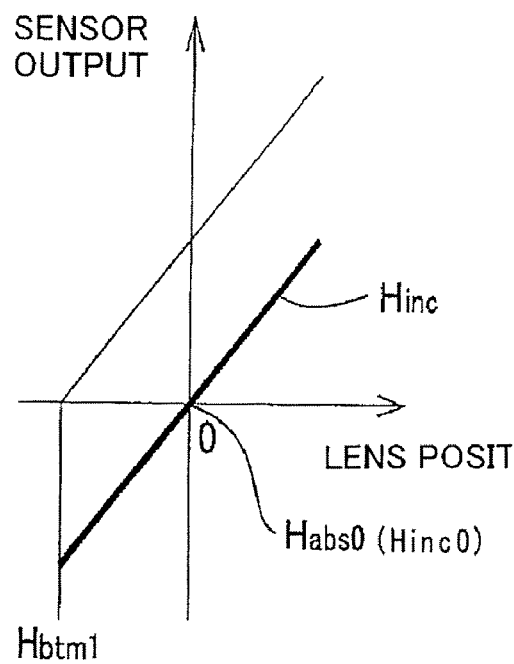
Figure 19C:
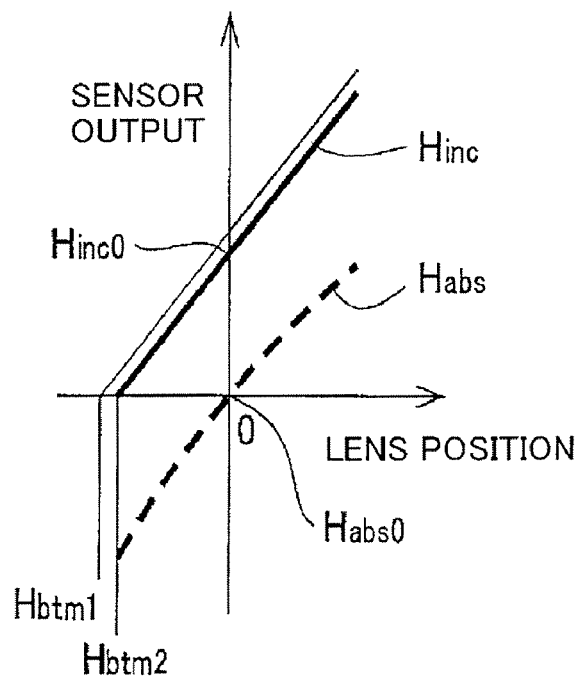

FIG. 19C shows that a position of the lens LE in the Z-axis direction (or the lower limit position or the base position) shifts by a fine amount from a design value Hbtm1 to Hbtm2 when the driving mechanism 71 is powered off. Conceivably, the lens's base position may shift due to a change of an initial length of the piezoelectric actuator 713 caused by a creep, a change of an initial length of the piezoelectric actuator 713 caused by an exchange, a change of a pilot pressure adjustment amount, etc.

The voltage is applied to piezoelectric actuator 713 at this state to drive the lens LE in the Z-axis plus direction. Then, the output value Habs of the absolute-type perpendicular-displacement detecting sensor 721 differs in its output start point from FIG. 19A, but its subsequent output signal accords with FIG. 19A and changes as shown by a broken line.

On the other hand, the incremental-type perpendicular-displacement detecting sensor 722 outputs a change amount after the power is supplied. If the base position of the lens LE shifts for the above reasons, the output value Hinc indicated by a solid line differs from the output value Hinc indicated by a thin line (corresponding to the solid line in FIG. 19A).

Figure 19D:
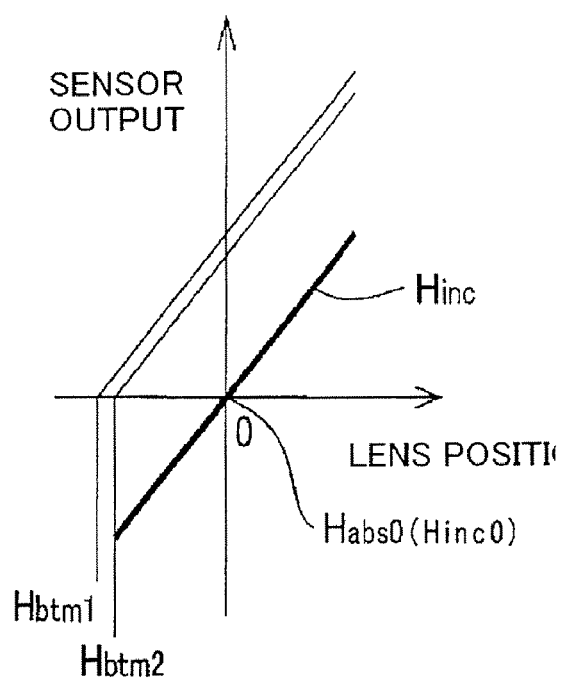

However, as discussed above, when the output value Hinc0 of the incremental-type perpendicular-displacement detecting sensor 722 when the lens LE passes the origin is made accorded with the output value Habs0 of the absolute-type perpendicular-displacement detecting sensor 721, the reference point position of the sensor 722 is defined. FIG. 19D shows this result, but in the above step, the origin of the incremental-type perpendicular-displacement detecting sensor 722 accords with the case shown in FIG. 19B.

The above adjustment defines a reference point of the incremental-type perpendicular-displacement detecting sensor 722, and the sensor 722 can serve as a precise absolute-type perpendicular-displacement detecting sensor 721.

Figure 20:
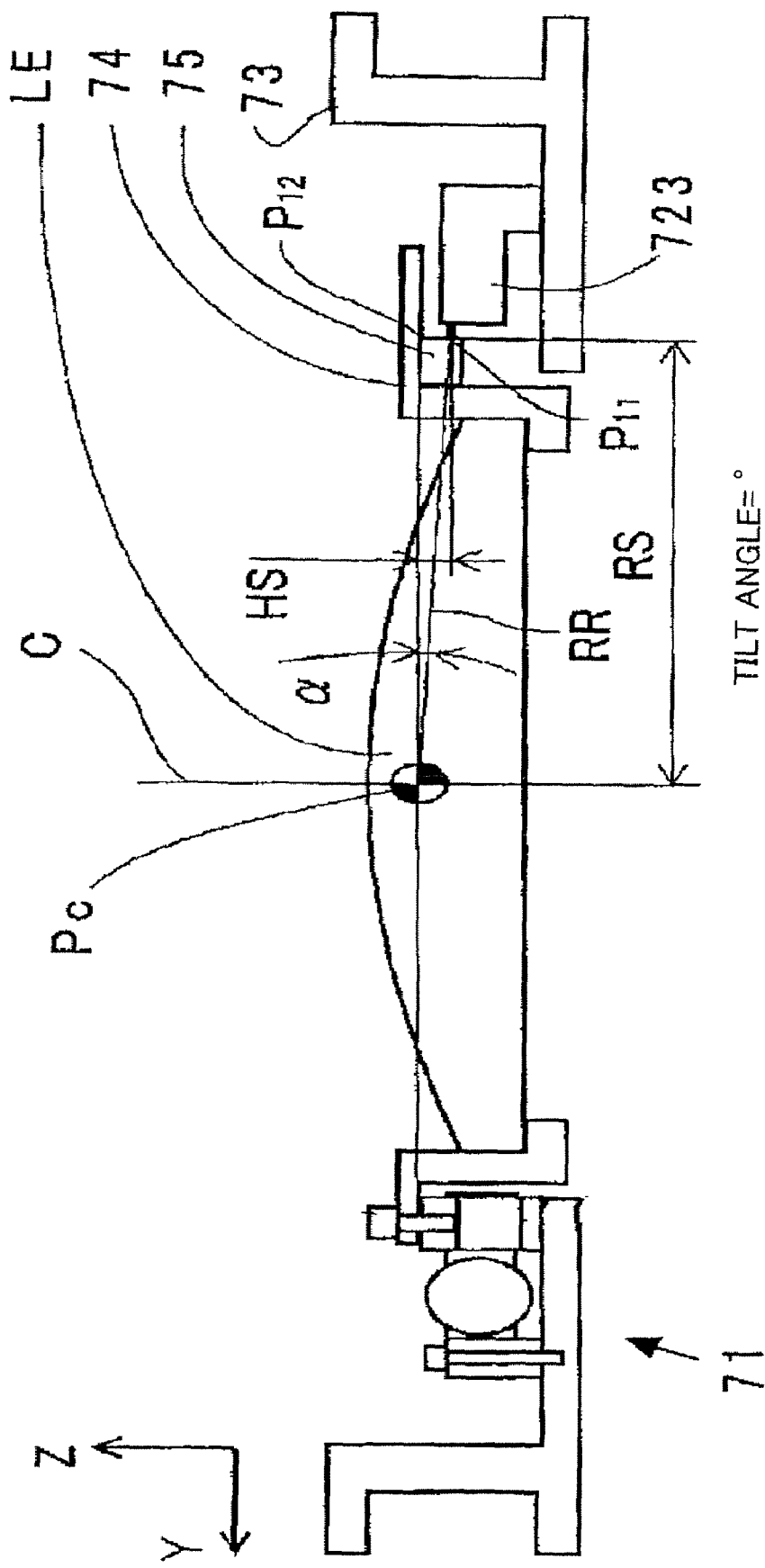
FIG. 20 is an explanatory view of an illustrative surface of a lens unit.
Figure 21:
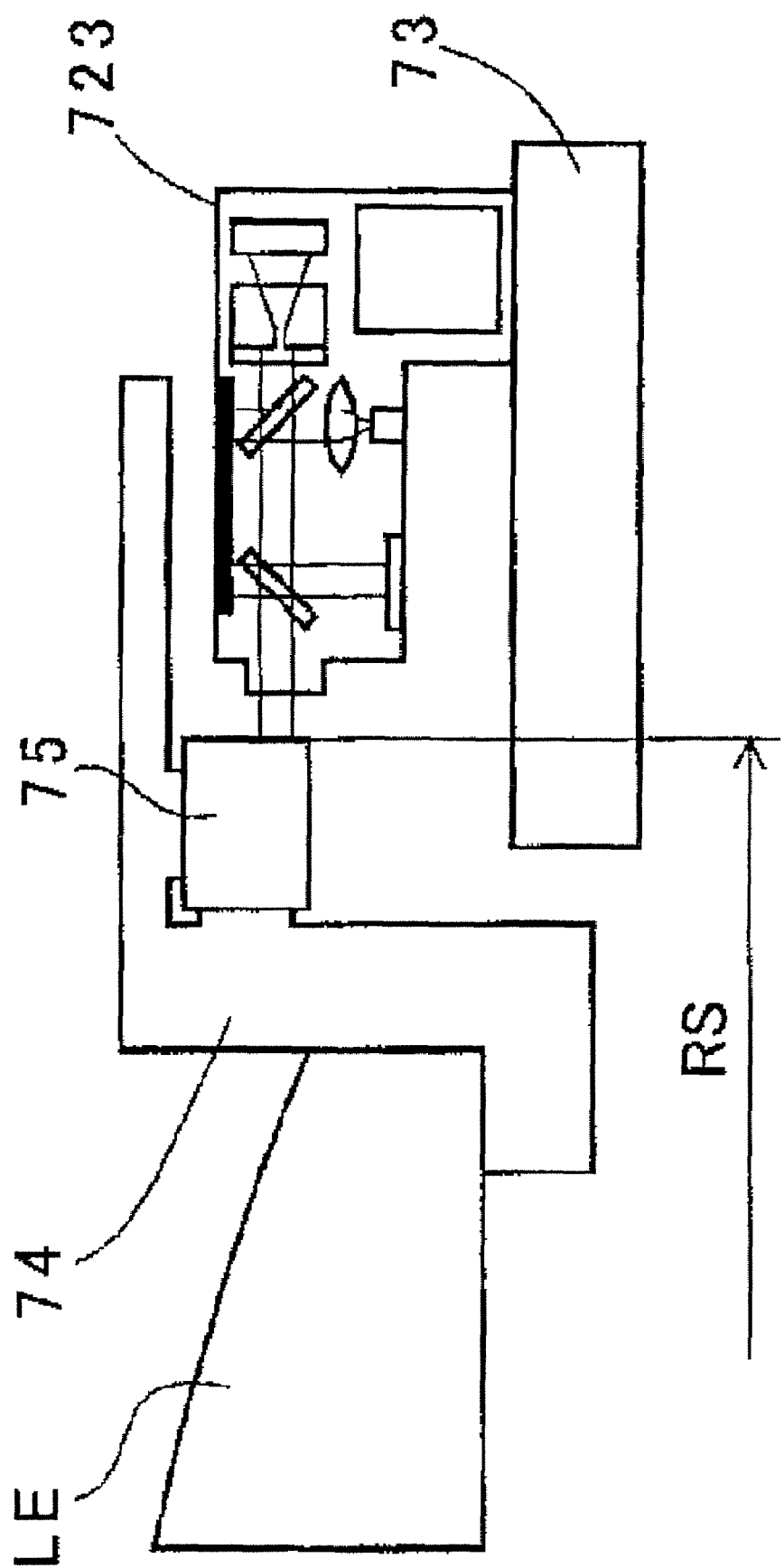
FIG. 21 is an enlarged view near the incremental-type lateral-displacement detecting sensor shown in FIG. 20.

A description will now be given of a displacement that secondarily occurs when the lens LE is tilted. FIG. 20 shows the lens LE before it is tilted around the X axis. FIG. 21 shows an enlarged view around the incremental-type lateral-displacement detecting sensor 723 shown in FIG. 20.

In order to tilt the lens LE counterclockwise around the X axis, it is necessary in the three driving mechanisms 71 in FIG. 3 to control output part of the upper driving mechanism 71 in the Z-axis minus direction, and its output parts of the lower right and lower left driving mechanisms 71 in the Z-axis plus directions. Referring to FIG. 16, the driving mechanisms 71 are controlled while $-\delta W$ is assigned to the driving displacement W1 and $+2\delta W$ is assigned to each of the driving displacements W2 and W3. No translation occurs at the lens reference point L0 in the Z-axis direction, and the lens LE is tilted only around the X axis.

The tilt center axis of the lens LE is indicated as a point Pc in FIG. 20. The tilt center axis Pc is located on the plane that passes the top surface (see FIG. 8) of the lens frame driving link 712d in the three sets of driving mechanisms 71, and approximately accords with an axis that intersects the optical axis C. The reason will be described below:

In FIG. 16, when the three sets of driving mechanism 71 have the same Z-axis direction driving displacement, the lens frame 74 translates in the Z-axis direction. On the other hand, when the three sets of driving mechanisms 71 have different Z-axis direction driving displacements, the lens frame driving link 712d (shown in FIG. 10) of each driving mechanism 71 translates in the Z-axis direction by different amounts, and the lens frame 74 consequently tilts. This tilt action causes the lens frame driving link 71 to which the lens frame 74 is fastened to have a compulsory inclination by an angle equal to the tilt angle.

In this case, as described with reference to FIG. 10, the support link 712e that restricts the lens frame driving link 712d has a twistable structure around the U axis. Thus, the lens LE can be tilted, and the tilt center axis Pc of the lens LE in FIG. 20 is located near the intersection between the optical axis C and the plane that includes the thin part 712d1 (shown in FIG. 16) of the support link 712e. Here, the Z-axis direction height of the plane that includes the thin part 712d1 is approximately as high as the fastening plane between the lens frame driving link 712d and the lens frame 74.

When the lens LE is tilted in the lens unit 7, there is no fixed tilt center, defined by a bearing, a pivot mechanism and so on, but the tilt center axis Pc of the lens LE is defined when part of the driving mechanism 71 has low distortion rigidity.

Figure 24:
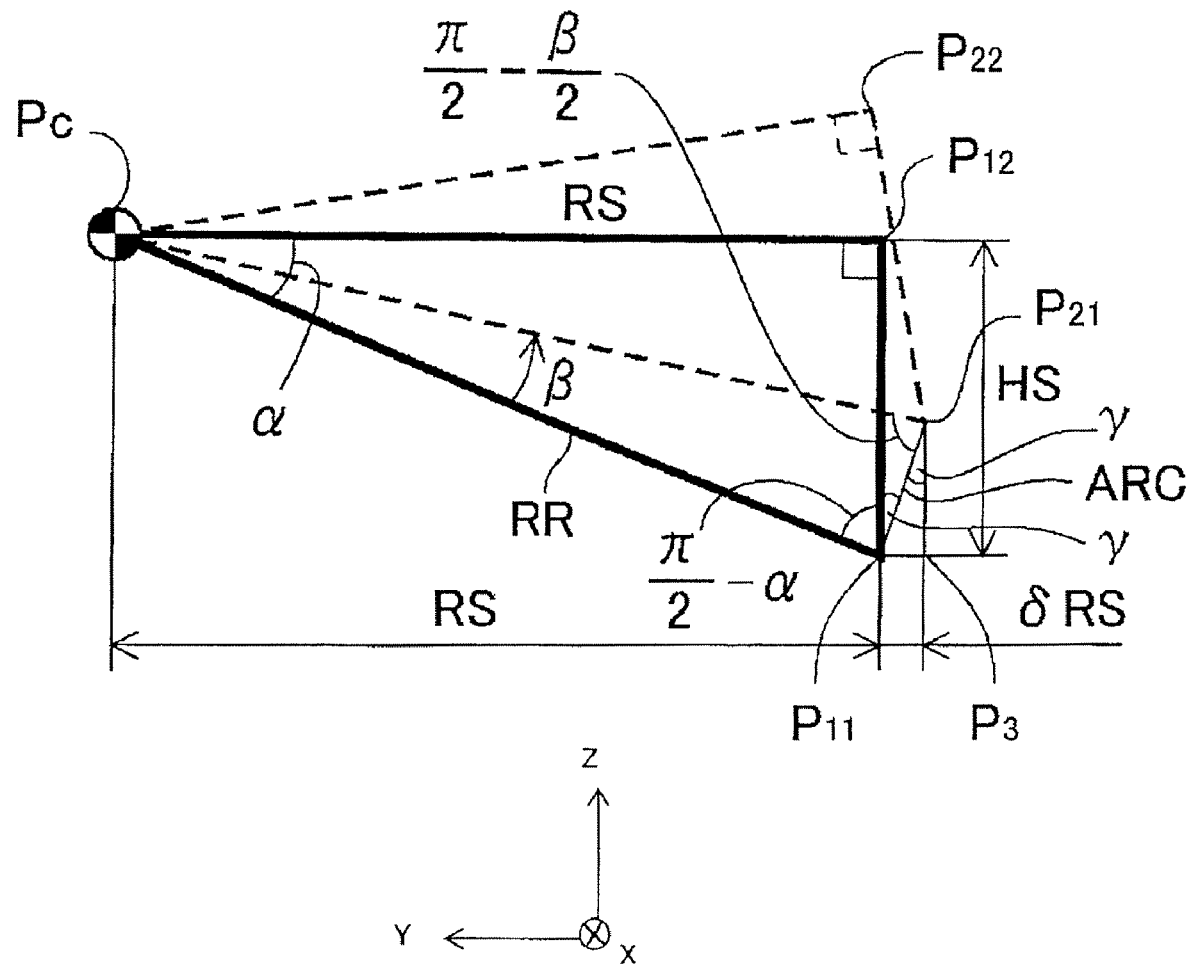
FIG. 24 is an explanatory view that mathematically shows changes before and after the lens is tilted.

A description will now be given of a lateral shift amount when the lens LE is tilted. In FIGS. 20 and 24, RR denotes a segment that connects the tilt center axis Pc to a displacement measurement point P11 of the incremental-type lateral-displacement detecting sensor 723 in the target mirror 75. A point P12 denotes an intersection between a horizontal that passes the tilt center axis Pc and a perpendicular that passes the displacement measurement point P11. These three points Pc, P11 and P12 define a right triangle PcP11P12.

RS denotes a Y-axis direction component of the segment RR. HS denotes a Z-axis direction component of the segment RR. α denotes a relative angle between the horizontal that passes the tilt center axis Pc and the segment RR. FIG. 21 defines RS as a distance in the Y-axis direction between the tilt center axis Pc and the reflection surface of the target mirror 75 onto which the measurement beam of the sensor 723 is projected.

Figure 22:
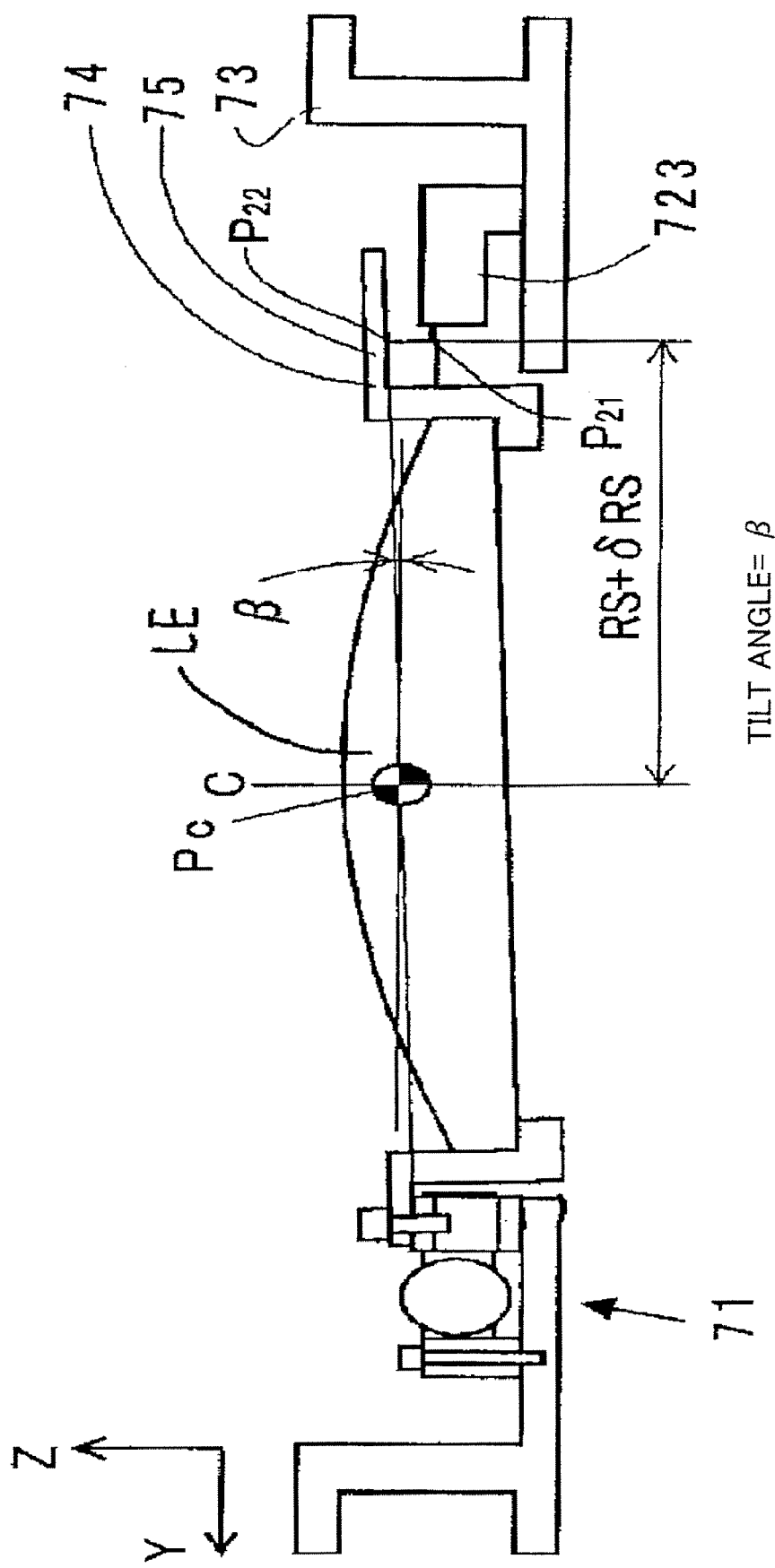
FIG. 22 is an explanatory view when the lens unit shown in FIG. 20 is tilted by an angle $\beta$.
Figure 23:
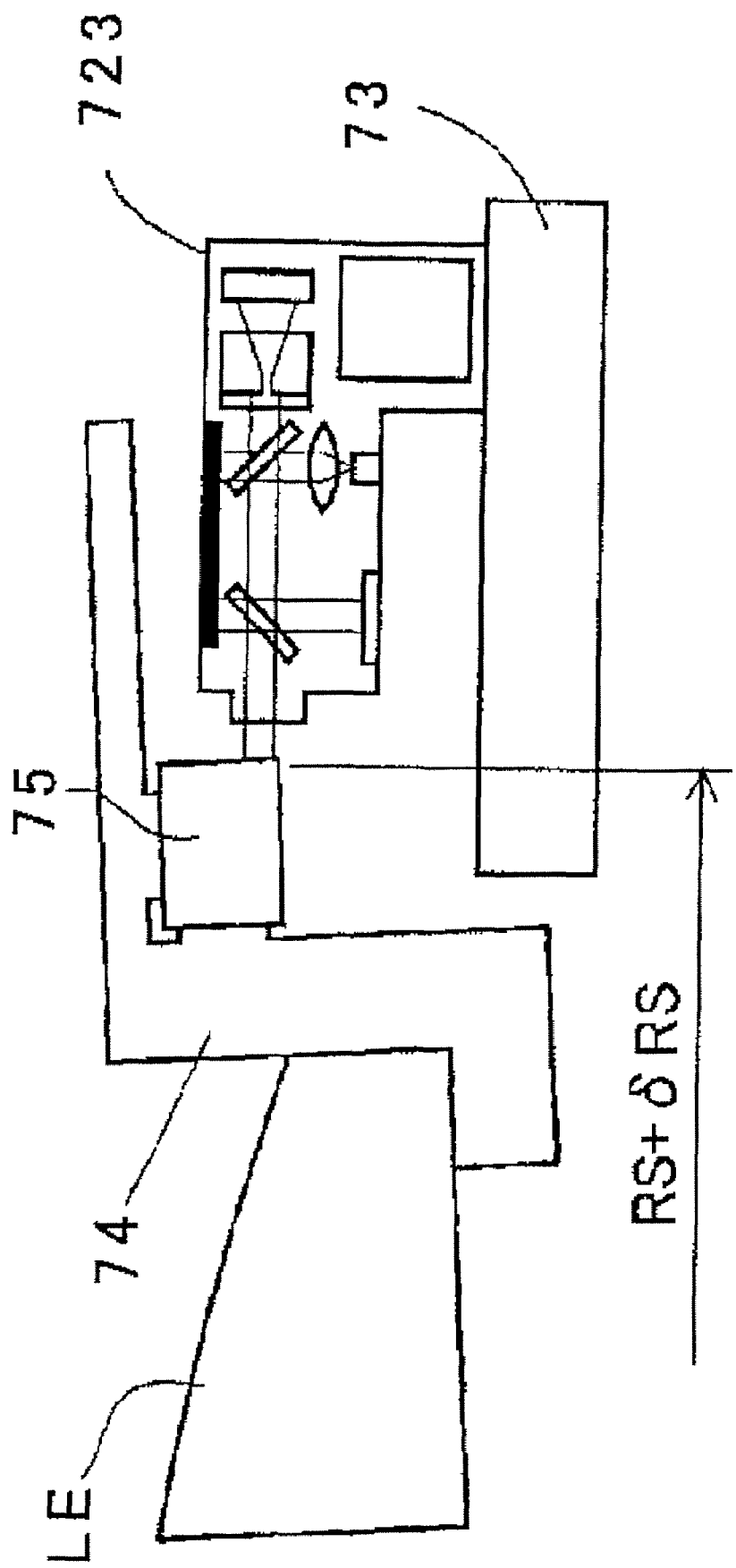
FIG. 23 is an enlarged view near the incremental-type lateral-displacement detecting sensor shown in FIG. 22.

FIG. 22 shows a section when the lens LE is tilted counterclockwise by an angle β, and FIG. 23 is an enlarged view near the incremental-type lateral-displacement detecting sensor 723 shown in FIG. 22. Along with the tilt displacement of the lens LE, the target mirror 75 displaces in the Z-axis plus direction and Y-axis minus direction (or the right directions in FIGS. 22 and 23) by a fine amount. Therefore, the right triangle PcP11P12 defined by FIG. 24 moves to a right triangle PcP21P22, and the Y-axis direction component RS between the measurement beam irradiation member P21 and the tilt center axis Pc increases by δRS.

A description will now be given of the lateral shift amount δRS. FIG. 24 shows the right triangle PcP21P22 by a solid line before it is tilted, and the right triangle PcP21P22 by a broken line after it is tilted, but exaggerates the angle α for description purposes of δRS. ∠P11PcPl2=α is met, and Equation 5 below is also met:

$$\sin\alpha = \frac{HS}{RR} \quad \text{EQUATION 5}$$

When the tilt angle β is fine where ARC denotes a segment that connects a pre-tilt vertex P11 to a post-tilt vertex P21, Equation 6 below is met:

$$ARC = RR \times \beta \quad \text{EQUATION 6}$$

When a distance δRS between P11 and P3 is a lateral shift amount of the target mirror 75 in the Y-axis direction caused by tilting of the lens LE, where P3 is an intersection between a horizontal that passes the point P11 and a perpendicular that passes the P21, where γ=∠P12P11P21=∠P3P21P11, Equation 7 below is met:

$$\delta RS = ARC \times \sin\gamma \quad \text{EQUATION 7}$$

Assume that the tilt angle β is a negligible fine angle to other angles, such as α, and address a basic angle of the isosceles triangle PcP11P21 shown in FIG. 24. Then, Equation 8 below is met:

$$\gamma = \left(\frac{\pi}{2} - \frac{\beta}{2}\right) - \left(\frac{\pi}{2} - \alpha\right)$$
$$= \alpha - \frac{\beta}{2} \fallingdotseq \alpha \quad \text{EQUATION 8}$$

Equation 9 below is obtained by substituting Equation 8 for Equation 7 with Equations 5 and 6:

$$\delta RS = ARC \times \sin\alpha \quad \text{EQUATION 9}$$
$$= RR \times \beta \times \sin\alpha$$
$$= HS \times \beta$$

Assume that β is a tilt angle and HS is a Z-axis direction size between the detection beam position P11 of the incremental-type lateral-displacement detecting sensor 723 and the tilt center axis Pc of the lens LE. When the lens LE is tilted, a displacement (δRS) detection signal occurs in the sensor 723.

On the other hand, λ is a light source wavelength of the sensor 723. When a distance between the sensor 723 and the target mirror 75 changes by λ/2, an interference signal of the Lissajou's waveform for one period described with reference to FIG. 18 is obtained. Therefore, the Lissajou adjustment that uses the interference signal that occurs in the sensor 723 when the lens LE is tilted requires Equation 10 below to be met:

$$\delta RS > \frac{\lambda}{2} \quad \text{EQUATION 10}$$

Equation 11 is led from Equations 9 and 10:

$$HS > \frac{\lambda}{2\beta} \quad \text{EQUATION 11}$$

As one specific numerical example, HS>4 (mm) is obtained when λ=800 (nm)=8×10⁻⁴ (mm) and β=1×10−4 (rad) are substituted for Equation 11. More specifically, this example uses an interference-type laser measuring unit having a light source wavelength λ=800 (nm) and a lens unit 7 having a characteristic of a maximum tilt angle β=1×10⁻⁴ (rad) for practical use in driving mechanisms 71. The Lissajou adjustment of the measuring unit is available with a tilt action of the lens LE by spacing a measurement beam position of the measuring unit from the tilt center axis Pc of the lens LE by 4 (mm) or greater in the Z-axis direction.

On the other hand, when the lens LE is titled by the same tilt angle β around an axis parallel to the Y axis, a lateral shift position in the X-axis direction observed by the upper right and upper left lens-position detectors 72 shown in FIG. 2 is √3/2≈0.87 times as large as δRS calculated by Equation 6. Therefore, the Z-axis direction spacing amount HS calculated by Equation 11 needs about 1.15 times or 4.6 (mm) or more spacing. In addition, the precise Lissajou adjustment described with reference to FIG. 18 preferably requires about two periods of the interference signal. Therefore, with the foregoing in mind, it is preferable to secure double or more spacing amount for the spacing amount HS calculated by Equation 11.

Figure 25:
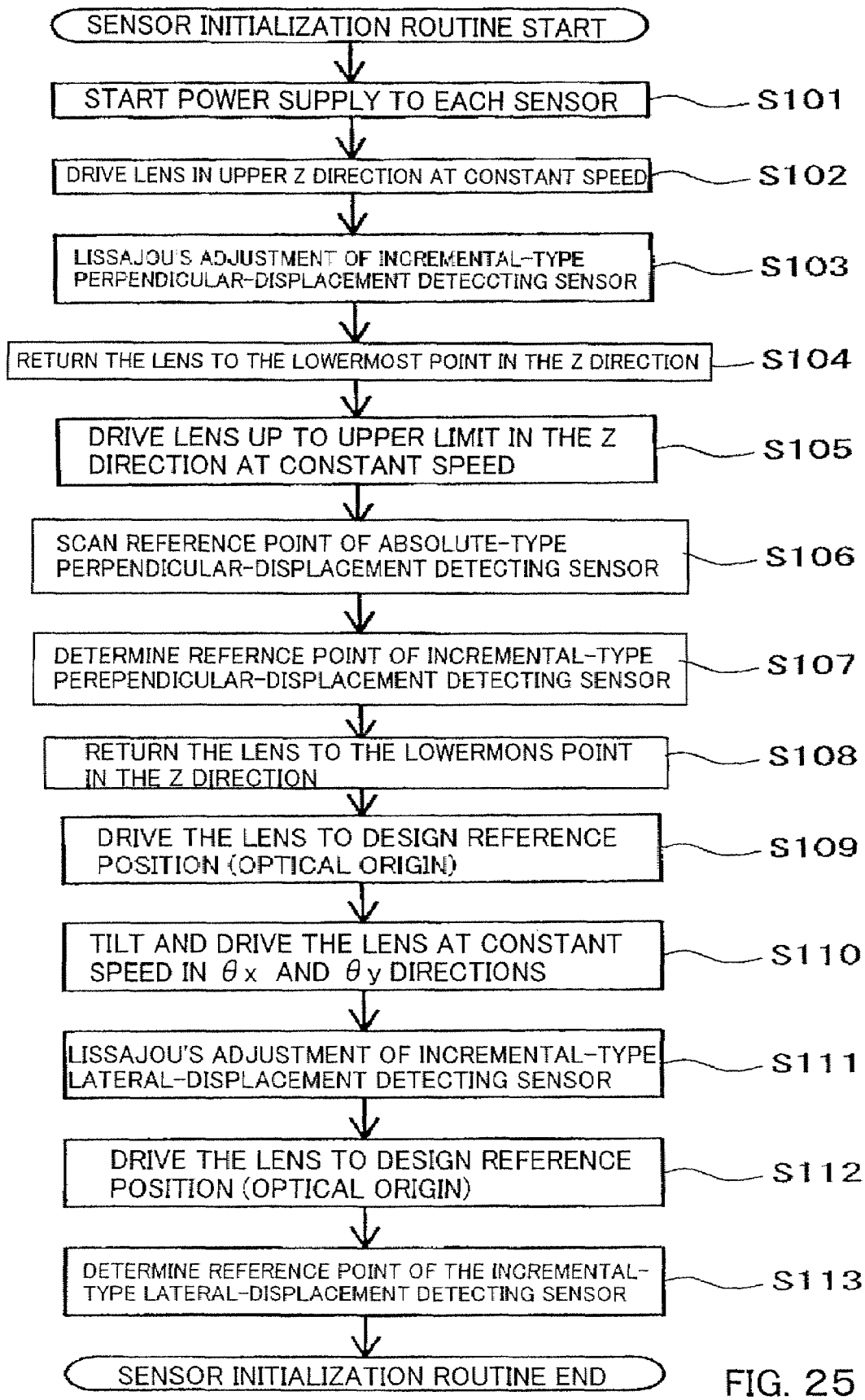
FIG. 25 is a flowchart of a sensor initialization routine relating to the optical element holding unit according to the first embodiment of the present invention.

FIG. 25 shows a flowchart of a sensor initialization routine in executing the adjusting step of various detecting sensors 721, 722, and 723. More specifically, this is an adjustment method to the lens unit 7 that includes a driving mechanism 71 that moves the lens LE in the optical axis direction, and a lens-position detector 72 that generates a periodic signal used to measure a position in a direction orthogonal to the optical axis of the lens LE.

This method includes the steps of driving the lens LE in an inclination direction relative to the optical axis, and according the driving direction of the lens LE with the optical axis direction through waveform shaping of the periodic signal generated from the detector 72 based on the output signal of the lens-position detector 72 when the lens is driven in the inclination direction of the lens LE relative to the optical axis.

Initially, the step S101 starts power supplies to the various detecting sensors 721, 722 and 723 in the lens-position detector 72 to render a lens position measurable state. Since none of the three sets of driving mechanisms 71 have not yet been activated in this step, the lens LE is located at the base position or the lowermost position in the movable range in the Z-axis direction.

Next, the step S102 drives the three sets of driving mechanisms 71 at a uniform rate to move the lens LE in the upper Z-axis direction by a predetermined amount. The step S103 provides the Lissajou adjustment of the three sets of incremental-type perpendicular-displacement detecting sensors 722, based on the principle described with reference to FIG. 18 while driving the driving mechanisms 71 at the uniform rate. The step S104 returns the lens LE to the lowermost or base position in the Z-axis direction. The step S105 drives the three sets of driving mechanisms 71 at a uniform rate, and moves the lens LE to the upper limit position in the driving range in the upper Z-axis direction. The step S106 scans the reference point of the absolute-type perpendicular-displacement detecting sensor 721 based on the method described with reference to FIG. 19 while executing the step S105. The step S107 defines the reference point of the incremental-type perpendicular-displacement detecting sensor 722.

After the step S107 is executed, the step S108 once returns the lens LE to the basic or the lowermost position. Next, the step S109 moves the lens LE to the design reference position (optical origin) or a position of the origin 0 shown in FIG. 19. The step S110 tilts the lens LE around the X axis and the Y axis by a predetermined amount. The step S111 sequentially provides the Lissajou adjustment of the three incremental-type lateral-displacement detecting sensor 723 together with the step S110.

The step S112 again moves the lens LE to the design reference position (optical origin) or a position of the origin 0 shown in FIG. 19. The step S113 determines the reference point of the incremental-type lateral-displacement detecting sensor 723. This embodiment has no absolute-type lateral-displacement detecting sensor, because a position of the lens frame 74 restricted by the three driving mechanisms 71 cannot be actively controlled in the X-axis and Y-axis directions orthogonal to the Z-axis direction but the lens frame 74 has advantages of high rigidity and position reproducibility in the X-axis and Y-axis directions.

The position reproducibility in the X-axis and Y-axis directions is good in returning the lens LE to the optical origin position based on output signals from the absolute-type perpendicular-displacement detecting sensor 721 and the incremental-type perpendicular-displacement detecting sensor 722. In controlling the lens LE to move to the constant position as the optical origin position, an output value of the incremental-type lateral-displacement detecting sensor 723 is set to the origin. This configuration enables the absolute position in the lateral direction to be precisely determined without an absolute-type lateral-displacement detecting sensor. The sensor initialization routine is thus completed.

The above flow provides the Lissajou adjustments of the incremental-type perpendicular-displacement detecting sensor 722 and the incremental-type lateral-displacement detecting sensor 723, and determines the origin of the lens LE using the absolute-type perpendicular-displacement detecting sensor 721, thereby precisely detecting the translation displacement of the lens LE in the Z-axis direction, and the tilt displacements of the lens LE around the X axis and the Y axis.

The flow shown in FIG. 25 is performed at the assembly completion time of the lens unit 7 and may be properly performed in the final adjustment of the finished semiconductor exposure apparatus 1 shown in FIG. 1 and in the operating time of the exposure apparatus 1 to manufacture semiconductor wafers.

The above first embodiment arranges plural detecting sensors 721, 722, and 723, and makes the number of position detection parameters of the detecting sensors 721, 722, and 723 greater than the number of driving direction parameters of the lens LE for redundancy. This configuration provides the information Rm containing the thermal expansion and shrinkage and damages of the detecting sensors 721, 722, and 723 or the lens frame 74 or another member as well as the lateral shift displacements Xm and Ym. In other words, whether the operational environment of the projection optical system 2 is proper or not can be precisely determined.

In addition, the above first embodiment arranges the detecting sensors 721, 722, and 723 so that the secondary displacements that may occur in the tilt can be greater than the minimum displacement amounts necessary for the calibrations for the detecting sensors 721, 722 and 723 that detect the secondary displacements. Therefore, no specific member is necessary for calibration and the detection precision improves. This configuration provides a sensor calibration in the completion state of the projection optical system 2 and the operational state of the semiconductor exposure apparatus as well as the assembly time of the lens unit 7, maintaining the sensor's detection precision high.

Moreover, the above first embodiment includes the incremental-type lateral-displacement detecting sensor 723, and can precisely detect a displacement of the lens LE in a direction orthogonal to the translation direction. Therefore, the first embodiment can precisely grasp a spatial position of the lens LE by always observing the true translational displacement even when the tilt center axis Pc cannot be determined uniquely and the secondary displacement cannot be predicted from the tilt angle.

As a result, the first embodiment can improve the position measurement precision of lens LE, and the aberration reduction capability of the projection optical system 2 through control, such as a cancellation of the aberration caused by the secondary displacement from one lens LE by using the tilt driving of another lens LE. In addition, the reticle image's overlay error can be reduced through control, such as a calculation of the reticle image displacement due to the secondary displacement, and a cancellation of the reticle image displacement with scan driving of the wafer stage WF1.

Further, the above first embodiment includes the incremental-type perpendicular-displacement detecting sensor 722 that measures a relative position of the lens LE in the optical-axis C direction of the lens LE, and the absolute-type perpendicular-displacement detecting sensor 721 that measures an absolute position of the sensor 722. Therefore, the first embodiment can measure both the absolute position and the relative position of the lens LE, and provide high positioning precision even at the power resumption.

Since the first embodiment has the incremental-type lateral-displacement detecting sensor 723 that measures the absolute position of the lens LE in the direction orthogonal to the optical-axis C direction, the tilt changing amount of the lens LE can be calculated. The driving mechanisms 71 located at three locations tilt the lens LE, cancelling the alignment error of the reticle image.

First Variation of the Lens-Position Detector

The above first embodiment exemplifies a Michelson type interferometer as the incremental-type displacement detecting sensors 722 and 723, but an encoder may be used instead. The encoder is an apparatus that measures a moving amount of a diffraction grating by counting the number of interference patterns formed by the diffraction grating and the diffracted light that has passed it.

Figure 26:
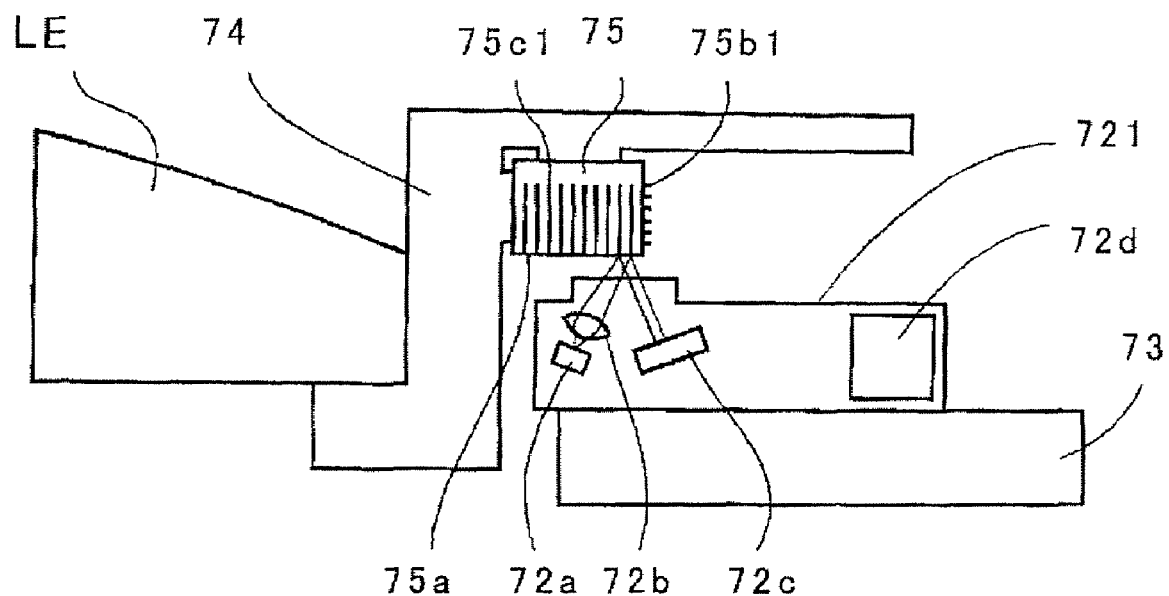
FIG. 26 is an explanatory view of the absolute-type perpendicular-displacement detecting sensor used for a first variation of the lens-position detector relating to the optical element holding unit according to the first embodiment of the present invention.
Figure 27:
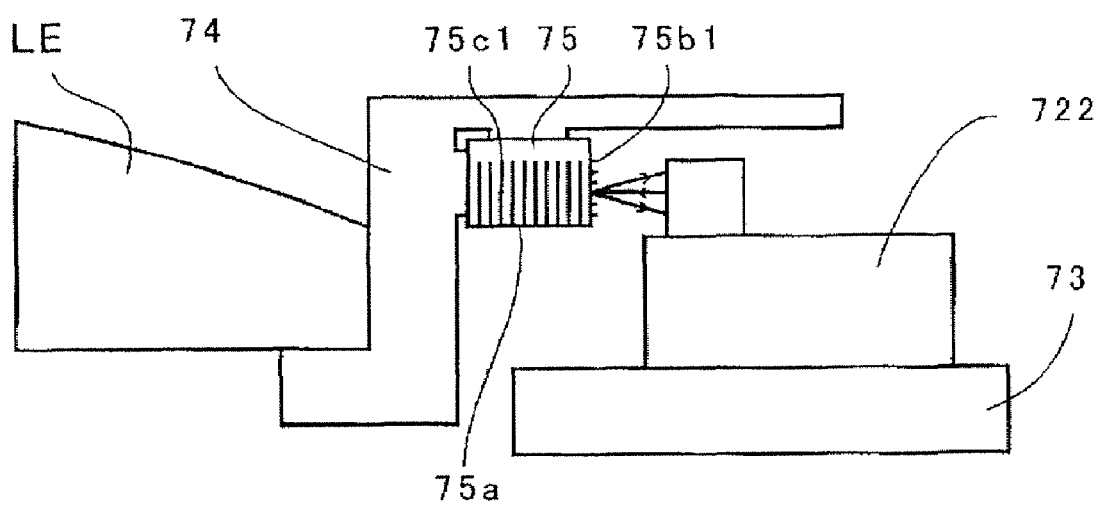
FIG. 27 is an explanatory view of the incremental-type perpendicular-displacement detecting sensor used for the first variation of the lens-position detector relating to the optical element holding unit according to the first embodiment of the present invention.
Figure 28:
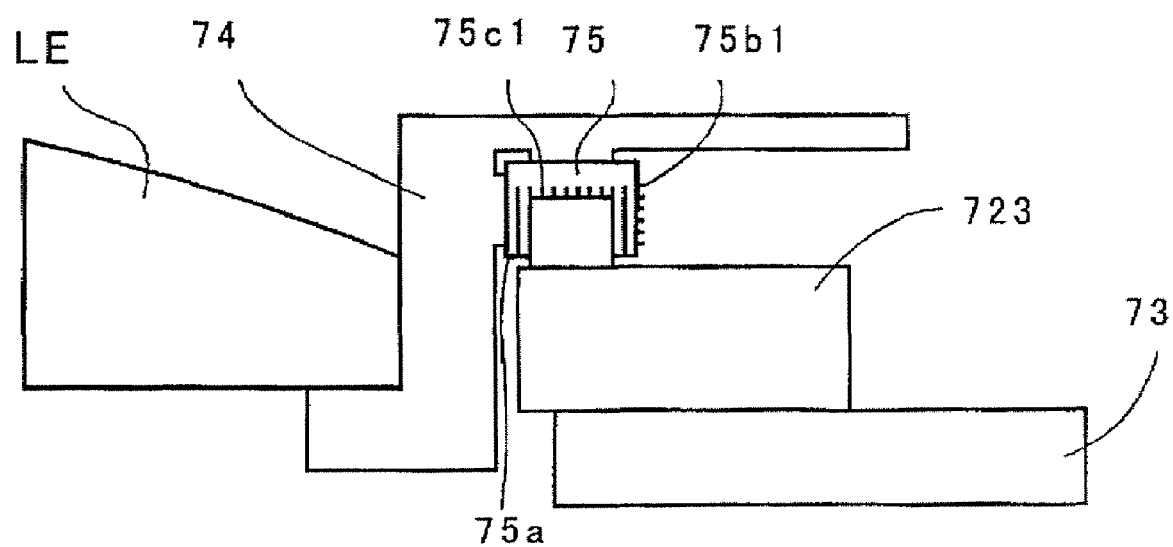
FIG. 28 is an explanatory view of the incremental-type lateral-displacement detecting sensor used for the first variation of the lens-position detector relating to the optical element holding unit according to the first embodiment of the present invention.
Figure 29:
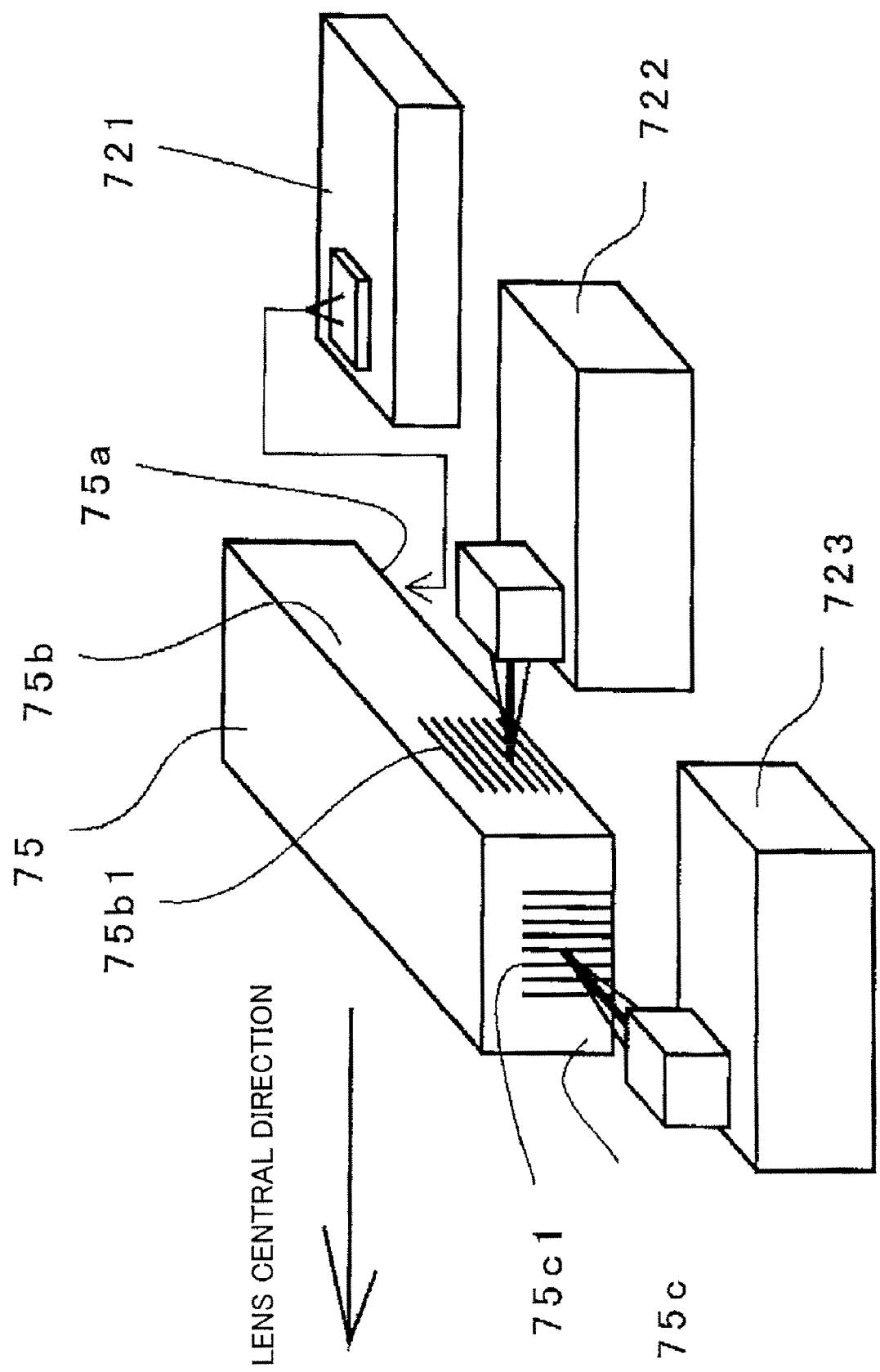
FIG. 29 is a perspective view of the first variation of the lens-position detector relating to the optical element holding unit according to the first embodiment of the present invention.

FIG. 26 shows the absolute-type perpendicular-displacement detecting sensor 721. FIG. 27 shows the incremental-type perpendicular-displacement detecting sensor 722. FIG. 28 shows the incremental-type lateral-displacement detecting sensor 723. FIG. 29 is a perspective view of these sensors 721, 722, and 723.

The target mirror 75 has a total reflection plane mirror on its bottom surface 75$a$, a diffraction grating 75$b$1 on a side surface 75$b$ along the lens tangential direction which diffraction grating 75$b$1 has multiple grooves that extend in the tangential direction of the lens circumference (lens edge), and a diffraction grating 75$c$1 on a side surface 75$c$ perpendicular to the tangential direction of the lens circumference (lens edge) which diffraction grating 75$c$1 has a groove that extends in the optical axis direction of the lens LE.

The absolute-type perpendicular-displacement detecting sensor 721 shown in FIG. 26 is the same sensor as that of the first embodiment, irradiates the measurement laser beam to the bottom surface 75$a$ of the target mirror 75, and detects the absolute displacement of the target mirror 75 in the Z-axis direction. The incremental-type perpendicular-displacement detecting sensor 722 shown in FIG. 27 can use an encoder disclosed, for example, in JP 7-167679 (Japanese Patent No. 2629606). A brief description will be given of the detection principle.

The laser beam emitted from the incremental-type perpendicular-displacement detecting sensor 722 is incident upon the diffraction grating 75b1, and the diffracted light returns to the sensor 722. Then, in the sensor 722, the diffracted beams are synthesized by a predetermined method, and an interference pattern is formed. When the target mirror 75 displaces in the Z-axis direction, a state of the diffracted light changes and the interference pattern moves in the sensor 722. Therefore, a photoelectric sensor that measures the interference pattern outputs an incremental signal as a periodic signal corresponding to the brightness and darkness of the interference pattern.

A period of the incremental signal output from the interferometer depends upon the light source wavelength, but the period of the incremental signal output from the linear encoder of this variation depends upon the grating pitch of the diffraction grating. Accordingly, use of a diffraction grating having a diffraction pitch of a submicron meter would provide a detection resolution similar to the interferometer.

Therefore, a measurement of a period of an incremental signal can result in a detection of a moving amount of the target mirror 75 at a resolution of the grating pitch. In addition, an electric frequency division of the incremental signal similar to the interferometer can improve the detection resolution down to the sub-nanometer order.

The incremental-type lateral-displacement detecting sensor 723 shown in FIG. 28 is a sensor similar to the incremental-type perpendicular-displacement sensor 722, but different in an arrangement of an internal optical system so as to detect a lateral displacement of the target mirror 75 or a moving amount of the lens LE in a direction intersecting the optical axis.

Second Variation of the Lens-Position Detector

Figure 30:
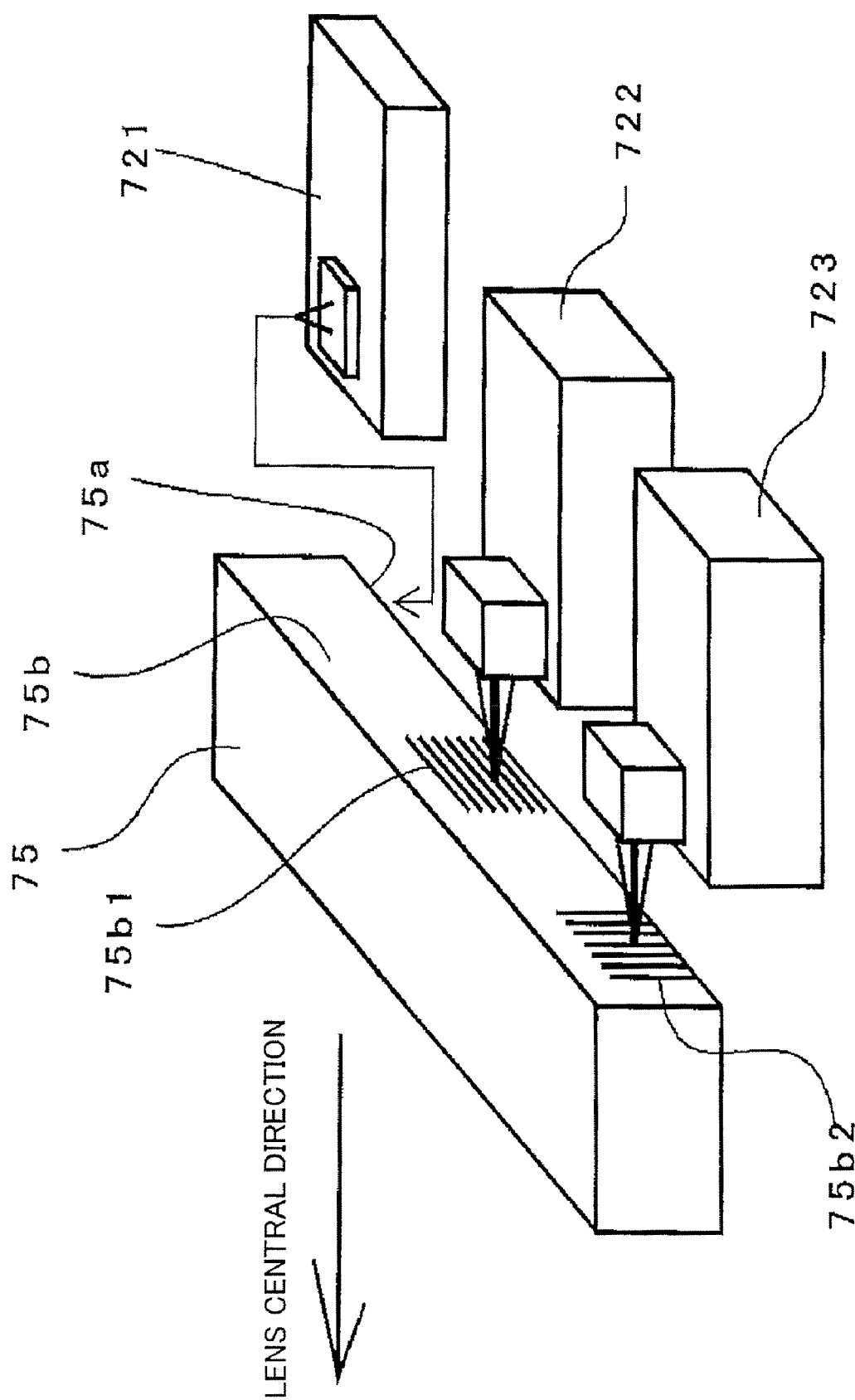
FIG. 30 is a perspective view of a second variation of the lens-position detector relating to the optical element holding unit according to the first embodiment of the present invention.

FIG. 30 shows a variation of the position detector. The absolute-type perpendicular-displacement detecting sensor 721 and the incremental-type perpendicular-displacement detecting sensor 722 are similar to those used for the first variation of the lens-position detector. However, a structure of the incremental-type lateral-displacement detecting sensor 723 is different.

The incremental-type lateral-displacement detecting sensor 723 of this second variation is similar to the sensor 723 of the first variation but the arrangement of the internal optical system is different. The incremental-type lateral-displacement detecting sensor 723 of this second variation detects a lateral displacement of the diffraction grating 75b or more specifically a moving amount in the tangential direction of the lens circumference.

Second Embodiment

All optical elements in the projection optical system are lenses LE in the above first embodiment, whereas the projection optical system of the second embodiment is a catadioptric system that includes lens units LE1 to LE4 and first to third mirrors M1 to M3 and a movably supported, driven object is a mirror. In addition, the lens LE of the first embodiment has three degrees of freedom, such as a translation in the Z-axis direction, and tilt displacements around the X axis and Y axis, whereas the second embodiment allows only the tilt driving around a predetermined axis.

Figure 31:
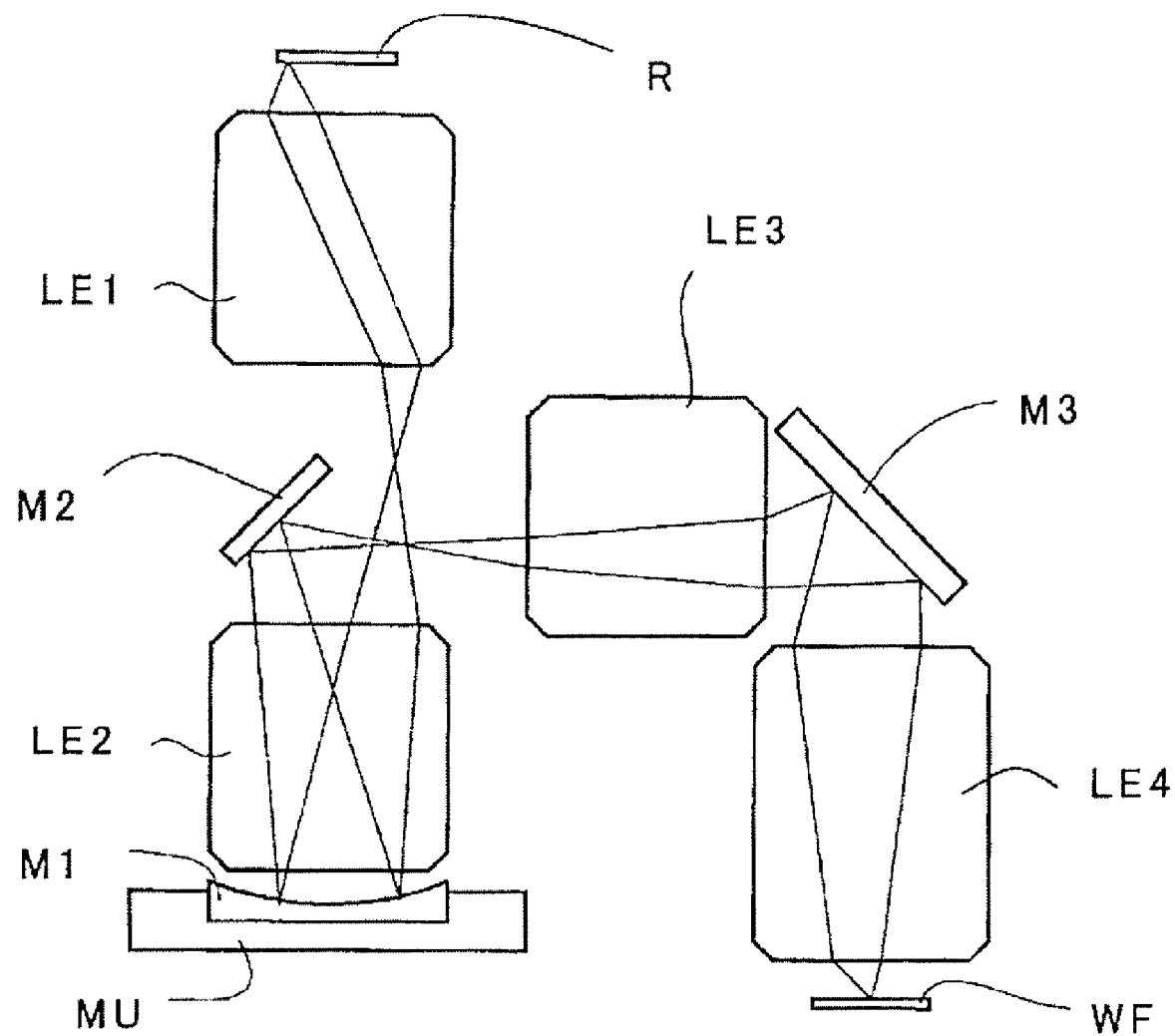
FIG. 31 is an explanatory view showing a projection optical system in an exposure apparatus having an optical element holding unit according to a second embodiment of the present invention.

FIG. 31 shows a projection optical system in the exposure apparatus that includes the optical element holding unit according to a second embodiment of the present invention. The projection optical system includes first to fourth lens units LE1 to LE4, the first to third mirrors M1 to M3, and a mirror unit MU that includes the first mirror M1. Each of the first to fourth lens units LE1 to LE4 includes plural lenses. Those elements other than the projection optical system are similar to the first embodiment, and thus a description thereof will be omitted.

Figure 32:
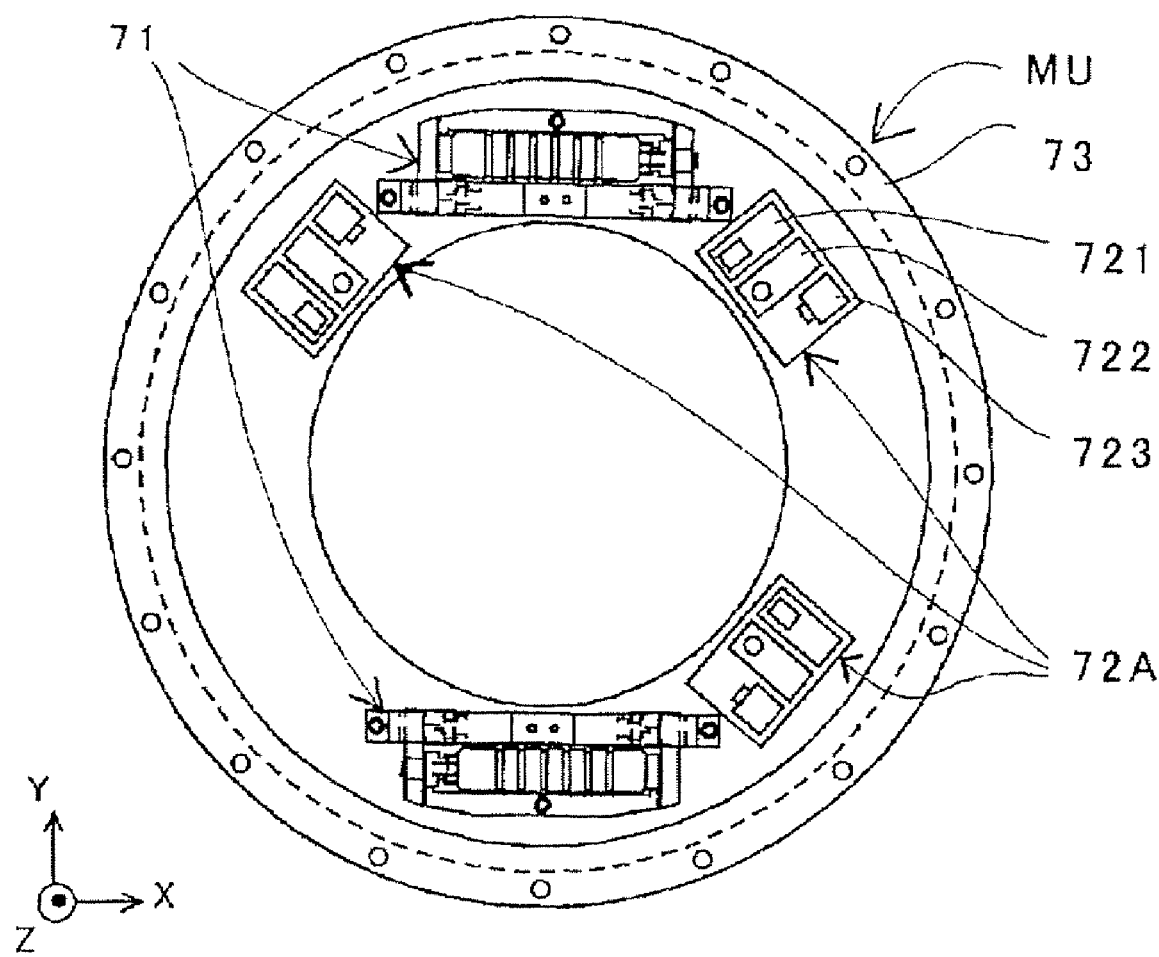
FIG. 32 is an explanatory view showing a detailed structure of the lens unit shown in FIG. 31.
Figure 33:
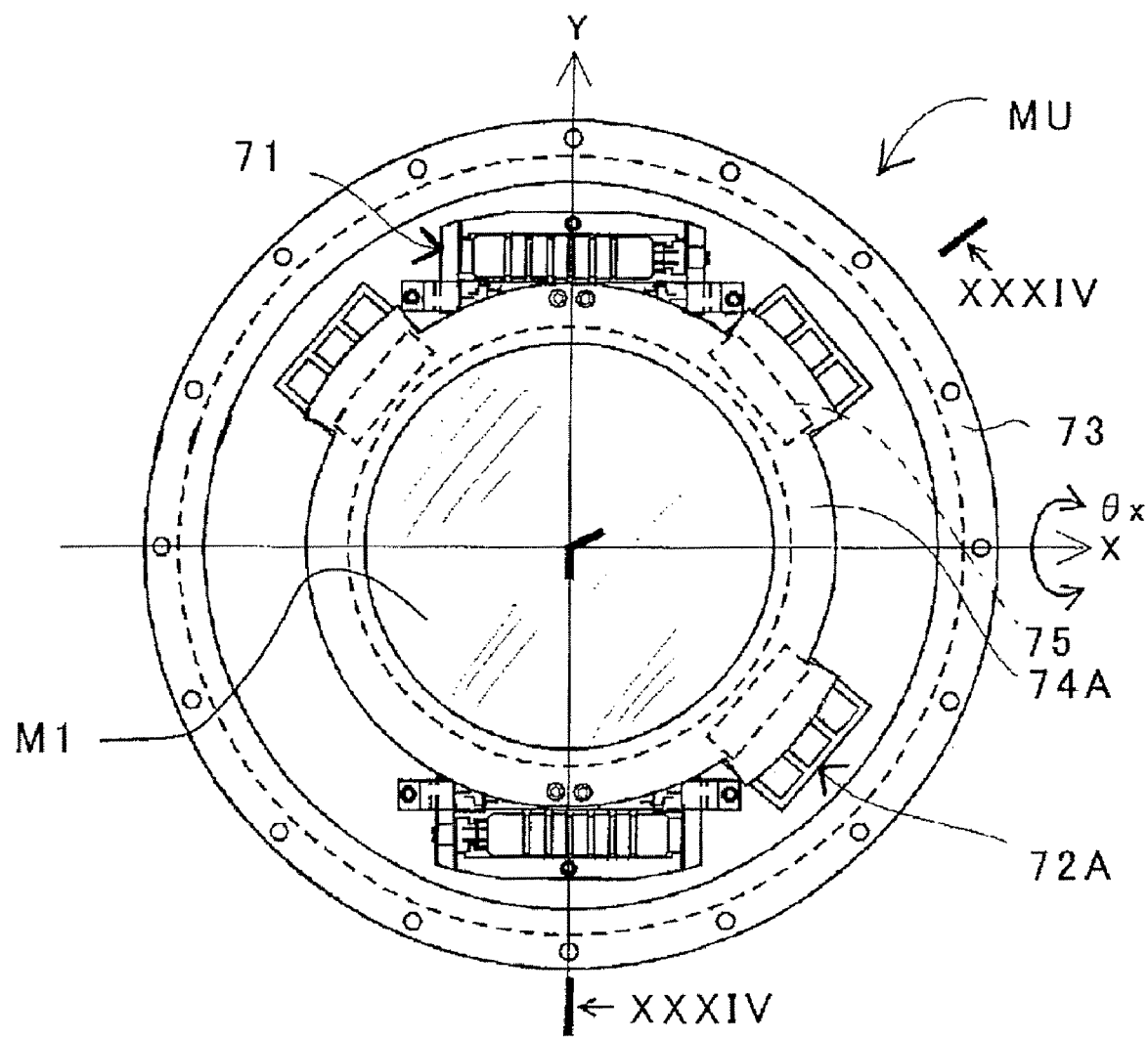
FIG. 33 is an explanatory view showing a structure of the lens unit shown in FIG. 32 to which a lens and a lens frame are attached.
Figure 34:
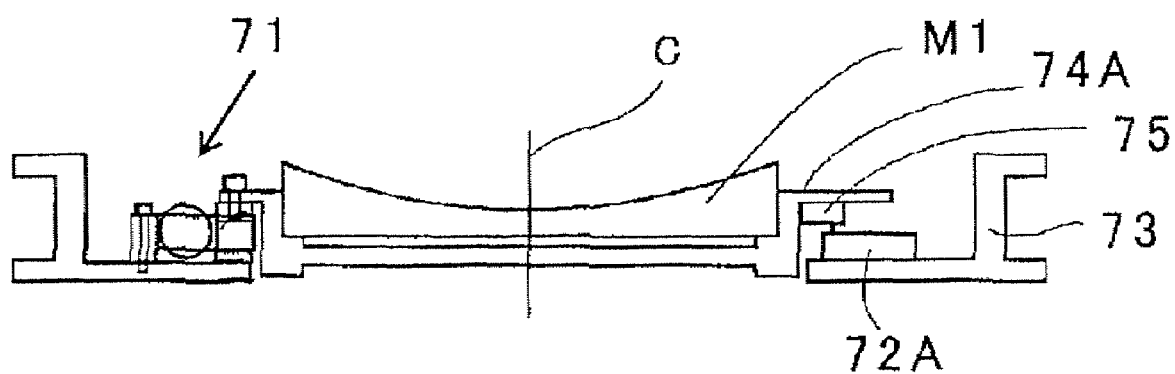
FIG. 34 is a sectional view taken along a line XXXIV-XXXIV shown in FIG. 33.

FIGS. 32 to 34 show mirror unit MU used to drive the first mirror M1 in the optical elements in the projection optical system shown in FIG. 31. FIG. 32 is a plane view that removes the first mirror M1 and the mirror frame 74A as a holding frame. FIG. 33 is a plane view that attaches the first mirror M1 and the mirror frame 74A. FIG. 34 shows the section taken along a line XXXIV-XXXIV shown in FIG. 33.

In FIG. 32, the driving mechanism 71 that drives the first mirror M1 is arranged around the X axis. When a pair of driving mechanisms 71 is driven at an equal amount, the first mirror M1 translates in the Z-axis direction. When the driving amounts of the pair of driving mechanism are made different, the first mirror M1 can be tilted around the X axis.

On the other hand, three mirror-position detectors 72A that are similar to those of the first embodiment and serve as position measuring parts are arranged around the first mirror M1 at unequal angles. However, use of the conversion matrix similar to Equation 3 or 4 in the first embodiment (although the coefficients are different) would provide a coordinate of the reference point of the first mirror M1 or post-conversion measurement values Xm, Ym, Zm, θXm, θYm, and Rm.

It is arranged on the Z-axis direction so as to meet the conditions shown in FIGS. 20 to 24 and Equations 4 to 10 in the first embodiment. It is noted that the first mirror M1 is allowed to tilt only around the X axis, and prohibited to tilt around the Y axis. Therefore, all incremental-type lateral-displacement detecting sensor 723 should be calibrated by tilting around the X axis.

For the two of three sets of mirror-position detector 72A in FIG. 32, a substantial distance between the tilt center and the measuring part of the target mirror 75 in the horizontal direction (Y-axis direction) is about half that of the first embodiment. Therefore, an operation similar to that of the first embodiment is available by setting a spacing amount HS in the Z-axis direction between the measuring part of the target mirror 75 and the tilt center twice as large as that of the first embodiment.

Figure 35:
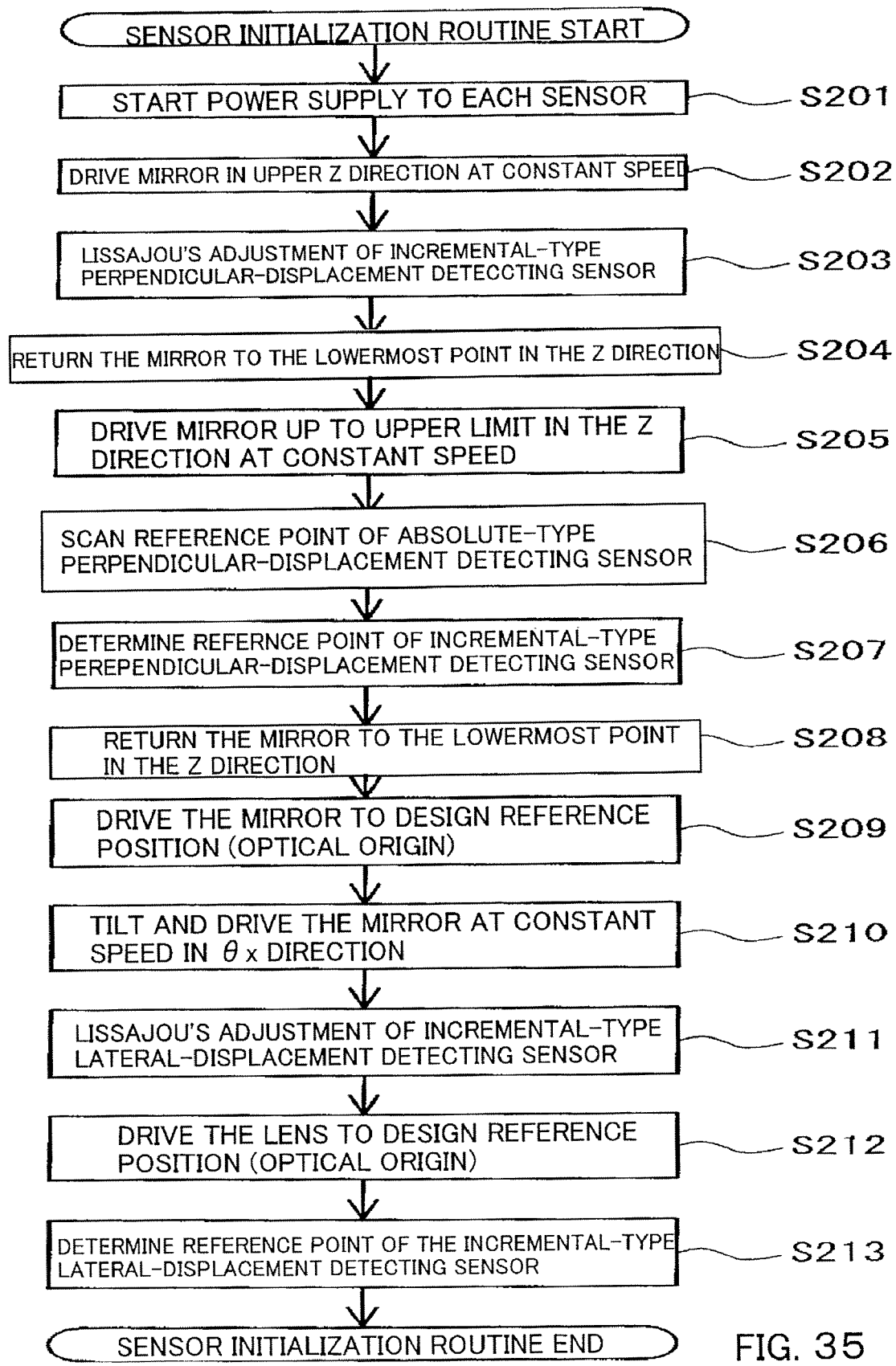
FIG. 35 is a flowchart of a sensor initialization routine relating to the optical element holding unit according to the second embodiment of the present invention.

FIG. 35 is a flowchart of a sensor initialization routine to execute the adjustment process of each sensor in the second embodiment. The first embodiment allows the optical element to tilt around the Y axis, whereas the second embodiment prohibits its tilt around the Y axis and thus is different from the first embodiment. Other structures are substantially the same. Therefore, the step S110 in the flowchart shown in FIG. 25 in the first embodiment is replaced with the step S210 in the second embodiment.

The step S110 in FIG. 25 provides the Lissajou adjustment to the detecting sensor 723 through tilt driving of the lens in the θX and θY directions, whereas the step S210 in FIG. 35 provides the Lissajou adjustment to the detecting sensor 723 through tilt driving of the mirror in the θX direction. Other steps are substantially the same, and a description thereof will be omitted.

The above second embodiment provides totally two moving degrees of freedom to the first mirror M1, such as the translation in the Z-axis direction and the tilt around the X axis. A Z-axis direction translation displacement and a tilt displacement around the X axis are detected as primary displacements. The translational displacement in the Y-axis direction and the tilt displacement around the Y axis are detected as secondary displacements. The translational displacement in the X-axis direction and the tilt displacement around the Y axis are detected as unintentional displacements due to the manufacturing error of the mechanism member. In other words, the moving degree of freedom is 2 smaller than the first embodiment but the number of displacement detection parameters is 5 similar to the first embodiment. In addition, similar to the first embodiment, a size changing amount of the mirror frame 74A in the radial direction can be obtained as additional information, and the incremental-type lateral-displacement detecting sensor 723 can be calibrated through tilt driving of the first mirror. The second embodiment also exhibits similar operations to the first embodiment.

Third Embodiment

Figure 36:
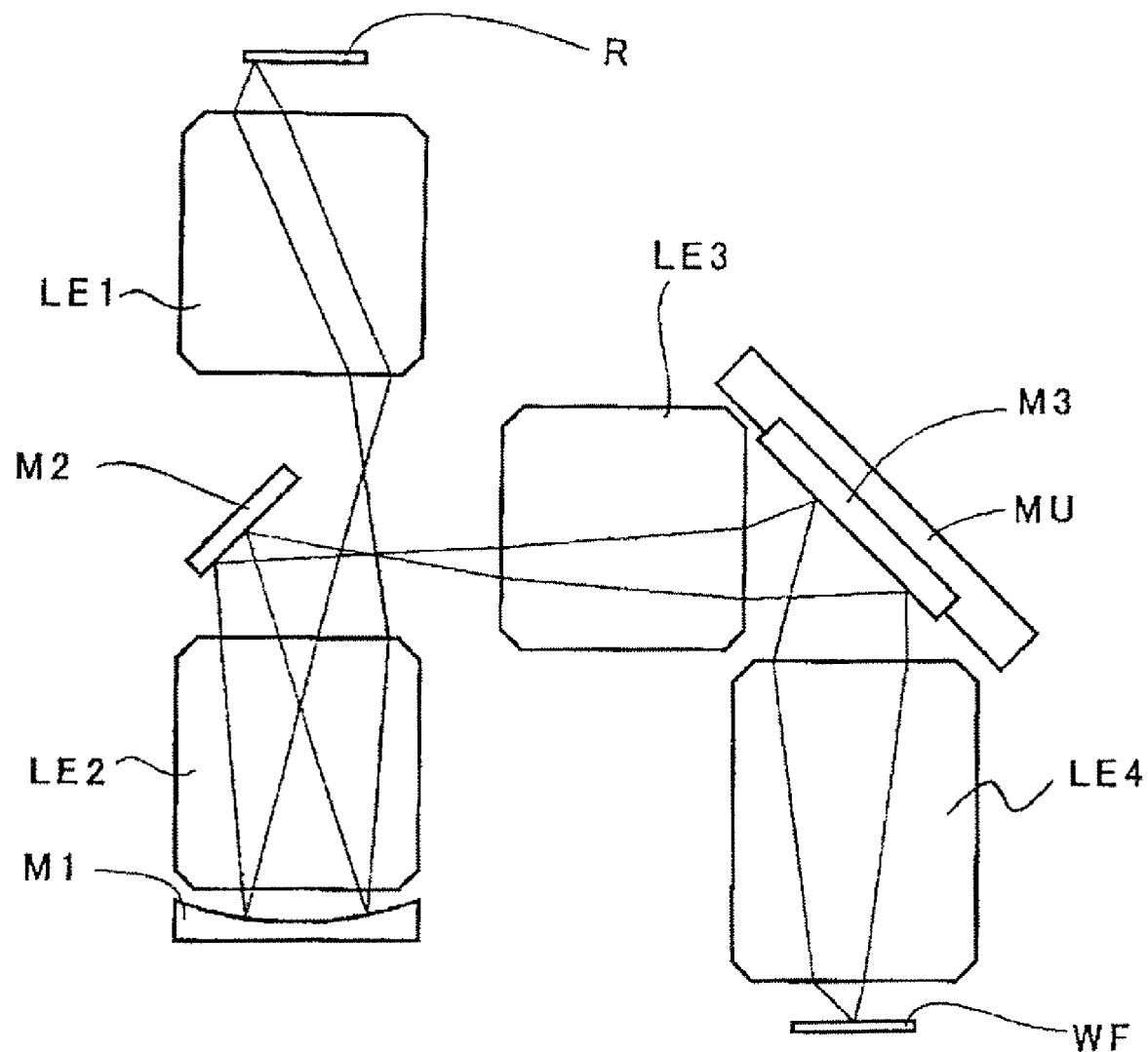
FIG. 36 is an explanatory view showing a projection optical system in an exposure apparatus having an optical element holding unit according to a third embodiment of the present invention.

FIG. 36 shows a projection optical system in the exposure apparatus that includes an optical element holding unit according to a third embodiment of the present invention. The third embodiment provides a third mirror M3 to a mirror unit MU, and is different from the second embodiment that provides the first mirror M1 to the mirror unit MU.

Figure 37:
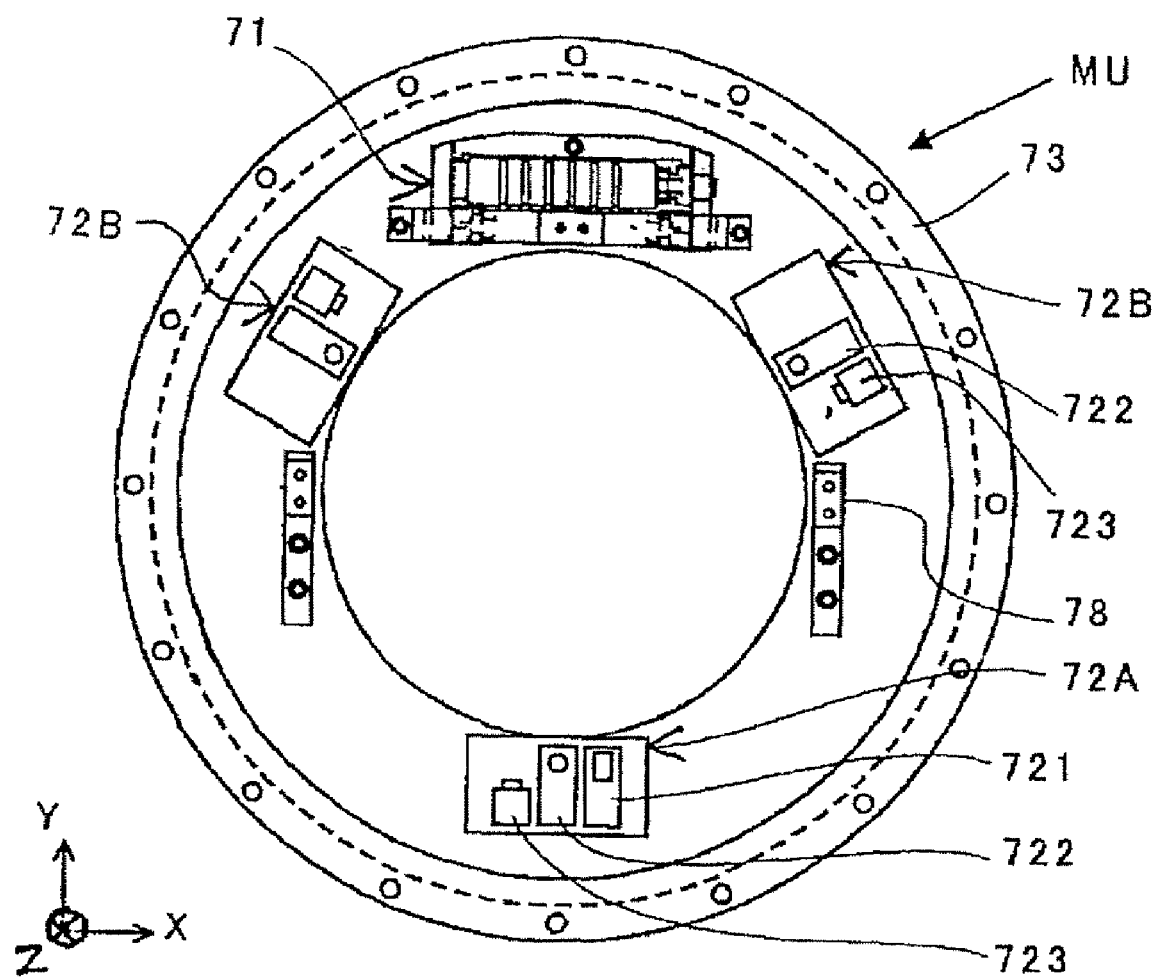
FIG. 37 is an explanatory view showing a detailed structure of the lens unit shown in FIG. 36.
Figure 38:
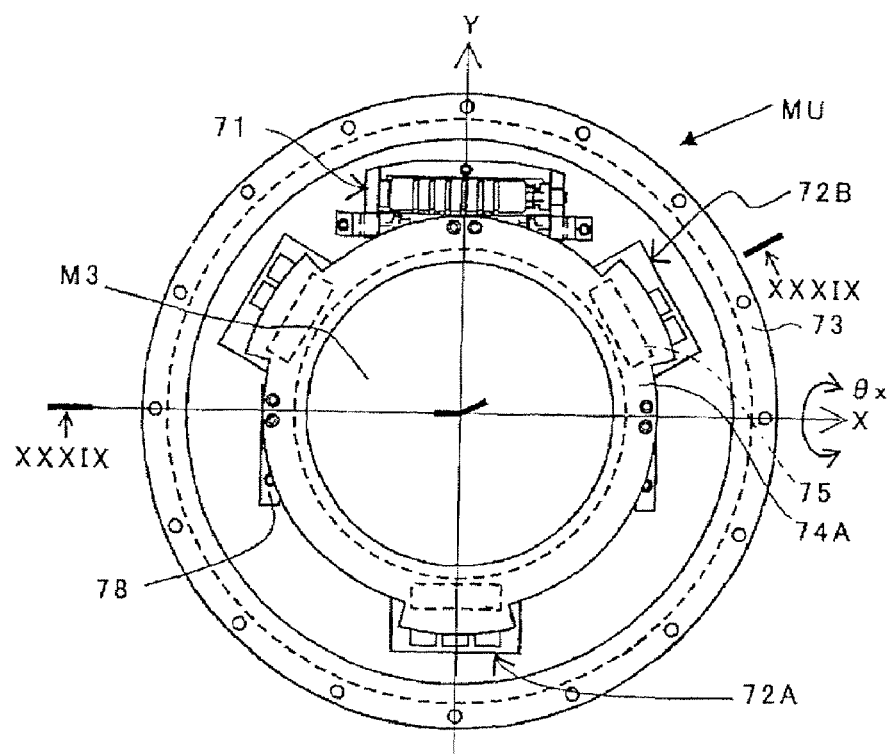
FIG. 38 is an explanatory view showing a structure of the lens unit shown in FIG. 37 to which a lens and a lens frame are attached.
Figure 39:
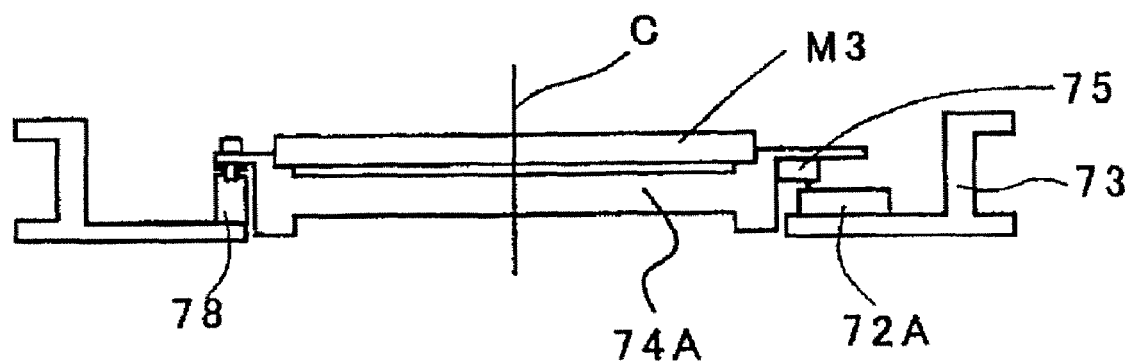
FIG. 39 is a sectional view taken along a line XXXIX-XXXIX shown in FIG. 38.

FIGS. 37 to 39 show the mirror unit MU used to drive the third mirror M3 among the optical elements in the projection optical system shown in FIG. 36. FIG. 37 is a plane view that removes the third mirror M3 and the mirror frame 74A as a holding frame. FIG. 38 is a plane view that attaches the third mirror M3 and the mirror frame 74A. FIG. 39 shows a section along a line XXXIV-XXXIX shown in FIG. 38.

The first embodiment supports and drives the optical element as an object to be driven through plural sets of driving mechanisms 71, and provides plural degrees of freedom, such as a translation in the Z-axis direction, tilting around an axis orthogonal to the Z axis. On the other hand, the third embodiment fixes and holds the third mirror M3 that is an optical element as an object to be driven, on a mirror frame 73A, and supports the mirror frame 74A through two pivot members 78.

The pivot members 78 are fixed on a plane part of the fixture barrel 73 and at position oppose to each other with respect to the Y axis, and their uppermost planes and the flange parts 74a of the mirror frame 74A are coupled through screws. A hinge part having small sectional area is provided at the center part of the pivot member 78, and the elastic deformation of the hinge part allows the uppermost planes to swing at a slight angle. Therefore, the mirror frame 74A fastened to the two pivot members 78 can move only in the θx direction.

One set of driving mechanism 71 is installed at the middle part of the two pivot members 78 or on the Y-axis plus side in FIG. 37. Therefore, when the voltage is applied to the piezoelectric actuator 713 in the driving mechanism 71 and the fastening part with the mirror frame 74 is driven in the Z-axis direction, the mirror frame 74A is tilted in the θx direction.

On the other hand, one mirror-position detector 72A is provided opposing to the driving mechanism 71 with respect to the optical axis C, and two mirror-position detectors 72B each serving as a position measurement supplementing member are spaced by 120° around the optical axis C. Similar to the first embodiment, the former mirror-position detector 72A includes the absolute-type perpendicular-displacement detecting sensor 721, the incremental-type perpendicular-displacement detecting sensor 722, and the incremental-type lateral-displacement detecting sensor 723.

The latter mirror-position detector 72B includes the incremental-type perpendicular-displacement detecting sensor 722 as a first measuring part, and does not include the absolute-type perpendicular-displacement detecting sensor 721 as a second measuring part. The mirror-position detector 72B includes the incremental-type lateral-displacement detecting sensor 723 as a third measuring part.

This is because the mirror frame 74A can be driven only in the θx direction, the degree of freedom is 1, and thus one absolute position detector is enough to cognize the absolute angle from the reference position of the tilt angle. Three incremental-type lateral-displacement detecting sensors 723 are provided as in the first embodiment so as to detect slight displacements in the X-axis and Y-axis directions caused by a slight deformation of the pivot member 78 as the mirror frame 74A tilts, although the third mirror M3 does not have the degree of freedom in the X-axis or Y-axis direction.

The tilt center of the mirror frame 74A, and three incremental-type lateral-displacement detecting sensors 723 are arranged to meet the relationship described with reference to FIGS. 20 to 24. It is noted that the third mirror M3 is allowed to tilt only around the X axis, and prohibited to tilt around the Y axis. Therefore, all incremental-types lateral-displacement detecting sensors 723 should be calibrated through tilting around the X axis.

In the two mirror-position detectors 72B in FIG. 37, a distance between the tilt center and the measuring part of the target mirror 75 in the horizontal direction (Y-axis direction) is half that of the first embodiment.

Therefore, an operation similar to that of the first embodiment is available by setting a spacing amount HS in the Z-axis direction between the measuring part of the target mirror 75 and the tilt center twice as large as that of the first embodiment.

Figure 40:
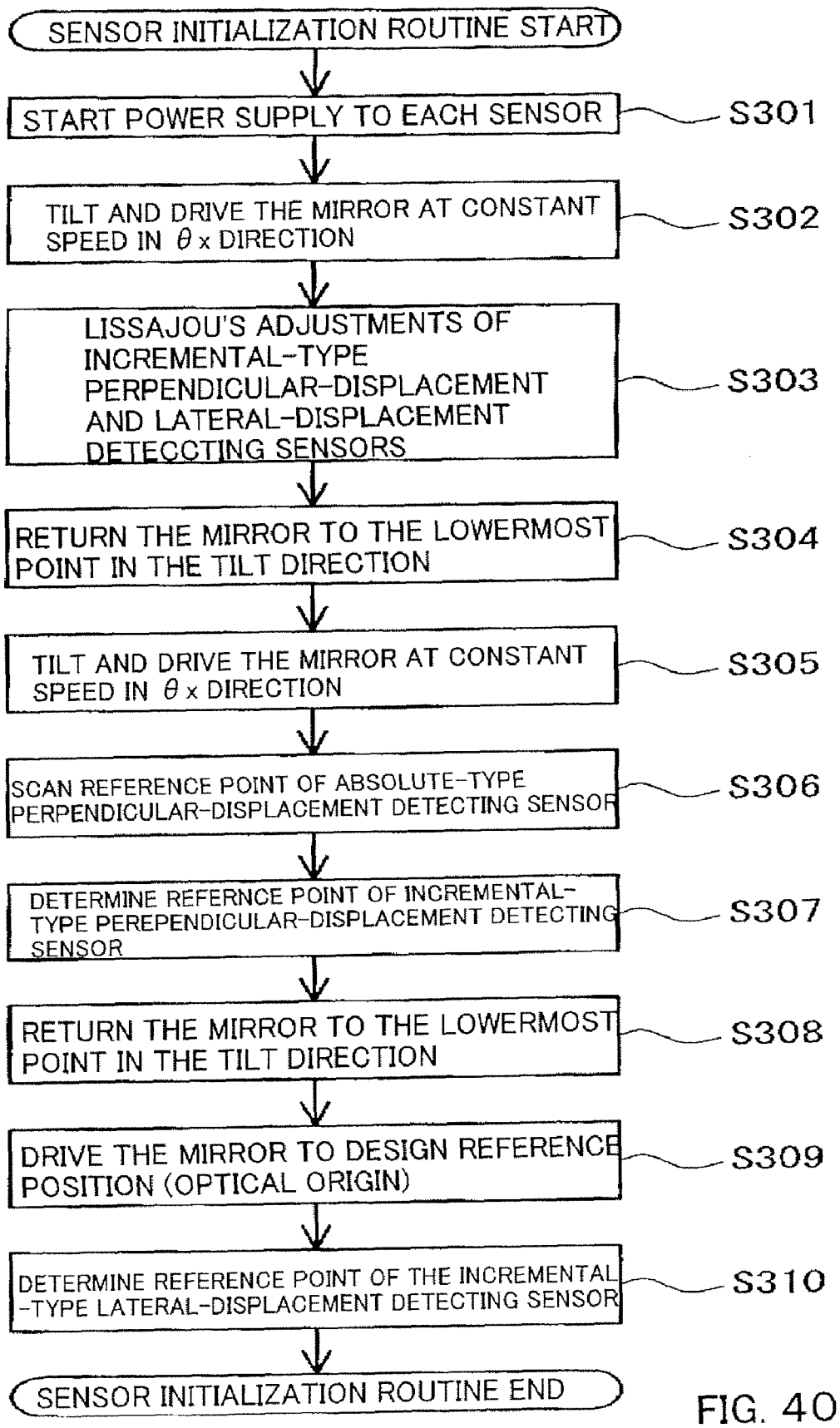
FIG. 40 is a flowchart of a sensor initialization routine relating to the optical element holding unit according to the third embodiment of the present invention.

FIG. 40 is a flowchart of a sensor initialization routine to execute the adjustment process of each sensor in the third embodiment.

Initially, the step S301 starts power supplies to the various sensors in the mirror-position detectors 72A and 72B to render a measurable state. Since none of the driving mechanisms 71 are activated in the step S301, the third mirror M3 is located at the base position or one end in the tilting range around the X axis.

Next, the step S302 drives the driving mechanism 71 at a uniform rate to rotate the third mirror M3 around the X axis by a predetermined amount. The step S303 provides the Lissajou adjustment to the three incremental-type perpendicular-displacement detecting sensors 722 and three incremental-type lateral-displacement detecting sensors 723, during the uniform-rate driving step, based on the principle described with reference to FIG. 18 while driving the driving mechanisms 71 at the uniform rate.

The step S304 returns the third mirror M3 to the lowermost or base position in the tilt direction. The step S305 drives the driving mechanism 71 at a uniform rate, and moves the third mirror M3 at a fixed rate to the upper limit position in the driving range in the upper θx direction.

The step S306 scans the reference point of the absolute-type perpendicular-displacement detecting sensor 721 in the mirror-position detector 72A, based on the method described with reference to FIG. 19, while executing the step S305. Since the third mirror M3 cannot translate in the Z-axis direction in the third embodiment, the lens position in the abscissa axis of FIG. 19 is replaced with the mirror's tilt position in interpretation. Next, the step S307 defines the reference point of the three incremental-type perpendicular-displacement detecting sensors 722.

After the step S307 is executed, the step S308 once returns the third mirror M3 to the base or the lowermost position in the tilting range. Next, the step S309 moves the third mirror M3 to the design reference position (optical origin) or a position of the origin 0 shown in FIG. 19. The step S310 determines the reference points of the three incremental-type lateral-displacement detecting sensors 723. The sensor initialization routine is thus completed after the step S310 is executed.

The above third embodiment exhibits an effect similar to that of the first embodiment. The third embodiment provides a mirror-position detector 72B in addition to the mirror-position detector 72A that includes the incremental-type perpendicular-displacement detecting sensor 722 and the absolute-type perpendicular-displacement detecting sensor 721. The mirror-position detector 72B includes the incremental-type perpendicular-displacement detecting sensor 722, and has no absolute-type perpendicular-displacement detecting sensor 721, reducing the installation number of absolute-type perpendicular-displacement detecting sensors 721.

Fourth Embodiment

Figure 41:
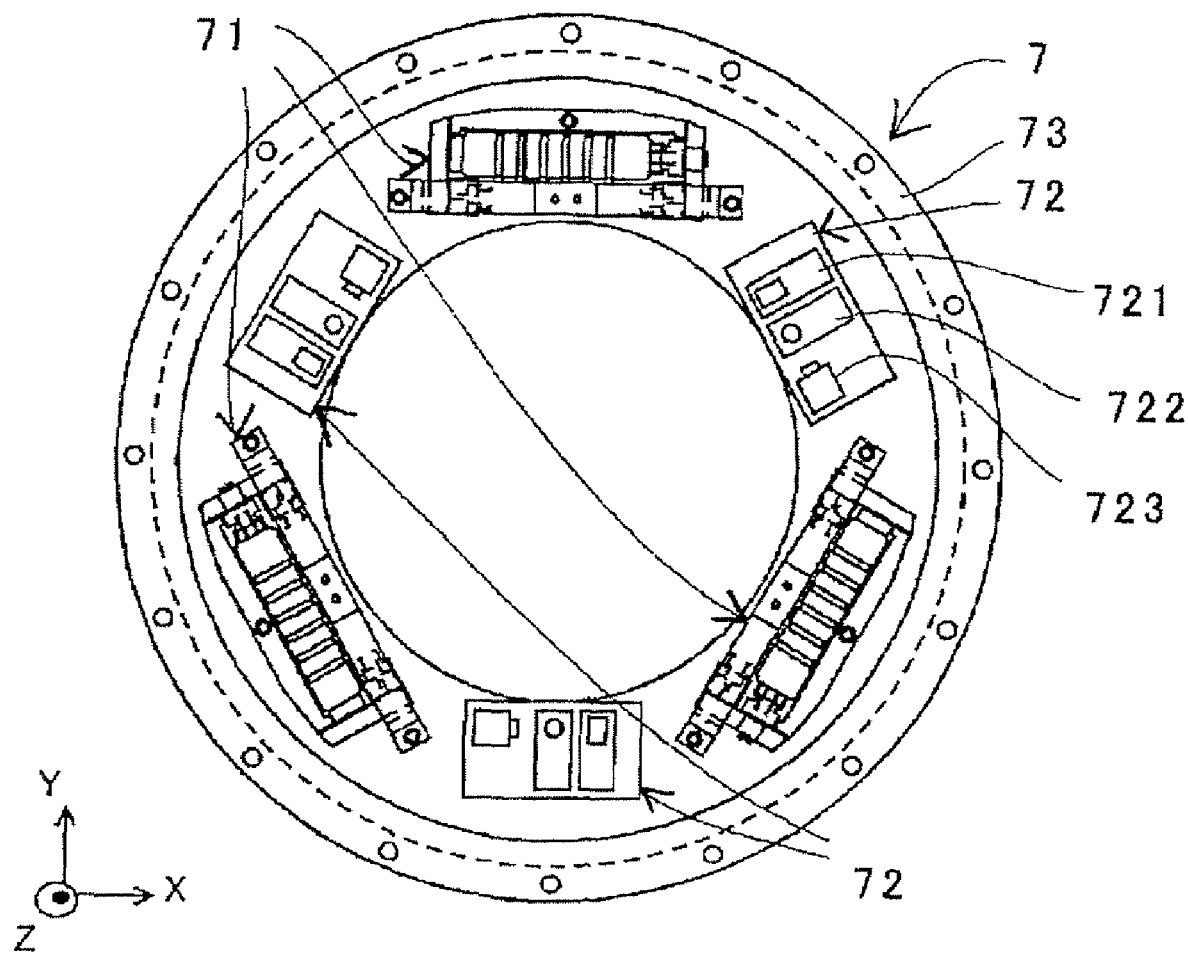
FIG. 41 is an explanatory view showing a detailed structure of a lens unit for an optical element holding unit according to a fourth embodiment of the present invention.
Figure 42:
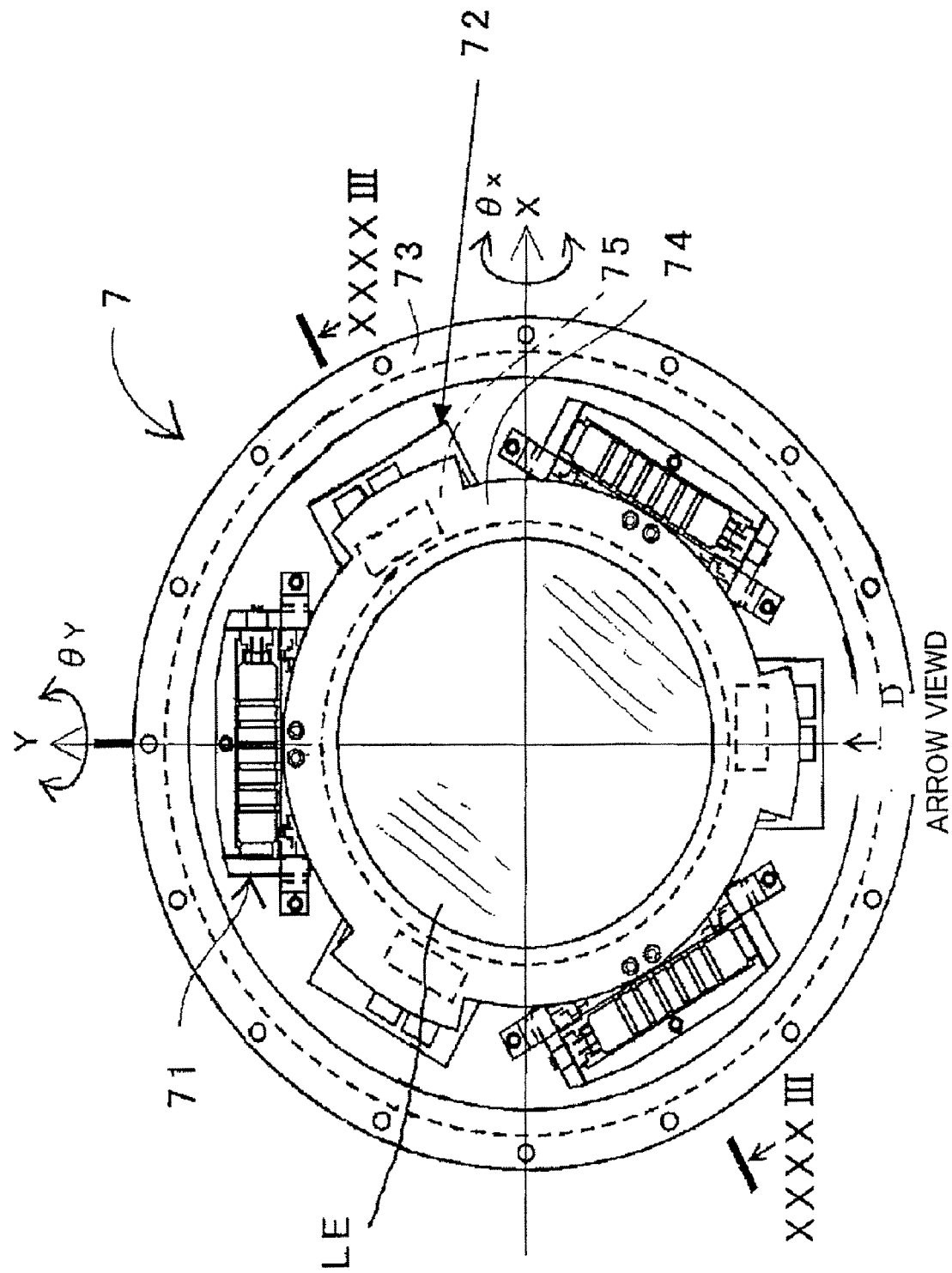
FIG. 42 is an explanatory view showing a structure of the lens unit shown in FIG. 41 to which a lens and a lens frame are attached.
Figure 43:
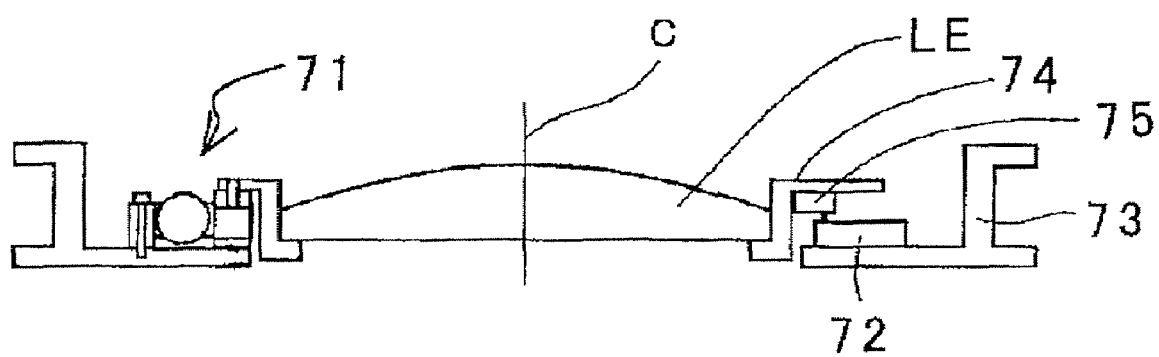
FIG. 43 is a sectional view taken along a line XXXXIII-XXXXIII shown in FIG. 42.

FIGS. 41 to 43 show the lens unit 7 as the optical element holding unit according to a fourth embodiment of the present invention. FIG. 41 is a plane view that removes the lens LE and the lens frame 74. FIG. 42 is a plane view that attaches the lens LE and the les frame 74. FIG. 43 is a sectional view taken along a line XXXXIII-XXXXIII shown in FIG. 41. The lens unit 7 in this fourth embodiment defines the same coordinate system as that of the first embodiment.

In the fourth embodiment, the sensor has detection sensitivity in the tangential direction of the optical element, and only a difference is a structure of the incremental-type lateral-displacement detecting sensor used for the position detector.

Figure 44:
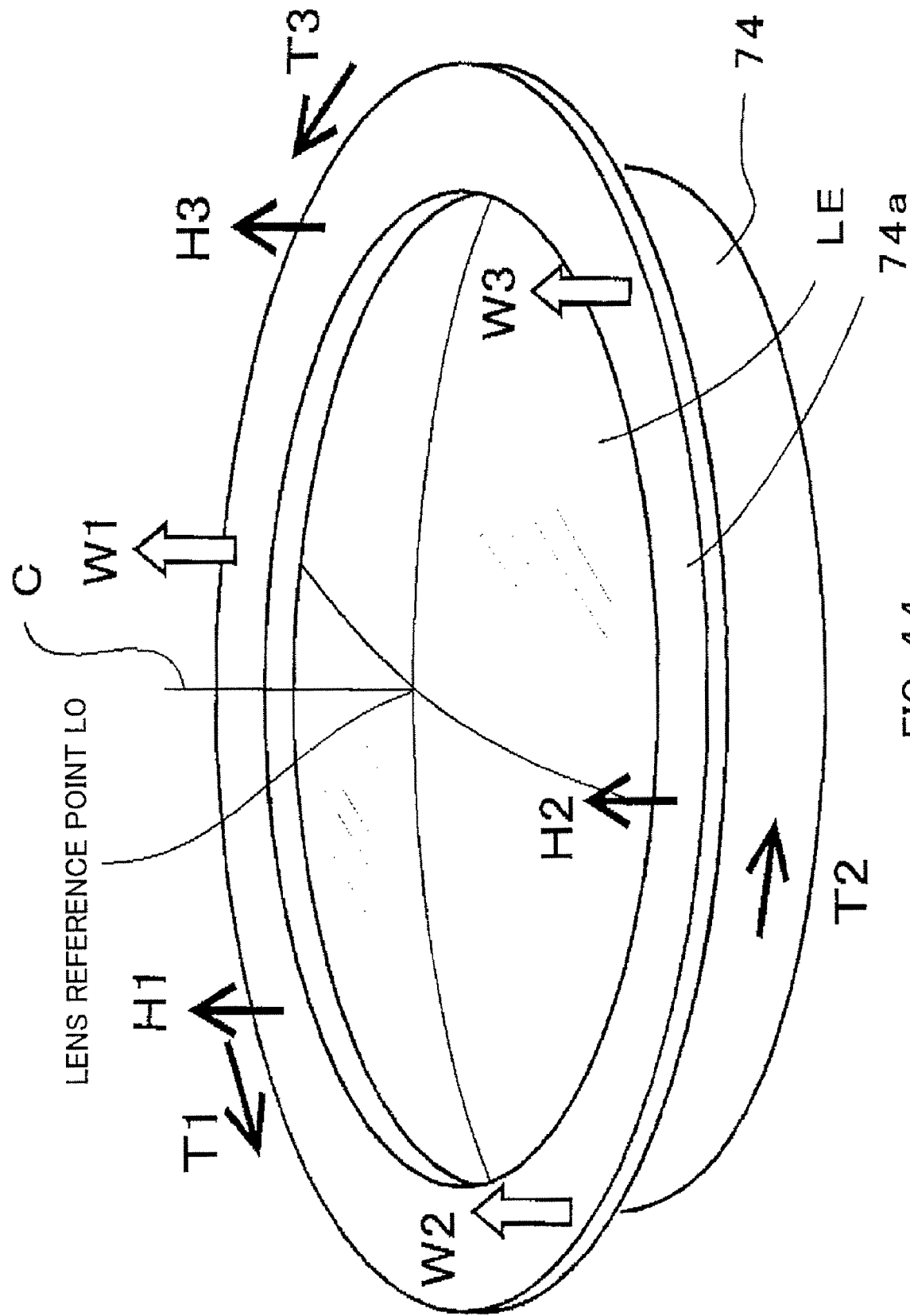
FIG. 44 is an explanatory view showing a coordinate definition and moving amount at each location on a lens frame, when the driving mechanism and the lens-position detector are arranged near the lens.
Figure 45:
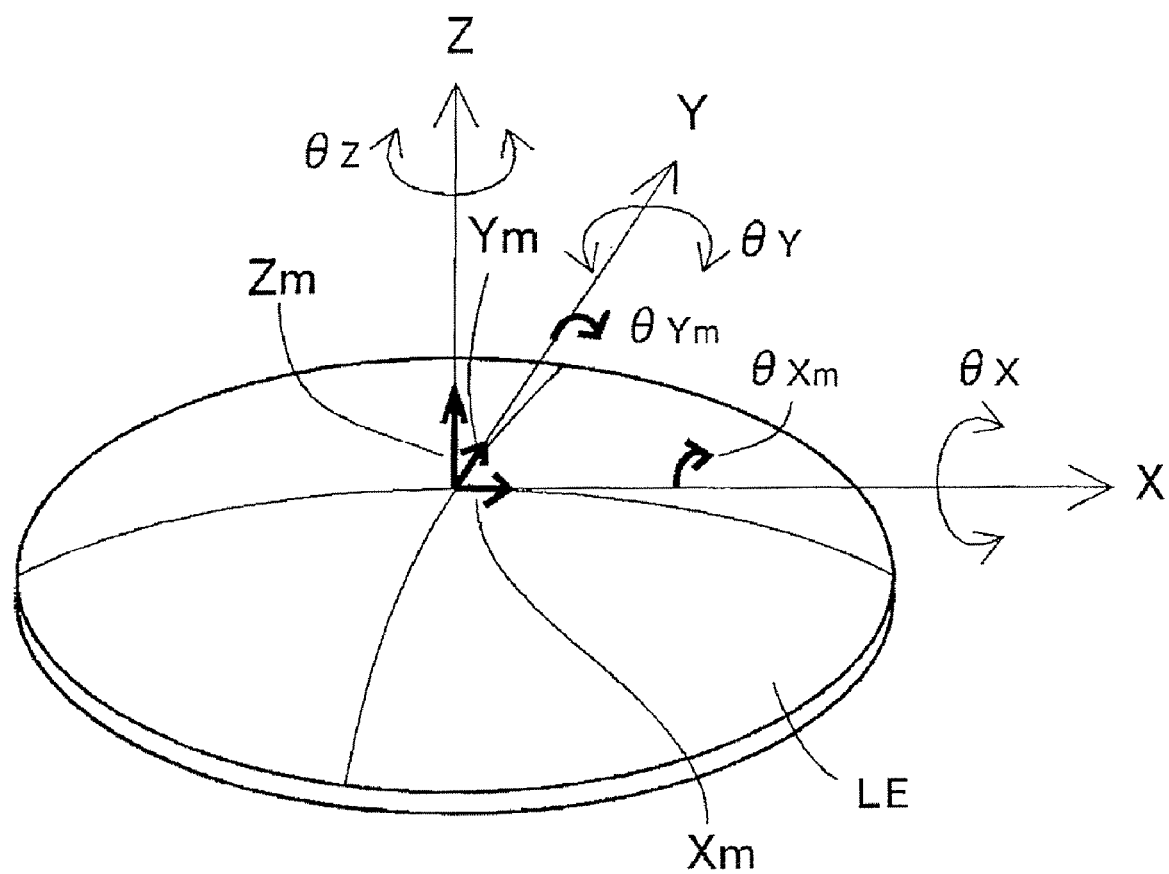
FIG. 45 is an explanatory view showing a lens coordinate definition of a lens in controlling the lens position.

FIGS. 44 and 45 are a moving amount and a coordinate definition at each location when the driving mechanism 71 and the lens-position detector 72 are located near the lens LE. The flange part 74a of the lens frame 74 that holds the lens LE is fastened to the displacement output part of the three sets of driving mechanisms 71 that are arranged at 120° intervals. If it is assumed that the driving displacements of the three sets of driving mechanisms 71 in the perpendicular direction are W1, W2, and W3, each of the three parts of the flange part 74a moves by W1, W2, or W3 along the optical-axis C direction. The lens-position detector is provided at the flange part 74a among the driving mechanisms 71.

If it is assumed that the perpendicular displacements of the three lens-position detectors 72 are H1, H2, and H3, and their horizontal displacements are T1, T2, and T3, displacements H1, H2, H3, T1, T2, and T3 are detected at the three points of the flange part 74a as illustrated.

In the first embodiment, the sensor has sensitivity to detect the lateral position of the lens LE, in a direction approximately orthogonal to the lens optical axis direction as shown by S1-S3 in FIG. 16. On the other hand, in the fourth embodiment, the sensor has sensitivity to detect the lateral position of the lens LE, in a tangential direction of the lens circumference, as shown by T1, T2, and T3 in FIG. 44.

FIG. 45 defines the lens coordinate in the position control over the lens LE, and is similar to FIG. 17 used for the first embodiment. A difference is that a rotational displacement θZ of the lens LE around the Z axis is added.

A description will now be given of the driving control over the lens LE. The control block of the lens unit 7 is similar to the control block shown in FIG. 15 used for the first embodiment. The lens driving by the piezoelectric actuator 713 uses the conversion matrix of Equations 1 and 2 in the first embodiment.

The conversion matrix that is utilized for the feedback control based on the measurement value by measuring the lens position after the lens driving uses Equation 12 instead of Equation 3 in the first embodiment:

$$\begin{pmatrix} Xm \\ Ym \\ Zm \\ \theta Xm \\ \theta Ym \\ \theta Zm \end{pmatrix} = \begin{pmatrix} G11 & G12 & G13 & G14 & G15 & G16 \\ G21 & G22 & G23 & G24 & G25 & G26 \\ G31 & G32 & G33 & G34 & G35 & G36 \\ G41 & G42 & G43 & G44 & G45 & G46 \\ G51 & G52 & G53 & G54 & G55 & G56 \\ G61 & G62 & G63 & G64 & G65 & G66 \end{pmatrix} \begin{pmatrix} H1 \\ H2 \\ H3 \\ T1 \\ T2 \\ T3 \end{pmatrix} \quad \text{EQUATION 12}$$

H1, H2, H3, T1, T2, and T3 are pre-conversion measurement values, G11 to G66 are coefficients of the conversion matrix, and Xm, Ym, Zm, θXm, θYm, and θZm are post-conversion measurement values. In this embodiment, some of the coefficients in the conversion matrix are substantially zero as expressed by Equation 13 below:

$$\begin{pmatrix} Xm \\ Ym \\ Zm \\ \theta Xm \\ \theta Ym \\ \theta Zm \end{pmatrix} = \begin{pmatrix} 0 & 0 & 0 & G14 & G15 & G16 \\ 0 & 0 & 0 & G24 & G25 & G26 \\ G31 & G32 & G33 & 0 & 0 & 0 \\ G41 & G42 & G43 & 0 & 0 & 0 \\ G51 & G52 & G53 & 0 & 0 & 0 \\ 0 & 0 & 0 & G64 & G65 & G66 \end{pmatrix} \begin{pmatrix} H1 \\ H2 \\ H3 \\ T1 \\ T2 \\ T3 \end{pmatrix} \quad \text{EQUATION 13}$$

The lens's Z-axis direction translational displacement Zm and the tilt displacements θXm and θYm are calculated from the measured absolute displacements H1, H2, and H3 in the Z-axis direction, and do not depend upon the absolute displacements T1, T2, and T3 in the tangential direction of the lens outer circumference. In addition, the displacements Xm and Ym in a direction orthogonal to the Z axis of the lens LE, and the rotational displacement θZm around the Z axis are calculated by the absolute displacements T1, T2, and T3 in the tangential direction of the lens outer circumference, and do not depend upon the absolute displacements H1, H2, and H3 in the Z-axis direction.

Zm, θXm and θYm are three pieces of information necessary for the positional control of the lens LE among the six post-conversion measurement values obtained by Equation 12 or 13, and are used for the feedback control of the lens LE. Xm and Ym are used for scan control over the wafer stage WF1, and used to reduce the overlay error of the reticle image.

On the other hand, since the lens frame 74 is configured not to rotate around the Z axis, θZm is a substantially invariable amount. Accordingly, a large value of θZm may result from an abnormality of a driving mechanism system, such as an attachment screw loose of various types of members, or a failure of a lateral shift detection sensor. In other words, θZm can be used as abnormality detection information of the lens unit 7.

Figure 46:
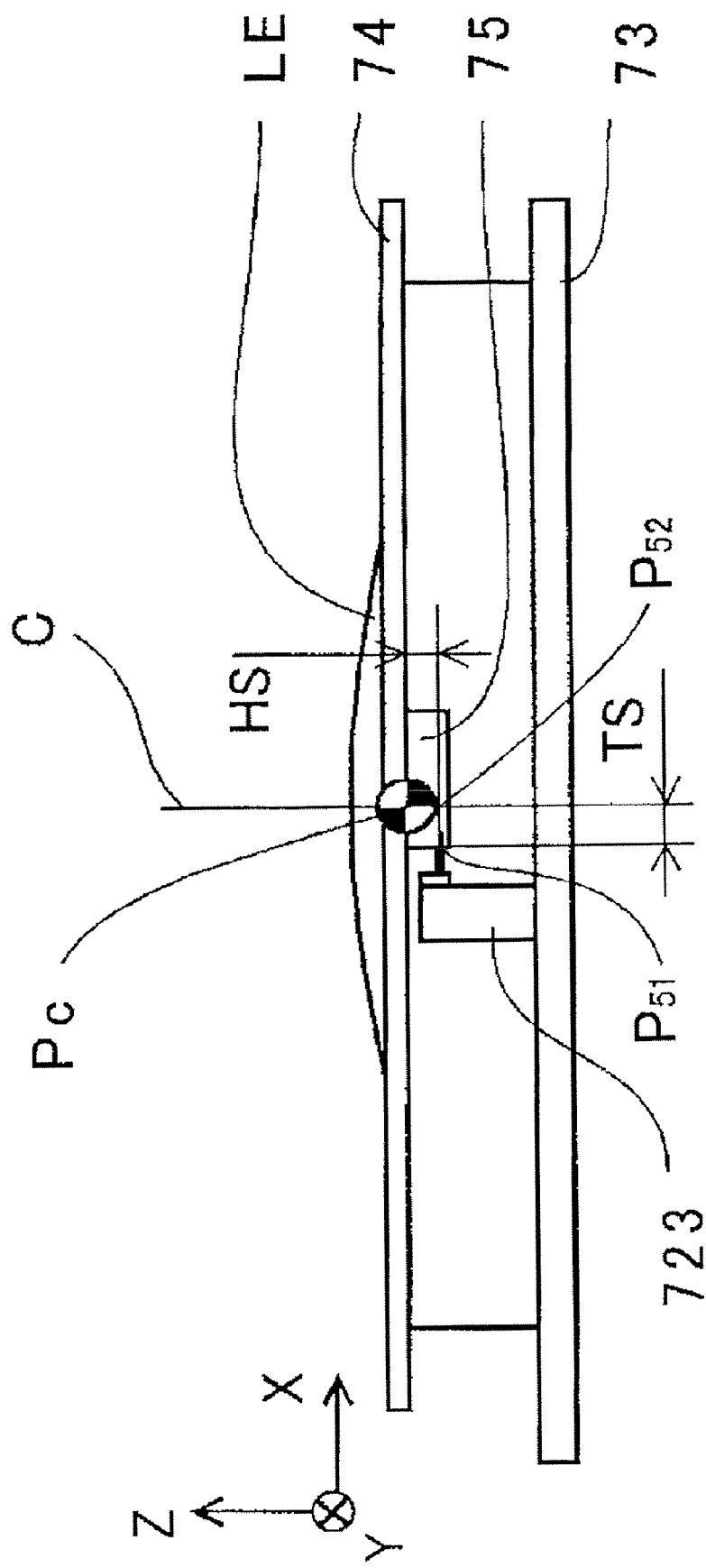
FIG. 46 is an explanatory view of an illustrative structure when the lens unit is viewed from an arrow D shown in FIG. 42.
Figure 47:
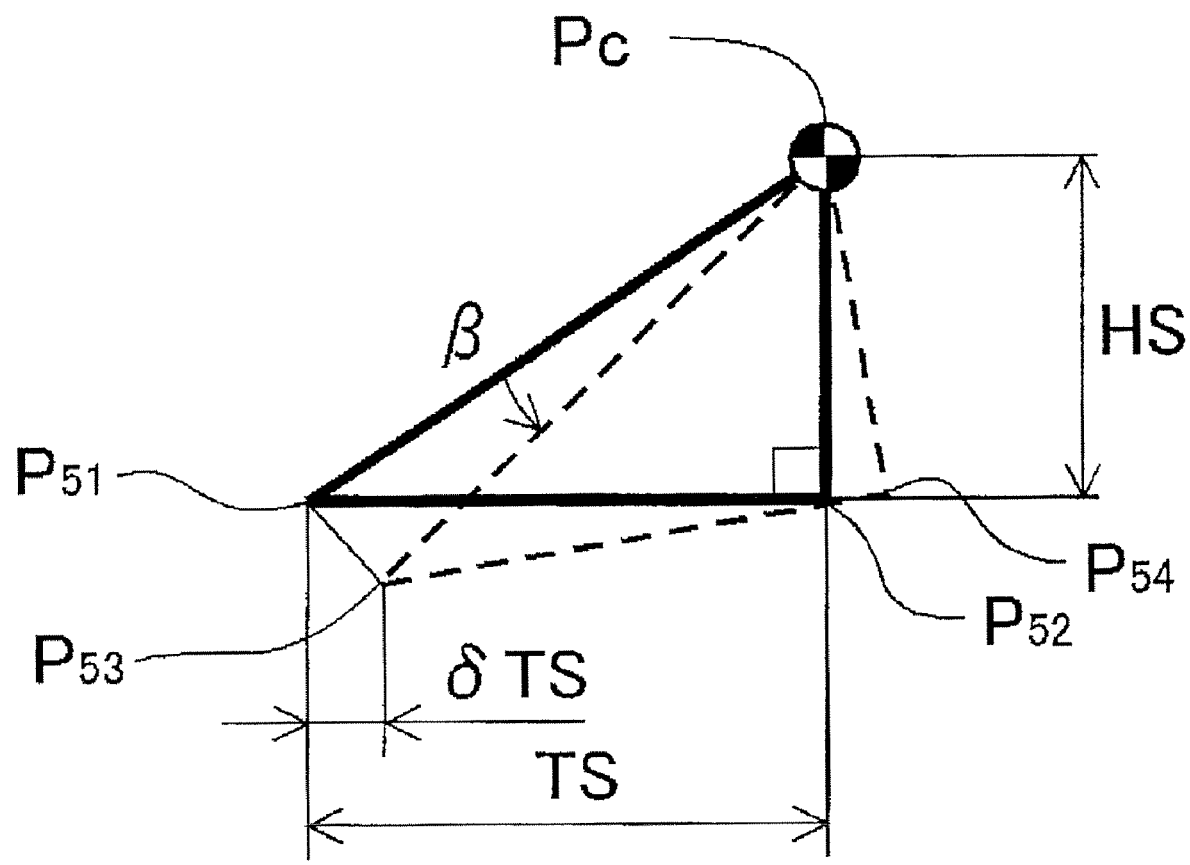
FIG. 47 is an explanatory view showing a secondary shift amount at a displacement measuring part in the incremental-type lateral-displacement detecting sensor.

FIGS. 46 and 47 are views for explaining a secondary shift amount that occurs in the displacement measuring part in the incremental-type lateral-displacement detecting sensor when the lens LE is tilted. FIG. 46 is a view viewed from the arrow D direction in FIG. 42. FIG. 47 is an illustrative view of the secondary shift amount.

In FIG. 46, the lens LE held by the lens frame 74 can tilt around the X axis and the Y axis through three sets of driving mechanisms 71 (not shown). Herein, the reference Pc is a tilt center axis as the lens LE tilt around the Y-axis. The target mirror 75 is fixed on the bottom surface of the flange part of the lens frame 74. The incremental-type lateral-displacement detecting sensor 723 is fixed onto the flat part of the fixture barrel 73.

The sensor 723 is a laser interferometer having the same structure as that used for the first embodiment, but the measurement beam is projected onto the left side surface of the target mirror 75. The projection point will be referred to as P51. The sensor's detection sensitivity is set to the tangential direction of the outer circumference of the lens LE. A spacing amount between the tilt center axis Pc and the measurement beam projection point (measurement point) P51 in the Z-axis direction will be referred to as HS, and a spacing amount in the X-axis direction will be referred to as TS. The right triangle PcP51P52 is defined with an intersection P52 between a perpendicular that passes the tilt center axis Pc and a horizontal that passes the measurement point P51.

FIG. 47 is an enlarged view of the right triangle PcP51P52, and the triangle PcP51P52 drawn by a solid line indicates a pre-tilt state of the lens. When the lens LE is tilted counter-clockwise by a tilt angle β, the triangle transfers to a triangle PcP53P54 drawn by a dotted line. A displacement amount observed by the incremental-type lateral-displacement detecting sensor 723 is δTS in the figure, and the relationship between the tilt angle β and the displacement amount δTS meets Equation 14 below that is the same as Equation 8 in the first embodiment, although the intermediate equation for calculation is omitted:

$$\delta TS = HS \times \beta \qquad \text{EQUATION 14}$$

In order to generate an interference signal of one period or longer in the incremental-type lateral-displacement detecting sensor 723 using the displacement amount δTS, Equation 15 below is needed that is the same as Equation 10 in the first embodiment.

$$\delta TS > \frac{\lambda}{2} \qquad \text{EQUATION 15}$$

Equation 16 below is met from Equations 14 and 15:

$$HS > \frac{\lambda}{2\beta} \qquad \text{EQUATION 16}$$

When a numerical value that satisfies Equation 16 is set to the Z-axis direction spacing amount HS between the measurement point P51 and the tilt center axis Pc where the lens LE has a maximum tilt angle β and the detecting sensor 723 has a light source wavelength λ, the Lissajou adjustment of the detecting sensor 723 is available by the method similar to that of the first embodiment.

The above fourth embodiment provides an effect similar to that of the first embodiment, but cannot provide expansion and shrinkage information of the target because it does not measure Rm.

While the fourth embodiment discusses an example of tilt driving around an axis parallel to the Y axis in describing the secondary lateral displacement caused by the tilt driving of the lens LE, tilt driving around an axis parallel to the X axis can apply a similar description.

Further, the preferred embodiments of the present invention was made the description of as mentioned above, but the present invention is not limited to these preferred embodiments and various variations and modifications may be made without departing from the scope of the present invention.

For example, the above first and second embodiments discuss an illustration that drives the driving mechanism 71 as a driving part in the optical axis direction or in the inclination direction relative to the optical axis, whereas only the tilt driving system can apply to the invention directed to claim 1. In addition, the above first and second embodiments discuss an illustration that drives the optical element in optical axis direction, but the optical element may be driven in the inclination direction relative to the optical axis.

In the above second and third embodiment, when an object to be driven is a mirror, the optical axis does not always accord with a normal that passes the center of the reflection surface. As apparent from FIGS. 31 and 36, for the first mirror M1, the second mirror M2, and the third mirror M3, a center axis of the incident luminous flux and a center axis of the exit luminous flux do not accord with the normal that passes the center of the mirror. Therefore, an optical axis direction depends upon a definition of the optical axis.

On the other hand, an optimal driving direction necessary for the mirror is one direction selected among the incident luminous flux direction, the exit luminous flux direction, or the normal direction that passes the reflection surface center according to the design specification of the projection optical system. When the optimal driving direction differs from the normal at the reflection surface center, the driving mechanism may be installed on the fixture barrel 73 so that the output axis direction of the driving mechanism 71 accords with the optimal driving direction, while inclined by a predetermined angle.

This application claims a foreign priority benefit based on Japanese Patent Application No. 2006-291938, filed on Oct. 27, 2006, which is hereby incorporated by reference herein in its entirety as if fully set forth herein.

What is claimed is:

1. A holding apparatus, comprising:
   a driving part configured to move the optical element; and
   a measuring part configured to measure a coordinate of the optical element,
   wherein the measuring part includes a first measurement part including an incremental sensor and configured to measure positions of three points of the optical element in a direction of an optical axis of the optical element, and a second measurement part including an absolute sensor and configured to measure positions of the three points in the direction of the optical axis, wherein the holding apparatus is configured to calibrate a measurement value of the first measurement part based on a measurement value of the second measurement parts,
   wherein number of coordinates measured by the measuring part among a degree of freedom of the optical element is greater than a driving degree of freedom of the driving part.

2. A holding apparatus according to claim 1, wherein the measuring part further includes a third measurement part including an incremental sensor and configured to measure a position of the optical element in a direction orthogonal to the optical axis with respect to each of the three points of the optical element.

3. A holding apparatus according to claim 2, wherein the driving part is configured to move each of the three points of the optical element in the direction of the optical axis, and the holding apparatus is configured to calibrate the third measurement part based on an output signal from the third measurement part obtained with respect to each of a plurality of rotational angles around an axis orthogonal to the optical axis.

* * * * *